US007126745B2

(12) United States Patent
Ohtsuki et al.

(10) Patent No.: US 7,126,745 B2
(45) Date of Patent: *Oct. 24, 2006

(54) METHOD OF IRRADIATING ULTRAVIOLET LIGHT ONTO AN OBJECT

(75) Inventors: Tomoko Ohtsuki, Macungie, PA (US); Soichi Owa, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/313,686

(22) Filed: Dec. 22, 2005

(65) Prior Publication Data

US 2006/0098269 A1    May 11, 2006

Related U.S. Application Data

(60) Division of application No. 10/367,863, filed on Feb. 19, 2003, now Pat. No. 7,023,610, which is a division of application No. 09/538,233, filed on Mar. 30, 2000, now Pat. No. 6,590,698, which is a continuation of application No. PCT/JP98/05367, filed on Nov. 30, 1998.

(30) Foreign Application Priority Data

| Mar. 11, 1998 | (JP) | .................................... 10-59453 |
| May 13, 1998 | (JP) | ................................ 10-130580 |
| Aug. 11, 1998 | (JP) | ................................ 10-227333 |
| Oct. 30, 1998 | (JP) | ................................ 10-311147 |

(51) Int. Cl.
   *G02F 1/37* (2006.01)
   *G02F 1/35* (2006.01)
   *H01S 3/109* (2006.01)

(52) U.S. Cl. .................. 359/328; 359/326; 359/341.1; 372/5; 372/22

(58) Field of Classification Search ........ 359/326–333, 359/337, 341.1–341.5; 372/4–6, 21, 22, 372/25, 39, 68
See application file for complete search history.

(56) References Cited

U.S. PATENT DOCUMENTS

| 5,050,949 A | 9/1991 | DiGiovanni et al. |
| 5,341,445 A | 8/1994 | Davenport et al. |
| 5,621,744 A | 4/1997 | Kikuchi et al. |
| 5,694,408 A | 12/1997 | Bott et al. |
| 5,745,284 A | 4/1998 | Goldberg et al. |
| 5,838,709 A | 11/1998 | Owa |

(Continued)

FOREIGN PATENT DOCUMENTS

CN    1065807 A    11/1992

(Continued)

OTHER PUBLICATIONS

European Patent Office Search Report dated Mar. 3, 2005.

(Continued)

*Primary Examiner*—John D. Lee
(74) *Attorney, Agent, or Firm*—Westerman, Hattori, Daniels & Adrian, LLP.

(57) ABSTRACT

A method of irradiating ultraviolet light onto an object. The method includes generating pulse light having a single wavelength within a range from 1.51 μm to 1.59 μm from a laser generating portion, amplifying the pulse light plural times with an optical amplifier that includes a plurality of fiber optical amplifiers, wavelength-converting the amplified pulse light into ultraviolet light with a wavelength converting portion that includes a plurality of non-linear optical crystals, and irradiating the ultraviolet light onto the object through an optical system.

44 Claims, 18 Drawing Sheets

U.S. PATENT DOCUMENTS

| | | | |
|---|---|---|---|
| 5,909,306 A | 6/1999 | Goldberg et al. | |
| 6,055,092 A | 4/2000 | Sugaya et al. | |
| 6,128,030 A | 10/2000 | Kikuchi et al. | |
| 6,590,698 B1 | 7/2003 | Ohtsuki et al. | |
| 6,781,672 B1 | 8/2004 | Motegi | |
| 2003/0231663 A1* | 12/2003 | Ohtsuki et al. | 372/22 |

FOREIGN PATENT DOCUMENTS

| | | |
|---|---|---|
| JP | 2-107034 | 4/1990 |
| JP | 3-214123 | 9/1991 |
| JP | 3-102898 | 10/1991 |
| JP | 4-111484 | 4/1992 |
| JP | 4-196280 A | 7/1992 |
| JP | 4-347945 | 12/1992 |
| JP | 05-003455 A | 1/1993 |
| JP | 5-102565 | 4/1993 |
| JP | 05-102565 | 4/1993 |
| JP | 5-102565 A | 4/1993 |
| JP | 05-275793 | 10/1993 |
| JP | 5-275793 A | 10/1993 |
| JP | 6-077572 A | 3/1994 |
| JP | 6-110102 | 4/1994 |
| JP | 7-161625 | 6/1995 |
| JP | 9-162104 A | 6/1997 |
| JP | 9-256060 A | 10/1997 |

OTHER PUBLICATIONS

J. Koplow, et al., "UV generation by Frequency Quadrupling of Yb-Doped Fiber Amplifier", 1998 IEEE, vol. 10, No. 1, Jan. 1998, pp. 75-77, IEEE Photonics Technology Letters.

Republic of China Office Action dated Mar. 11, 2005.

Corresponding Chinese Application Claims 1-73.

F. Masetti, et al., "Fiber Delay Lines Optical Buffer for ATM Photonic Switching Applications", 1993 IEEE, pp. 935-942.

Korean Office Action dated Jun. 23, 2006.

* cited by examiner

Fig.9
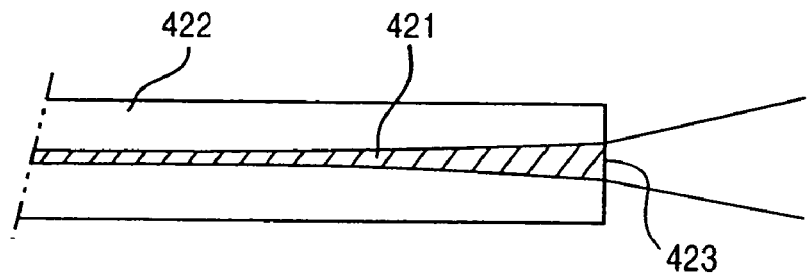
Fig.10
(a)
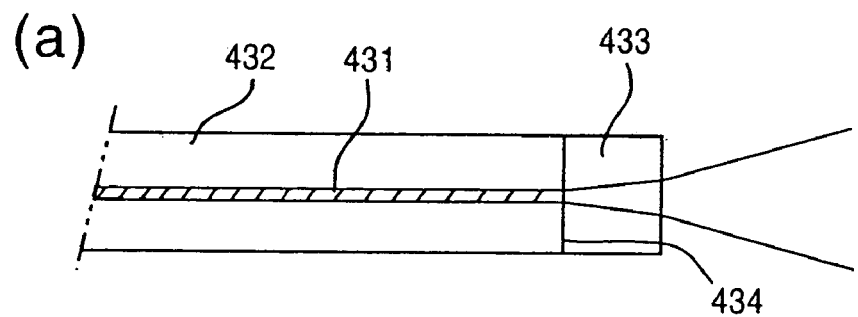
(b)
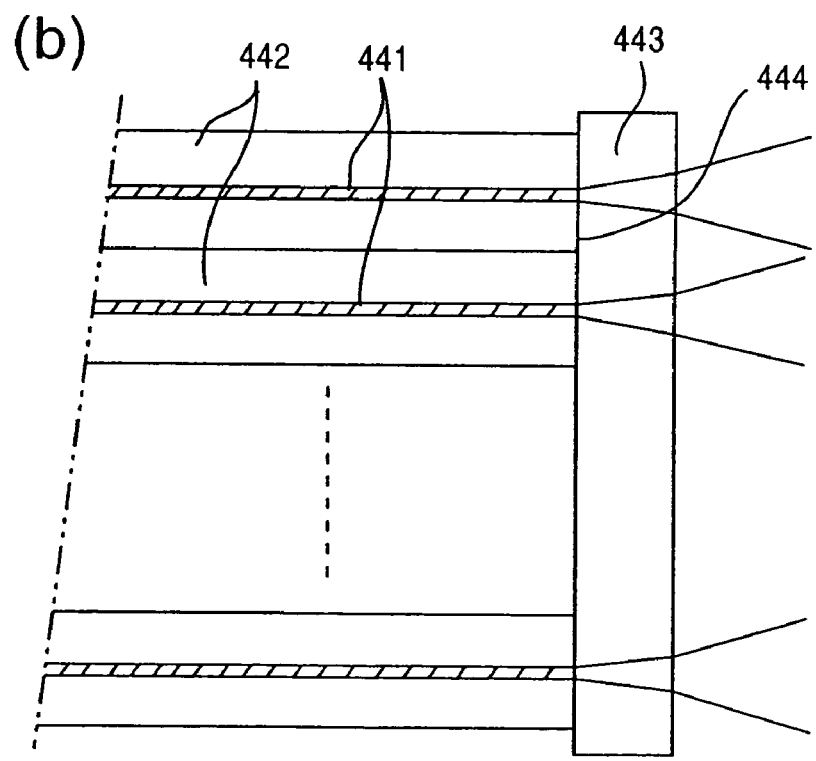

Fig.11
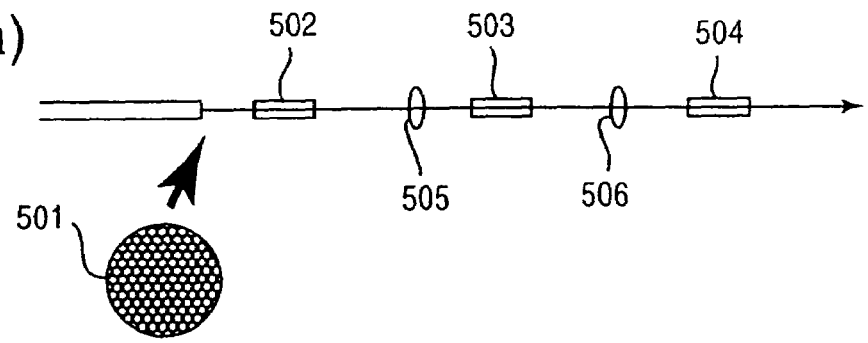
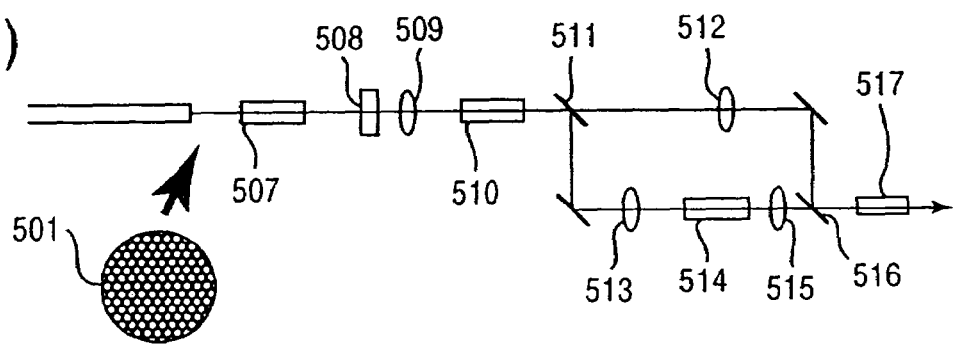
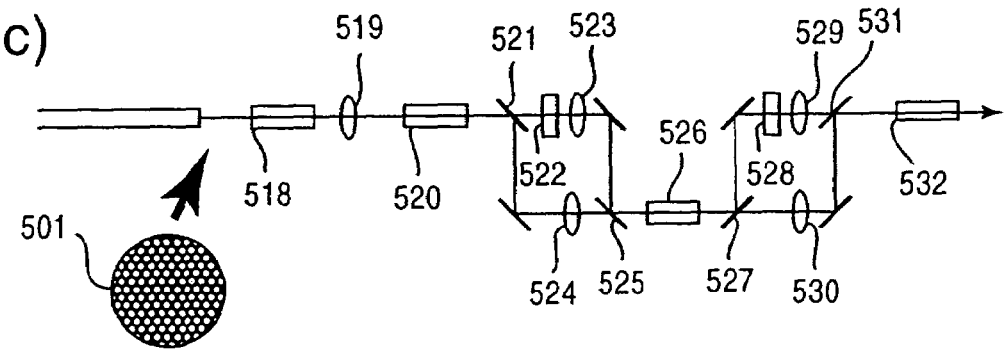
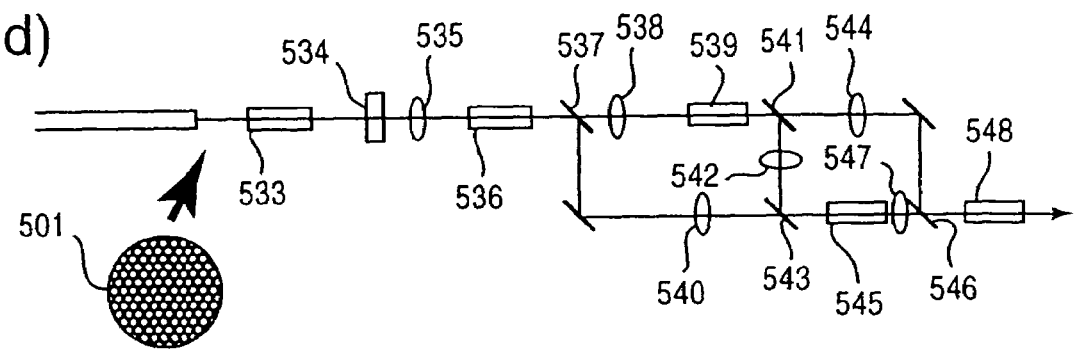

| TYPE OF FREQUENCY CONVERSION | CRYSTAL | CONVERSION EFFICIENCY |
|---|---|---|
| $\omega + \omega \rightarrow 2\omega$ | LBO | 0.748 |
| $2\omega + 2\omega \rightarrow 4\omega$ | LBO | 0.476 |
| $4\omega + 4\omega \rightarrow 8\omega$ | SBBO | 0.321 |

OUTPUT WAVELENGTH 193 nm, PEAK POWER: 2.29kW, AVERAGE POWER @100kHz, 1ns:229mW (b)

| TYPE OF FREQUENCY CONVERSION | CRYSTAL | CONVERSION EFFICIENCY |
|---|---|---|
| $\omega + \omega \rightarrow 2\omega$ | LBO | 0.611 |
| $\omega + 2\omega \rightarrow 3\omega$ | LBO | 0.909 |
| $3\omega + 3\omega \rightarrow 6\omega$ | BBO | 0.307 |
| $2\omega + 6\omega \rightarrow 8\omega$ | BBO | 0.177 |

OUTPUT WAVELENGTH 193 nm, PEAK POWER: 383W, AVERAGE POWER @100kHz, 1ns:38.3mW (c)

| TYPE OF FREQUENCY CONVERSION | CRYSTAL | CONVERSION EFFICIENCY |
|---|---|---|
| $\omega + \omega \rightarrow 2\omega$ | LBO | 0.748 |
| $2\omega + 2\omega \rightarrow 4\omega$ | LBO | 0.476 |
| $2\omega + 4\omega \rightarrow 6\omega$ | BBO | 0.308 |
| $2\omega + 6\omega \rightarrow 8\omega$ | BBO | 0.184 |

OUTPUT WAVELENGTH 193 nm, PEAK POWER: 403W, AVERAGE POWER @100kHz, 1ns:40.3mW (d)

| TYPE OF FREQUENCY CONVERSION | CRYSTAL | CONVERSION EFFICIENCY |
|---|---|---|
| $\omega + \omega \rightarrow 2\omega$ | LBO | 0.633 |
| $\omega + 2\omega \rightarrow 3\omega$ | LBO | 0.826 |
| $2\omega + 2\omega \rightarrow 4\omega$ | LBO | 0.322 |
| $3\omega + 4\omega \rightarrow 7\omega$ | BBO | 0.302 |
| $\omega + 7\omega \rightarrow 8\omega$ | LBO | 0.251 |

OUTPUT WAVELENGTH 193 nm, PEAK POWER: 459W, AVERAGE POWER @100kHz, 1ns:45.9mW

Fig. 18
(a)
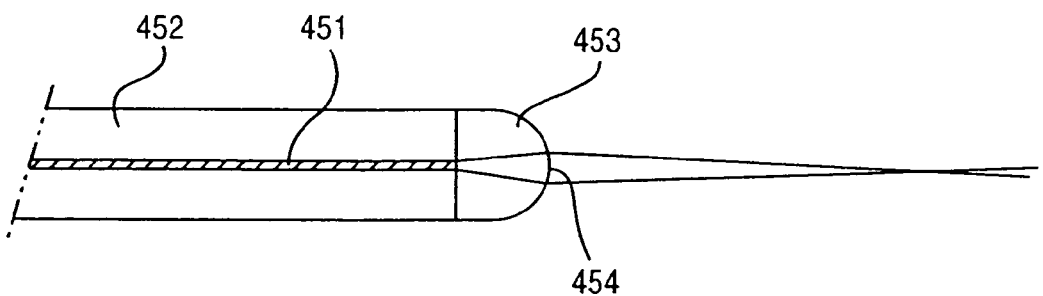
(b)
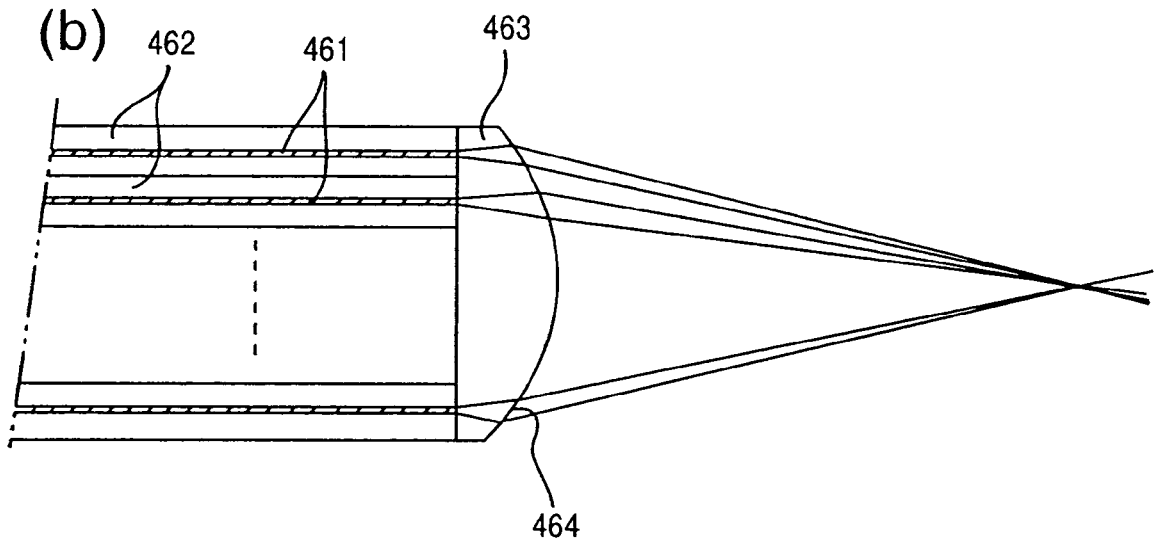
(c)
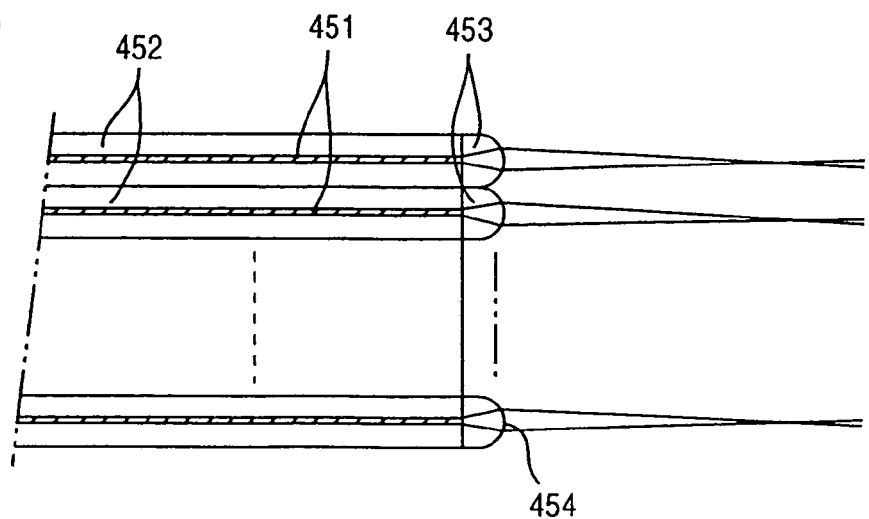

METHOD OF IRRADIATING ULTRAVIOLET LIGHT ONTO AN OBJECT

CROSS-REFERENCE TO RELATED APPLICATIONS

This application is a Divisional of application Ser. No. 10/367,863, filed Feb. 19, 2003, now U.S. Pat. No. 7,023,610 which is a Divisional of application Ser. No. 09/538,233, now U.S. Pat. No. 6,590,698, filed Mar. 30, 2000, which is a U.S. Continuation application filed under 35 U.S.C. 111(a) claiming benefit under 35 U.S.C. §120 of PCT International Application No. PCT/JP98/05367 filed on Nov. 30, 1998, the entire disclosures of which are hereby incorporated by reference.

BACKGROUND OF THE INVENTION

1. Field of the Invention

The present invention relates to a laser apparatus, and more particularly it relates to an ultraviolet laser apparatus for generating ultraviolet light capable of suppressing generation of speckle with low coherence, such as an exposure light source used in a photo-lithography process for manufacturing micro devices such as semi-conductor elements, liquid crystal display elements, CCD and thin film magnetic heads, as well as relates to an exposure apparatus using such an ultraviolet laser apparatus.

2. Description of the Related Art

As information technology equipment has progressed, regarding integrated circuits, improvement in function, memory capacity and compactness have been requested, and, to achieve this, it is required that the degree of the integration of the integrated circuit be increased. In order to increase the degree of the integration, individual circuit patterns should be made smaller. However, a minimum pattern dimension of the circuit is generally determined by performance of an exposure apparatus used in a circuit manufacturing process.

In an exposure apparatus utilizing photo-lithography, a circuit pattern exactly described on a photo-mask is optically projected and transferred, with reduced scale, onto a semi-conductor wafer on which photoresist is coated. A minimum pattern size (resolving power) R on the wafer in the exposure is represented by the following equation (1) and the depth of focus DF is represented by the following equation (2) when it is assumed that a wavelength of a light source used for projection in the exposure apparatus is $\lambda$ and a numerical aperture of a projection optical system is NA:

$$R = K \cdot \lambda / NA \quad (1)$$

$$DF = \lambda / \{2 \cdot (NA)^2\} \quad (2)$$

where, K is a constant.

As apparent from the above equation (1), in order to decrease the minimum pattern size R, the constant K may be decreased or the numerical aperture NA may be increased or the wavelength $\lambda$ may be decreased.

Here, the constant K is a constant determined by the projection optical system or process and normally has a value of about 0.5 to 0.8. A method for decreasing the constant K is referred to as a super-resolution technique in a broader sense.

Regarding such a technique, an improvement in the projection optical system, modified illumination and a phase shift mask method have been proposed and investigated. However, they had disadvantage that applicable patterns were limited. On the other hand, from the above equation (1), the greater the numerical aperture NA the smaller the minimum pattern size R. However, this also means that the depth of focus is decreased, as apparent from the above equation (2). Thus, there is a limit to increase the numerical aperture NA, and, in consideration of the balance between NA and DF, the value of the numerical aperture NA is normally selected to about 0.5 to 0.6.

Accordingly, a most simple and effective method for decreasing the minimum pattern size is a method for decreasing the wavelength $\lambda$ used in the exposure. There are several conditions in achieving reduction of the wavelength and in manufacturing the light source of the exposure apparatus. Now, these conditions will be described.

In a first condition, light output of several watts is required for shortening a time period for exposing and transferring the integrated circuit pattern.

In a second condition, in case of ultraviolet light having a wavelength smaller than 300 nm, material used for forming a lens of the exposure apparatus is limited, and it is difficult to correct chromatic aberration. Thus, monochromaticity of the light source is required and spectral width of must be smaller than 1 pm.

In a third condition, as spectral width is made narrower, temporal coherence is increased. Therefore, if light having a narrow line width is emitted as it is, an undesired interference pattern called as speckle will be generated. Accordingly, in order to suppress occurrence of the speckle, the spatial coherence in the light source must be reduced.

In order to satisfy these conditions and to realize high resolving power, many attempts for decreasing the wavelength of the exposure light source have been made. Heretofore, reduction of the wavelength has been investigated mainly in the following two ways. One way is a development to apply an excimer laser having a short oscillation wavelength to the exposure apparatus, and the other way is a development of a short wavelength exposure light source utilizing harmonic wave generation from an infrared or visual laser.

Among them, as the short wavelength light source realized by using the former way, a KrF excimer laser (wavelength of 248 nm) is known, and, nowadays, an exposure apparatus using an ArF excimer laser (wavelength of 193 nm) as a shorter wavelength light source is being developed. However, these excimer lasers hate several disadvantages that they are bulky, that optical parts are apt to be damaged because of great energy per one pulse and that maintenance of the laser is troublesome and expensive because of usage of harmful fluorogas.

On the other hand, as the latter way, there is a method for converting long wavelength light (infrared light or visual light) into shorter wavelength ultraviolet light by utilizing secondary non-linear optical effect of non-linear optical crystal. For example, in the document "Longitudinally diode pumped continuous wave 3.5 W green laser" (L. X, Liu, M. Oka, W. Wiechmann and S. Kubota, Optic Letters. vol. 19 (1994), p 189), a laser light source for wavelength-converting light from a solid-state laser of semiconductor excitation type is disclosed. In this conventional example, a laser beam having a wavelength of 1064 nm and emitted from an Nd:YAG laser is wavelength-converted by using the non-linear optical crystal to thereby generate 4th harmonic light having a wavelength of 266 nm. Further, the "solid-state laser" is a general term of lasers in which a laser medium is solid. Accordingly, although a semiconductor laser is included in the solid-state laser in a broad sense, normally, the solid-state laser means lasers excited by light such as a ND:YAG laser and a ruby laser, and, thus, in this specification, such a definition is used.

Further, as an example that the solid-state laser is used as the light source of the exposure apparatus, an array laser in which a plurality of laser elements each comprising a laser generating portion for generating a laser beam and a wavelength converting portion for wavelength-converting the light from the laser generating portion into ultraviolet light are bundled in a matrix patterns has been proposed. For example, Japanese Patent Laid-open No. 8-334803 (1996) discloses an example of an array laser in which a plurality of laser elements for wavelength-converting light from a laser generating portion having a semiconductor laser into ultraviolet light by using non-linear optical crystal provided in a wavelength converting portion are bundled in a matrix pattern (for example, 10×10) to thereby form a single ultraviolet light source.

According to the array laser having the above-mentioned arrangement, by bundling the plurality of independent laser elements together, light output of the entire apparatus can be increased while keeping light output of the individual laser element at a lower level. Thus, the load to the non-linear optical element can be reduced. However, since the laser elements are independent, when they are applied to the exposure apparatus, as a whole, oscillation spectra of the laser elements must be coincided For example, even when the line width of the oscillation spectrum of each laser elements is smaller than 1 pm, the difference in relative wavelength in the entire assembly including the plural laser elements must not be 3 pm, and the entire width must be smaller than 1 pm.

To achieve this, for example, lengths of resonators of the laser elements must be adjusted or wavelength selecting elements must be inserted into the resonators so that the laser elements each can independently perform single longitudinal mode oscillation having the same wavelength. However, these methods have disadvantages that the adjustment is delicate and that, as the number of laser elements is increased, the arrangement for causing all of the laser elements to perform oscillation having the same wavelength becomes more complicated.

On the other hand, as a method for actively equalizing the wavelengths from the plurality of laser elements, an injection seed method is well known (for example, refer to a document "Solid-state Laser Engineering", 3rd Edition, Springer Series in Optical Science, Vol. 1, Springer-Verlag, ISBN 0-387-53756-2, p 246–249 presented by Walter Koechner). This method is a technique in which light from a single laser light source having narrow oscillation spectrum line width is branched to a plurality of laser elements and oscillation wavelengths of the laser elements coincide or are tuned by using the laser beams as seed light, thereby making the line widths of the spectra narrower. However, this method has a disadvantage that the arrangement becomes complicated, since an optical path for branching the seed light into the laser elements and a tuning and controlling portion for the oscillation wavelengths are required.

Further, although such an array laser can make the entire apparatus smaller considerably in comparison with the conventional excimer lasers, it is still difficult to obtain a packaging capable of suppressing output beam diameter of the entire array to less than several centimeters. Further, in the array laser having such an arrangement, there arise problems that the laser is expensive because the wavelength converting portions are required for the respective arrays and that, if mis-alignment occurs between the laser elements constituting the array or if the optical element(s) are damaged, in order to adjust the laser elements, the entire array must once be disassembled to remove the laser elements and the removed array must be assembled again after adjustment thereof.

SUMMARY OF THE INVENTION

The present invention aims to eliminate the above-mentioned disadvantages and problems, for example, problems regarding bulkiness of the apparatus, usage of harmful fluorogas and troublesome and expensive maintenance which are caused when the excimer laser is used as the ultraviolet light source of the exposure apparatus, problems regarding the damage of the non-linear optical crystal and the occurrence of the speckle due to increase in the spacial coherence which are caused when the harmonic wave of the solid-state laser such as the Nd:YAG laser is used as the ultraviolet light source of the exposure apparatus, and problems regarding the complexity of the construction including the wavelength-coincidence mechanism, the difficulty in reduction of diameter of the output beam and the troublesome maintenance which are caused when the array laser in which the plurality of laser elements for generating the ultraviolet light are bundled in the matrix pattern is used as the ultraviolet light source of the exposure apparatus.

Accordingly, an object of the present invention is to provide an ultraviolet laser apparatus in which ultraviolet light having a single wavelength and sufficiently narrower bandwidth for a light source of an exposure apparatus can stably be obtained as ultraviolet output light having low spatial coherence and which is compact and easily handlable.

Another object of the present invention is to provide an exposure apparatus which is compact and has high degree of freedom and in which such an ultraviolet laser apparatus which is compact and easily handlable is used as a light source.

The above object is achieved by an ultraviolet laser apparatus comprising a laser generating portion for generating light having a single wavelength, at least one stage optical amplifier having a fiber optical amplifier for amplifying the generated laser light, and a wavelength converting portion for wavelength-converting the light amplified by the optical amplifier into ultraviolet light by using a non-linear optical crystal.

More specifically, the laser generating portion includes a single-wavelength oscillating laser (for example, a DFB semiconductor laser 31 in an embodiment and the like) having a narrow band, and the laser light having the single wavelength is amplified by the fiber optical amplifier (for example, an erbium doped fiber optical amplifiers 33, 34 in an embodiment and the like), and the output light from the fiber amplifier is converted into an ultraviolet light (for example, ultraviolet light having a wavelength of 193 nm or 157 nm) by the wavelength converting portion using the non-linear optical crystal (for example, crystals 502 to 504 in an embodiment and the like). In this way, an ultraviolet laser apparatus which is compact and easily handlable and which is adapted to generate ultraviolet light having a single wavelength and which constitutes the object of the invention is provided.

Further, in the present invention, the output from the single-wavelength oscillating laser (for example, DFB semiconductor lasers 11, 21 or a fiber laser in an embodiment and the like) is divided or branched by a light dividing or branching device. The output is divided into plural outputs by the light dividing or branching device (for example, splitters 14, 16 in an embodiment and the like), and the fibers are arranged behind the device, and, by bundling the plurality of fibers, the ultraviolet laser apparatus is formed. Further, the light dividing or branching device may have any design so long as the laser light generated by the single-wavelength laser can be divided or branched in parallel.

By providing a device for preventing the branched light beams to be overlapped in view of time, independent light beams can be obtained. A preferred device for achieving this may comprise beam splitters for branching the laser light generated by the single-wavelength laser into plural light beams in parallel, and fibers having different lengths and disposed at output sides of the beam splitters. In a preferred form of the fibers having different lengths, the lengths of the fibers are selected so that, after the laser beams branched in parallel pass through the respective fibers, delay distances or intervals between the successive laser beams becomes substantially the same at the output ends of the fibers.

Further, according to one aspect of the present invention, as the light dividing or branching device, a time division multiplexer (TDM) (for example, a TDM 23 in an embodiment) for distributing the light into respective light paths every predetermined time is used.

Next, as the plurality of fibers disposed on the output sides of the light dividing or branching device, a plurality of fiber optical amplifiers are preferable. Further, it is preferable that the light beams are amplified by the fiber optical amplifiers (for example, erbium doped fiber optical amplifiers or ytterbium doped fiber optical amplifiers 18, 19 in an embodiment and the like) and the plurality of fiber optical amplifiers are bundled. With this arrangement, laser light having higher intensity can be obtained. Further, if necessary, non-doped fibers may be coupled to the output ends (for example, fiber output ends 114, 29 in an embodiment and the like) of the plurality of fiber optical amplifiers.

In the fiber output ends, it is preferable that diameters of cores (for example, a core 421 in the drawing of an embodiment) of the fibers are gently diverged in a tapered fashion toward the output end faces. Further, it is preferable that a window member (for example, window members 433, 443 in an embodiment and the like) which are transparent to the laser light is provided on the fiber output ends. With this arrangement, power density (light intensity per unit area) of the laser light can be reduced at the fiber output ends, and, accordingly, the fiber output ends can be prevented from being damaged.

Further, according to the present invention, in a plurality of fibers provided on an incident side of the wavelength converting portion, it is preferable that output ends of the fibers are bundled as a single bundle or plural bundles and are formed as a single output group or plural output groups (for example, bundle outputs 114, 29, 501, 601, 701 in an embodiment and the like) to match with the construction of the wavelength converting portion. And, in the wavelength converting portion, harmonic wave generation for fundamental wave is effected by one set or plural sets of non-linear optical crystals (for example, crystals 502 to 504 in a fourth embodiment or crystals 842 to 844 in an eighth embodiment) to output ultraviolet light (for example, ultraviolet light having a wavelength of 193 nm or 157 nm). By providing one set of wavelength converting portions, the apparatus can be made more compact and cheaper, and, by providing the plural sets of wavelength converting portions, since the load acting on each set can be reduced, high output can be achieved as a whole.

Further, when the optical amplifier is constituted by the plurality of fiber optical amplifiers, in order to suppress fluctuation in ultraviolet light outputs due to fluctuation in amplification gain of the fiber optical amplifiers, it is desirable to provide a fiber output control device for monitoring the output lights from the fibers to control pumping power of the fiber optical amplifiers. Further, in order to equalize light wavelengths of the ultraviolet light outputs to a specific wavelength, it is desirable to provide a control device for controlling the oscillating wavelength of the single wavelength oscillating laser by using the frequency of fundamental wave or the harmonic wave in the wavelength converting portion.

Light collecting optical elements are provided at the incident sides of the wavelength converting portions. Application of the light collecting optical elements can be appropriately selected in accordance with the output conditions of the optical amplifiers. For example, according to one aspect, the light collecting optical elements (for example, lenses 902, 453 in an embodiment and the like) may be provided for each fiber output, or, according to another aspect, the light collecting optical elements (for example, lenses 845, 855,463 in an embodiment and the like) may be provided for each of the bundled output groups.

By the way, as an arrangement for outputting the ultraviolet light, for example, there is a technique in which a laser beam having a wavelength of about 1.5 μm is emitted from the laser light generating portion, and, regarding the optical amplifier, at least one stage optical amplifier having the fiber optical amplifiers for amplifying the fundamental wave having a wavelength of about 1.5 μm is provided, and, a wavelength converting portion for effecting 8th harmonic wave generation for the amplified fundamental wave is also provided. With this arrangement, the ultraviolet light having output wavelength of about 190 nm can be generated. The output light can be made to have the same wavelength as the wavelength (of 193 nm) of the ArF excimer laser by tuning the oscillating wavelength of the laser light generating portion more finely (for example, 1.544 to 1.522 μm).

Further, as another arrangement for outputting the ultraviolet light, for example, there is a technique in which, similar to the above-mentioned arrangement, a laser beam having a wavelength of about 1.5 μm is emitted from the laser light generating portion, and, regarding the optical amplifier, at least one stage optical amplifier having the fiber optical amplifiers for amplifying the fundamental wave having a wavelength of about 1.5 μm is provided, and, a wavelength converting portion for effecting 10th harmonic wave generation for the amplified fundamental wave is also provided. With this arrangement, the ultraviolet light having output wavelength of about 150 nm can be generated. This output light can be made to have the same wavelength as the wavelength (of 157 nm) of the $F_2$ laser by tuning the oscillating wavelength of the laser light generating portion more finely (for example, 1.57 to 1.58 μm).

Further, as a further arrangement for outputting the ultraviolet light, for example, there is a technique in which a laser beam having a wavelength of about 1.1 μm is emitted from the laser light generating portion, and, regarding the optical amplifier, at least one stage optical amplifier having the fiber optical amplifiers for amplifying the fundamental wave having a wavelength of about 1.1 μm is provided, and, a wavelength converting portion for effecting 7th harmonic wave generation for the amplified fundamental wave is also provided. With this arrangement, the ultraviolet light having output wavelength of about 150 nm can be generated. The output light can be made to have the same wavelength as the wavelength (of 157 nm) of the $F_2$ laser by tuning the oscillating wavelength of the laser light generating portion more finely (for example, 1.099 to 1,106 μm).

Further, as the other arrangement for outputting the ultraviolet light, for example, by providing a laser light generating portion including a semiconductor laser or a fiber laser having oscillating wavelength of about 990 nm, at least one stage optical amplifier having the fiber optical amplifiers for amplifying the fundamental wave having a wavelength of about 990 nm, and a wavelength converting portion for effecting 4th harmonic wave generation for the amplified fundamental wave, the ultraviolet light having the same wavelength as the wavelength (of 248 nm) of the KrF excimer laser can be obtained.

The wavelength converting portion for effecting such a harmonic wave generation can be designed au various arrangements as will be described in embodiments of the present invention which will be described later. For example, briefly explaining an example of an arrangement of the wavelength converting portion for effecting 8th harmonic wave generation for the fundamental wave, such an arrangement can be constituted by a three-stage harmonic wave generation light path system (for example, FIG. 11(a) in a fourth embodiment) for converting the fundamental wave into 2nd harmonic wave→4th harmonic wave→8th harmonic wave by utilizing second harmonic wave generation (SHG) of the non-linear optical crystal in all of the wavelength converting stages. With this arrangement, a desired 8th harmonic wave can be obtained with least number of stages.

Further, as another preferred arrangement for obtaining the 8th harmonic wave, there is an arrangement (for example, FIG. 11(d) in a fourth embodiment and the like) in which 3rd harmonic wave and 4th harmonic wave of the fundamental wave are generated by also utilizing sum frequency generation (SFG) of the nonlinear optical crystal in the wavelength converting stages, and these waves are subjected to sum frequency generation to generate 7th harmonic wave of the fundamental wave, and further, the 7th harmonic wave and the fundamental wave are subjected to sum frequency generation to generate 8th harmonic wave of the fundamental wave. In this arrangement, a LBO crystal having low absorption coefficient for ultraviolet light having the wavelength of 193 nm can be used for 8th harmonic wave generation in the last stage. Further, regarding 7th harmonic wave generation and 10th harmonic wave generation from the fundamental wave, similar to 8th harmonic wave generation from the fundamental waves the second harmonic wave generation and the sum frequency generation of the non-linear optical crystal can be used.

Further, according to an aspect of the present invention, ultraviolet pulse laser light can be obtained by providing a pulsing device (for example, light modulating elements 12, 22 in an embodiment and the like) for pulsing CW laser light of the single wavelength oscillating laser in the laser generating portion or by pulse-oscillating the single wavelength oscillating laser or by doing both. Further, by using the ultraviolet laser apparatus having the above-arrangement as a light source of a projection exposure apparatus, and by providing an illumination optical system for illuminating light from the light source onto a mask on which a projection pattern is printed with substantially uniform intensity and a projection objective optical system for projecting the pattern printed on the mask onto a wafer, a projection exposure apparatus having easy maintenance can be obtained.

EFFECT OF THE INVENTION

As mentioned above, according to the present invention, since the light having single wavelength from the laser generating portion is amplified by the optical amplifier in the light source and the amplified light is converted into the ultraviolet light by the non-linear optical crystal of the wavelength converting portion, the ultraviolet light having the desired spectrum line width (for example, 1 pm or less) can easily be obtained without complicated arrangement.

Further, since the laser light having single wavelength is divided (or multiplexed) into the plurality of output lights and the plural output lights are amplified by the plurality of fiber optical amplifiers and the amplified lights are converted into the ultraviolet lights by the nonlinear optical crystals, the entire laser light output can be increased while suppressing the peak power of the pulse light per one pulse and the ultraviolet light having low spatial coherence can be obtained.

That is to say, according to the present invention, there can be provided an ultraviolet laser apparatus which is compact and has high degree of freedom regarding arrangement of parts and in which the maintenance is easy and the non-linear optical crystal is hard to be damaged and the spatial coherence is low.

BRIEF DESCRIPTION OF THE DRAWINGS

FIG. 9 is an enlarged side view of a fiber core at an output end of the fiber optical amplifier;

FIG. 10(a) is a side view showing an example of the output end of the fiber optical amplifier, and FIG. 10(b) is a side view showing another example of the output end of the fiber optical amplifier:

FIGS. 11(a) to 11(d) are explanatory views showing first to fourth examples of an arrangement of a wavelength converting portion of an ultraviolet laser apparatus according to a fourth embodiment of the present invention;

FIGS. 12(a) to 12(d) are views showing tables corresponding the first to fourth examples of FIGS. 11(a) to 11(d) and each indicating conversion efficiency of the wavelength converting portion:

FIGS. 18(a) to 18(c) are explanatory views showing first to third examples of a further embodiment of an input part of the wavelength converting portion of the ultraviolet laser apparatus according to the present invention;

DETAILED DESCRIPTION OF THE PREFERRED EMBODIMENTS

Figure 1:
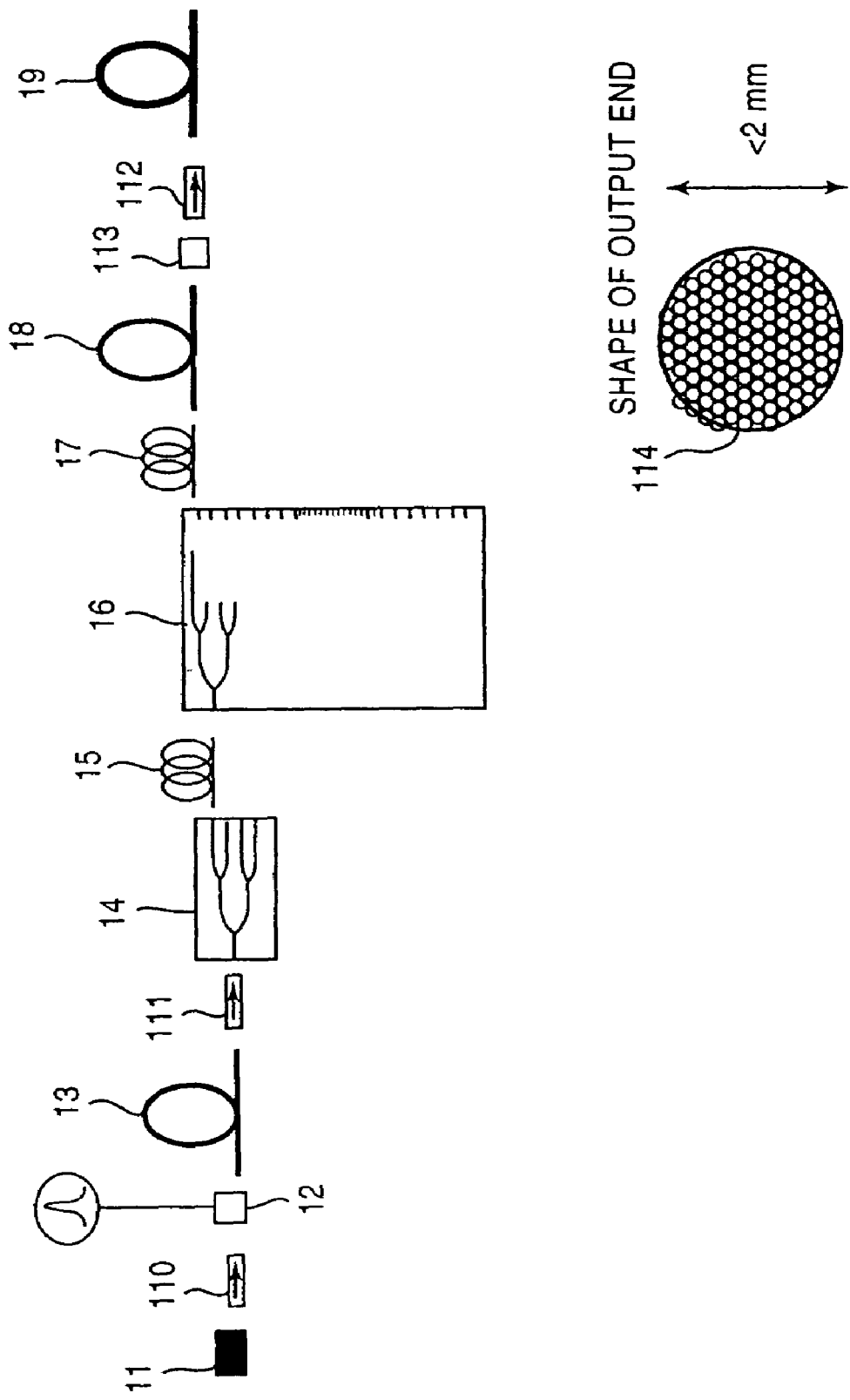
FIG. 1 is an explanatory view showing an arrangement of a laser light generating portion and an optical amplifier of an ultraviolet laser apparatus according to a first embodiment of the present invention.

The present invention will now be explained in connection with embodiments thereof with reference to the accompanying drawings.

First of all, an ultraviolet laser apparatus according to a first embodiment of the present invention will be described with reference to FIG. 1. An ultraviolet light generating apparatus according to the first embodiment comprises a laser light generating portion including a single wavelength oscillating laser 11 and adapted to generate a laser beam (or light) having a single wavelength, an optical amplifier including fiber optical amplifiers 13, 18 and 19 and adapted to amplify the light, light branching devices 14, 16 for branching the light into plural parallel beams, fibers 15, 17 having different lengths, and a wavelength converting portion including a non-linear optical crystal (described later) and adapted to wavelength-convert the amplified light, thereby providing an ultraviolet light generating apparatus capable of generating output wavelength same as output wavelength (193 nm) of an ArF excimer laser or output wavelength (157 nm) of an $F_2$ laser with low spatial coherence.

In the illustrated embodiment, FIG. 1 shows an example of an arrangement in which the laser light having the single wavelength is outputted from the laser generating portion of the ultraviolet laser apparatus according to the present invention and is branched and amplified. First of all, explaining with reference to FIG. 1, the laser generating portion includes the single wavelength oscillating laser 11 for generating the laser beam having a single wavelength, and further, there are provided splitters (light branching devices) 14, 16 and the fibers 15, 17 having different lengths, and fiber optical amplifiers 18, 19 are connected to output ends of the fibers 17 having different lengths so that the plural light beams are amplified in parallel. Output ends of the fiber optical amplifiers 19 are bundled so that the amplified laser beams are incident on a wavelength converting portion (502 to 506) as shown in FIG. 11(a), for example. A fiber bundle output end 114 of the fiber optical amplifiers corresponds to fiber bundle output ends 501 shown in FIGS. 11(a) to 11(d), respectively. The wavelength converting portion includes non-linear optical crystals 502 to 504 so that the fundamental wave emitted from the fiber optical amplifier 19 is converted into ultraviolet light. The wavelength converting portion according to the present invention will be fully described later with reference to fourth to seventh embodiments.

Now, the first embodiment will be fully explained. As the single wavelength oscillating laser 11 for generating the laser beam having a single wavelength, for example, InGaAsP, DFB semiconductor laser having an oscillating wavelength of 1.544 µm and continuous wave output (referred to as "CW output" hereinafter) of 20 mW. The DFB semiconductor laser is designed so that, in place of a Fabry-Perot resonator having low longitudinal mode selection, diffraction gratings are incorporated into a semiconductor laser to perform single longitudinal mode oscillation under any conditions and is called as a distributed feedback (DFB) laser. In such a laser, since single longitudinal mode oscillation is effected fundamentally, a line width of an oscillation spectrum can be suppressed below 0.01 pm.

Further, in order to fix the output wavelength of the ultraviolet laser apparatus to a given wavelength, it is preferable to provide an oscillating wavelength controlling device for controlling the oscillating wavelength of the single wavelength oscillating laser (master oscillator) to become the given wavelength. Alternatively, it is also preferable that the oscillating wavelength of the single wavelength oscillating laser is positively changed by the oscillating wavelength controlling device to permit adjustment of output wavelength thereof. For example, when the laser apparatus according to the present invention is applied to an exposure apparatus, according to the former, occurrence or fluctuation of aberration of a projection optical system due to wavelength fluctuation is prevented, thereby preventing change in imaging characteristics (optical characteristics such as image quality) during pattern transferring. On the other hand, according to the latter, fluctuation in focusing property (aberration and the like) of the projection optical system caused in accordance with differences in height level, atmospheric pressure and environment (atmosphere in a clean room) between a manufacturing place where the exposure apparatus is assembled and adjusted and a setting place where the exposure apparatus is installed can be cancelled so that the time for preparing the exposure apparatus in the setting place can be reduced. Further, according to the latter, during the operation of the exposure apparatus, fluctuation in aberration, projection magnification and focusing position of the projection optical system caused due to change in illumination of exposure illumination light and atmospheric pressure can also be cancelled, so that a pattern image can always be transferred onto a substrate under a best focusing condition.

In such an oscillating wavelength controlling device, for example, the DFB semiconductor laser is used as the single wavelength oscillating laser, the given wavelength can be achieved by controlling a temperature of the DFB semiconductor laser, and, thus, by this method, the oscillating wavelength can be further stabilized to control it to become the given wavelength or to finely adjust the output wavelength.

Normally, the DFB semiconductor laser is provided on a heat sink and is contained in a frame together with the heat sink. Thus, in the illustrated embodiment, a temperature adjuster (for example, Peltier element) provided on the heat sink added to the single wavelength oscillating laser (such as the DFB semiconductor laser) 11 is used to control the temperature, thereby adjusting the oscillating wavelength. In the DFB semiconductor laser, the temperature can be adjusted with a unit of 0.001° C. Further, oscillating wavelength of the DFB semiconductor laser has temperature dependency of about 0.1 nm/° C. For example, in the fundamental wave (1544 nm), since the wavelength is changed by 0.1 nm when the temperature of the DFB semiconductor laser is changed by 1° C., a wavelength of 8th harmonic wave (193 nm) is changed by 0.0125 nm and a wavelength of 10th harmonic wave (157 nm) is changed by 0.01 nm. Further, in the exposure apparatus, it is sufficient that wavelength of the exposure illumination light (pulse light) can be changed by about ±20 pm with respect to the center wavelength. Accordingly, the temperature of the DFB semiconductor laser may be changed by about ±1.6° C. for the 8th harmonic wave and by about ±2° C. for the 10th harmonic wave.

As a monitor wavelength of feedback control when the oscillating wavelength is controlled to become the given wavelength, among the oscillating wavelength of the DFB semiconductor laser and wavelength conversion outputs (described later) (2nd harmonic wave, 3rd harmonic wave, 4th harmonic wave and the like), a wavelength which can provide required sensitivity in the desired wavelength control and which is easily monitored is selected. For example, when the DFB semiconductor laser having the oscillating wavelength of 1.51 to 1.59 nm is used as the single wavelength oscillating laser, 3rd harmonic wave of the oscillating laser light becomes a wavelength of 503 to 530 nm, and this spectral bandwidth corresponds to a spectral bandwidth in which absorption lines of iodine molecules exist densely. Thus, by selecting proper iodine molecule absorption line to lock it to become the target wavelength, exact oscillating wavelength control can be effected.

The light output (CW light) of the semiconductor laser 11 is converted into pulse light, for example, by using a light modulating element 12 such as an electro-optical light modulating element or an acousto-optical light modulating element. In the illustrated embodiment, as an example, a case where the output is modulated to pulse light having pulse width of 1 ns and repetition frequency of 100 kHz (pulse period of 10 µs) will be explained. As a result of such light modulation, a peak power of the pulse light outputted from the light modulating element 12 becomes 20 mW and an average output becomes 2 µW. Here, while an example that there is no loss due to insertion of the light modulating element 12 was explained, if there is insertion loss, for example, if insertion loss is −3 dB, the peak power of the pulse light will be 10 mW and the average output will be 1 µW.

Further, when the electro-optical light modulating element is used as the light modulating element, it is preferable to use an electro-optical light modulating element (for example, two electrode type modulator) having an electrode structure chirp-corrected to reduce wavelength expansion of the output of the semiconductor laser due to chirp associated with the time change in refractive index. Further, by setting the repetition frequency to more than about 100 kHz, reduction in amplification degree due to influence of ASE (amplified spontaneous emission) noise in the fiber optical amplifier which will be described later can be prevented. Such an arrangement of the modulator is desirable.

Further, the output light can be pulse-oscillated by controlling the current of the semiconductor laser. Thus, in the illustrated embodiment (and other embodiments which will be described later), it is preferable that the pulse light is generated both by using the current control of the single wavelength oscillating laser (DFB semiconductor laser) 11 and by using the light modulating element 12. In this way, for example, pulse light having a pulse width of about 10 to 20 ns is oscillated by controlling the current of the DFB semiconductor laser 11 and only a part of the pulse light is picked up by the light modulating element 12. That is to say, in the illustrated embodiment, the light is modulated to the pulse light having a pulse width of 1 ns. By doing so, in comparison with the case where only the light modulating element 12 is used, pulse light having narrower pulse width can easily be generated and an oscillation interval, and timing of oscillation start and stop of the pulse light can easily be controlled. Particularly, when the oscillation of the pulse light is going to be stopped by using only the light modulating element 12, if a part thereof is outputted, it is desirable that the current control of the DFB semiconductor laser is also effected simultaneously. The pulse light output obtained in this way is coupled to a first stage erbium (Er) doped fiber optical amplifier (EDFA) 13, thereby effecting light amplification of 35 dB (3162 times). In this case, the pulse light has a peak power of about 63 W and an average output of about 6.3 mW.

Output of the fiber amplifier (first stage optical amplifier) 13 is firstly divided in parallel into four outputs of channels 0 to 3 by the splitter (flat plate waveguide 1×4 splitters) 14 as the light dividing device. By coupling the outputs of the channels 0 to 3 to the fibers 15 having different lengths (only one fiber for the channel 0 is illustrated), the lights outputted from the fibers are time-delayed in accordance with the lengths of the fibers. In the illustrated embodiment, for example, it is assumed that the propagating speed of the light through the fiber is $2 \times 10^8$ m/s, and the fibers having the lengths of 0.1 m, 19.3 m, 38.5 m and 57.7 m, respectively are connected to the channels 0, 1, 2 and 3, respectively. In this case, the delay of light between the adjacent channels at the outlets of the fibers becomes 96 ns. Further, here, the fiber used for delaying the light is referred to as "delay fiber".

Then, outputs of four delay fibers are further divided into 32 outputs in parallel by the splitter 16 (flat plate waveguide 1×32 splitters) of 4 block type (channels 0 to 31 in each block), i.e., divided into 128 channels in total. Further, fibers having different lengths are connected to the channels 1 to 31 of each block (except for the channel 0). In the illustrated embodiment, for example, the fibers having lengths of 0.6×N meters (N; channel number) are connected to the channels 1 to 31, respectively. As a result, the delay of 3 ns is given between the adjacent channels in each block, so that the delay of the output of the channel 31 with respect to the output of the channel 0 in each block becomes 93 ns (=3×31).

On the other hand, between the adjacent blocks of the first to fourth blocks, as mentioned above, the delay of 96 ns is given by the delay fibers 15 at the entrance of the block. Accordingly, the output of the channel 0 of the second block is delayed by 96 ns with respect to the output of the channel 0 of the first block and is delayed by 3 ns with respect to the output of the channel 31 of the first block. The same is true between the second and third blocks and between the third and fourth blocks. As a result, as the entire output, at output ends of 128 channels (in total), pulse lights having delay of 3 ns between the adjacent channels can be obtained. Further, in FIG. 1, although only the channels of the first block are illustrated and the other channels are omitted, the same is true with respect to the other channels.

By the above-mentioned branching and delaying, at the output ends of 128 channels (in total), the pulse lights having delay of 3 ns between the adjacent channels can be obtained. In this case, the light pulse observed at each output end is 100 kHz (pulse period: 10 μs) which is the same as that of the pulse modulated by the light modulating element 12. Accordingly, in consideration of the entire laser light generating portion, after 128 pulses are generated with interval or period of 3 ns, next pulse group is generated after a period of 9.62 μs. Such generation is repeated with 100 kHz. That is to say, the entire output becomes $128 \times 100 \times 10^3 = 1.28 \times 10^7$ pulses/sec.

Further, in the illustrated embodiment, while an example that the number of divisions is 128 and short delay fibers are used was explained. Thus, a non-light emitting interval of 9.62 μs is generated between the pulse groups. However, the periods between the pulses can be completely equidistant by increasing the number of divisions or by increasing the lengths of the delay fibers to have proper values or by using combination thereof. For example, the equidistant periods can be achieved by selecting the lengths of the fibers so that the delay intervals between the fibers become $1/(f \times m)$ when it is assumed that the pulse repetition frequency of the laser beam incident on the splitter 14 is f [Hz] and the number of divisions is m. Further, the number of divisions of at least one of the splitters 14, 16 or the pulse repetition frequency f defined by the light modulating elements 12 or both may be adjusted to obtain the complete equidistant pulse intervals. Accordingly, by adjusting the fiber lengths of the delay fibers 15, 17 and/or division number of at least one of the splitters 14, 16 and/or the pulse repetition frequency f, not only the pulse intervals can be made equidistant, but also the pulse intervals can be set at desired ones.

Further, in order to alter the fiber lengths after the light source was assembled, for example, it is preferable that the delay fibers 15, 17 are bundled as a unit and such a unit can be exchanged by another delay fiber unit having different delay time between channels. Further, also when the division numbers of the splitters 14, 16 are to be altered, it is preferable that other splitters having different division numbers are prepared in correspondence to the splitters 14, 16 to permit the exchange between the splitters. In this case, it is desirable that the delay fiber unit can be exchanged by another unit when the division numbers of the splitters 14, 16 are altered.

Further, in the illustrated embodiment, by controlling a timing of drive voltage pulses applied to the light modulating element 12, an oscillation timing of the light source (pulse light). i.e., the repetition frequency f (pulse period) can be adjusted. Further, if the output of the pulse light may be changed as the oscillation timing is altered, the magnitude of the drive voltage pulse applied to the light modulating element 12 may be simultaneously adjusted to compensate for the fluctuation of output. In this case, the fluctuation of output of the pulse light may be compensated by effecting only the oscillation control of the single wavelength oscillating laser 11 or through a combination of such an oscillation control and the control of the light modulating element 12. Further, the fluctuation of output of the pulse light may be generated not only when the oscillating timing is altered but also when the oscillation of the single wavelength oscillating laser (i.e., input of the pulse light to the fiber optical amplifiers) is re-started after such an oscillation was stopped for a predetermined time period. Further, when the single wavelength oscillating laser 11 is pulsated, the oscillation timing (pulse period) of the pulse light may be adjusted by only the current control of the single wavelength oscillating laser 11 or by the combination of such a current control and the control of the light modulating element 12.

In the illustrated embodiment, the fiber optical amplifiers 18 are connected to 128 (in number) delay fibers 17, and the fiber optical amplifiers 19 are connected to the fiber optical amplifiers 18 with the interposition of a narrow band filter 113. The narrow band filter 113 serves to make the spectral bandwidth of transmitted (or permeated) light narrower by cutting the ASE lights generated in the fiber optical amplifiers 13, 18 and by permitting transmission (or permeation) of output wavelength (having spectral bandwidth less than about 1 pm) of the DFB semiconductor laser 11. As a result, the ASE light can be prevented from entering the later stage fiber optical amplifiers (18, 19), thereby preventing reduction of gain of the laser light. Although the narrow band filter preferably permits transmission of wavelength having a width of about 1 pm, since the spectral bandwidth of the ASE light is about several tens of nm, even when a narrow band filter permitting transmission of wavelength having about 100 pm presently obtained is used, the ASE light can be cut without any substantial problems. Further, when the output wavelength of the DFB semiconductor laser 11 is desired to be positively altered, although the narrow band filter may be exchanged by another one in correspondence to new output wavelength, it is preferable that a narrow band filter having a transmissible spectral bandwidth in correspondence to a variable width (as an example, about ±20 pm in the exposure apparatus) of the output wavelength (i.e., same as the variable width or more) is used. Further, in the laser apparatus applied to the exposure apparatus, the spectral bandwidth thereof is set below about 1 pm. Further, the laser apparatus shown in FIG. 1 is provided with three isolators 110, 111, 112 so that influence of return light can be reduced by these isolators.

With the arrangement as mentioned above, the output lights emitted from the generating portion (i.e., from the output ends of the fiber optical amplifiers 19) are not overlapped with each other in view of time although they have narrow bands. Accordingly, the spatial coherence between the channel outputs can be reduced.

Further, in the above-mentioned arrangement, while an example that the DFB semiconductor laser is used as the single wavelength oscillating laser 11 and the splitters 14, 16 of flat plate waveguide type are used as the branching elements of the light branching device was explained, any laser having narrow band at this wavelength region may be used as the laser light source, similar to the DFB semiconductor laser. For example, an erbium (Er) doped fiber laser can achieve the same effect. Further, any element capable of branching the light in parallel may be used as the branching element of the light branching device, similar to the splitter of flat plate waveguide type. For example, a fiber splitter or a beam splitter using partial light-transmissible mirror can achieve the same effect.

Further, as mentioned above, in the illustrated embodiment, the outputs of the fibers 17 (delay fibers) are further amplified by a single stage EDFA or a multi-stage EDFA (erbium doped fiber optical amplifiers, which will be referred to as "EDFA" hereinafter). In the illustrated embodiment, as an example, an example that an average output of about 50 μW at each channel of the laser light generating portion, i.e., an average output of about 6.3 mW for the entire channels is amplified by two-stage EDFAs 18, 19 by 46 dB (40,600 times) in total is shown. In this case, at the output end of each channel, the output light having a peak power of 20 kW, pulse width of 1 ns, pulse repetition frequency of 100 kHz and average output of 2 W (average output of about 256 W in the entire channels) can be obtained. Here, although coupling loss at the splitters 14, 16 of flat plate waveguide type is not taken in consideration, if there is such a coupling loss, by increasing the gain of the fiber optical amplifiers (for example, at least one of EDFAs 18, 19) by an amount corresponding to the coupling loss, the output of the fundamental wave generated from the EDFA 19 can be made the same as the aforementioned value (for example, peak power of 20 kW and the like). Further, by changing the gain of the fiber optical amplifier, the output of the fundamental wave can be increased or decreased with respect to the aforementioned value.

The single wavelength pulse laser light having wavelength of 1.544 μm (output of the optical amplifier) is converted into an ultraviolet light pulse output light having narrow spectrum line width by the wavelength converting portion using the non-linear optical crystals. The wavelength converting portion will be described later.

Next, a second embodiment of an ultraviolet laser apparatus according to the present invention will be explained with reference to FIG. 2. The ultraviolet laser apparatus according to the second embodiment comprises a laser light generating portion for generating a laser light having a single wavelength, an optical amplifier for amplifying the light, and a wavelength converting portion for wavelength-converting the amplified light, thereby providing an ultraviolet light generating apparatus capable of generating an output wavelength same as output wavelength (193 nm) of an ArF excimer laser or an output wavelength (157 nm) of an $F_2$ laser with low spatial coherence. Further, the ultraviolet laser apparatus according to the second embodiment differs from the ultraviolet laser apparatus according to the first embodiment of the present invention in two points that the light branching device divides and branches the light in view of time and that the laser light before incident con the light branching device is not amplified by the fiber optical amplifiers. Thus, it is possible that the light branching device may be disposed ahead of the fiber optical amplifiers or vice versa. Further, similar to the first embodiment (FIG. 1), fiber optical amplifiers may further be provided on an incident side (i.e., on a aide of a single wavelength oscillating laser 21) of the light branching device (TDM 23 in this embodiment) so that the pulse light amplified in the fiber optical amplifiers is incident on the light branching device. With this arrangement, required gain can be reduced by the fiber optical amplifiers (24, 25 in the illustrated embodiment) disposed behind (later stage) the light branching device in comparison with the arrangement shown in FIG. 2, with the result that, for example, since the number of replacing fiber optical amplifiers is reduced, a cheaper apparatus can be realized.

Figure 2:
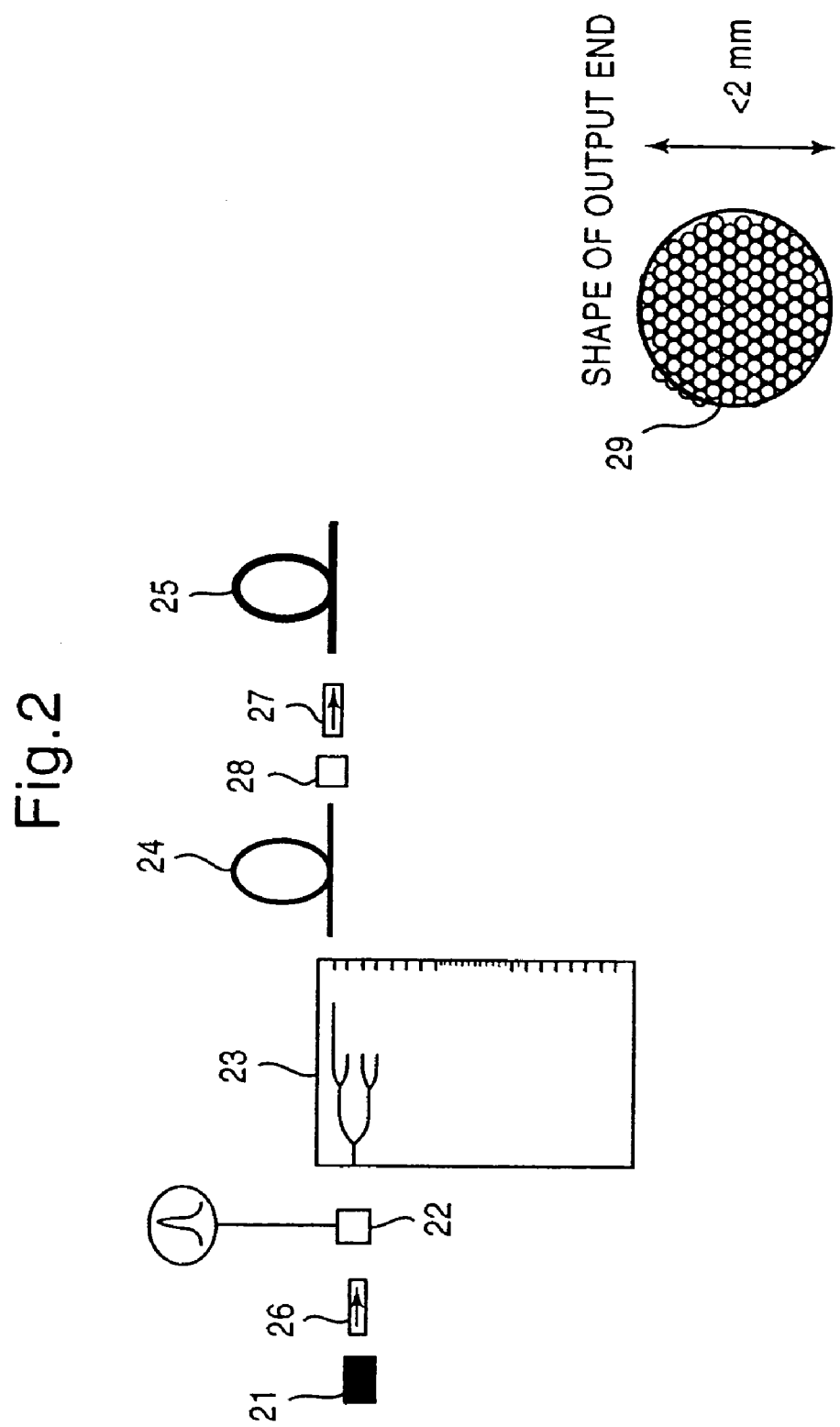
FIG. 2 is an explanatory view showing an arrangement of a laser light generating portion and an optical amplifier of an ultraviolet laser apparatus according to a second embodiment of the present invention.

By the way, in the second embodiment, FIG. 2 shows an example of an arrangement of laser light generating portion, light branching device and optical amplifier of the ultraviolet laser apparatus according to the present invention. As shown in FIG. 2, the ultraviolet laser apparatus according to the second embodiment comprises the laser light generating portion including a single wavelength oscillating laser 21 for generating the laser beam having a single wavelength, and a light branching device 23 for branching the light, and plural light outputs from the light branching device 23 are amplified in parallel, respectively by fiber optical amplifiers 24, 25. Output ends of the fiber optical amplifiers 25 are bundled, so that the amplified laser light is incident on a wavelength converting portion (702 to 712) comprised of non-linear optical crystals shown in FIG. 14, for example. Fiber bundle output ends 29 of the fiber optical amplifiers 25 shown in FIG. 2 correspond to fiber bundle output ends 701 shown in FIG. 14. This wavelength converting portion has a group of non-linear optical crystals 702, 705, 710, 712 for converting the fundamental waves emitted from optical fibers (21 to 28) into ultraviolet lights. Further, the wavelength converting portion according to the present invention will be fully described later with reference to fourth to seventh embodiments.

Now, the second embodiment will be fully described. As the single wavelength oscillating laser 21 for generating the laser beam having a single wavelength, for example, an ytterbium (Yb) doped fiber laser or a DFB semiconductor laser having an oscillating wavelength of 1.099 μm and CW output of 20 mW is used. In such lasers, since single longitudinal mode oscillation is effected fundamentally, a line width of an oscillation spectrum can be suppressed to less than 0.01 pm.

The light output (CW light) of this semiconductor laser is converted into pulse light, for example, by using a light modulating element 22 such as an electro-optical light modulating element or an acousto-optical light modulating element. In the illustrated embodiment, as an example, a case where the output is modulated to pulse light having pulse width of 1 ns and repetition frequency of 12.8 MHz (pulse period of 78 μs) will be explained. As a result of such light modulation, a peak power of the pulse light outputted from the light modulating element becomes 20 mW and average output becomes 0.256 mW.

The output of the pulse light is shared or branched into 128 channels (in total) from a channel 0 to a channel 127 successively for each pulse by means of a time division multiplexer (TDM) 23 which is the light branching device. That is to say, the pulses with pulse period of 78 ns are successively shared into the channels 0, 1, 2, 3, . . . , 127. Observing the result for each channel, the pulse light having pulse period of 10 μs (=78 ns×128) (pulse frequency of 100 kHz), pulse peak power of 20 mW and average output of 2 μW can be obtained. Further, in consideration of the entire laser light generating portion, the averaged pulse light having pulse frequency of 12.8 MHz, pulse peak power of 20 mW and average output of 0.256 mW can be obtained. Further, there is a delay of 78 ns between the adjacent channels, and, thus, the pulse lights between the channels are not overlapped with each other. Further, in the illustrated embodiment, the repetition frequency f of the pulse light outputted from the light modulating element 12 is selected to 100 kHz (pulse period of 10 μs) and the pulse lights outputted from the channels 0 to 127 of the time division multiplexer (TDM) 23 are delayed by equidistant period or interval (78 ns ) which is obtained by dividing the pulse period (10 μs) defined by the light modulating element 22 by 128. This delay interval may not be equidistant time interval or, similar to the aforementioned first embodiment, the pulse lights may be outputted from the channels 0 to 127 at only a part of the pulse period (10 μs). Further, a timing of drive voltage pulse applied to the light modulating element 22 may simultaneously be controlled to alter the pulse period (10 μs), and, for example, the delay time obtained by dividing the pulse period by 128 can be altered.

Further, similar to the first embodiment, also in this embodiment, the single wavelength oscillating laser 12 may be pulsated. Alternatively, the pulse period (10 μs) may be altered by a combination of the control of the time division multiplexer (TDM) 23 and the current control of the single wavelength oscillating laser 21 or a combination of such controls and the control of the light modulating element 22.

With the arrangement as mentioned above, the output lights emitted from the generating portion are not overlapped with each other in view of time while they are single wavelength lights and have narrow bands, respectively. Accordingly, the spatial coherence between the channel outputs can be reduced.

Further, in the above-mentioned arrangement, while an example that the DFB semiconductor laser or the ytterbium (Yb) doped fiber laser is used as the single wavelength oscillating laser 21 was explained, any laser having narrow band at this wavelength region may be used as the laser light source to achieve the same effect, similar to the DFB semiconductor laser.

The output of the time division multiplexer 23 is amplified by fiber optical amplifiers 24, 25 comprised of single stage or multi-stage YDFAs (ytterbium doped fiber amplifiers; ytterbium doped fiber optical amplifier will be referred to as "YDFA" hereinafter) The ytterbium doped fiber optical amplifier has a higher exciting efficiency than that of the erbium doped fiber optical amplifier and thus is more economical. Further, similar to the first embodiment (FIG. 1), for the purpose of reducing the influence of the return light and making the spectral bandwidth narrower, an isolator 26 is disposed between the single wavelength oscillating laser 21 and the light modulating element 22, and a narrow band filter 28 and an isolator 27 are disposed between the fiber optical amplifiers 24 and the other fiber optical amplifiers 25.

In the illustrated embodiment, as an example, an example that an average output of about 2 µW at each channel of the time division multiplexer 23, i.e., an average output of about 0.256 mW in the entire channels is amplified by two-stage YDFAs 24, 25 by 60 dB (1,000,000 times) in total is shown. In this case, at the output end of each channel, the output light having peak power of 20 kW, pulse width of 1 ns, pulse repetition frequency of 100 kHz and average output of 2 W (average output of about 256 W in the entire channels) can be obtained. Further, in FIG. 3, only the channel 0 among all of the channels is shown and the other channels are omitted from illustration, the other channels have same arrangements as the arrangement of the channel 0.

The single wavelength pulse laser light having wavelength of 1.099 µm (output of the optical amplifier) is converted into ultraviolet light pulse output light having narrow spectrum line width by the wavelength converting portion using the non-linear optical crystals. The wavelength converting portion will be described later.

In the above-mentioned first and second embodiments, although the output wavelengths of the optical amplifiers are different, as mentioned above, the output wavelengths are determined by the oscillating wavelengths of the single wavelength oscillating lasers (11, 21) and are obtained by a combination of fiber optical amplifiers considering the amplifying efficiency, i.e., gain spectral bandwidths (for example, 1530 to 1560 nm in the erbium doped fiber and 990 to 1200 nm in the ytterbium doped fiber). Accordingly, in the illustrated embodiments of the present invention, regarding the single wavelength oscillating laser, fiber optical amplifiers having gain spectral bandwidths corresponding to the oscillating wavelength may be appropriately selected and combined. Further, for example, in the first embodiment, in place of the splitters of flat plate waveguide type (14, 16), the TDM (23) used in the second embodiment may be used, and, in the second embodiment. In place of the TDM (23), the splatters of flat plate waveguide type may be Used. Further, embodiments of the wavelength converting portion will be described later.

Further, in a high peak power optical fiber amplifier (19 in FIGS. 1 and 25 in. FIG. 2) of the last stage according to the illustrated embodiments, in order to avoid increase in spectrum widths of the amplified lights due to non-linear effect in the fibers, it is desirable that large mode diameter fiber optical amplifiers having fiber mode diameters (for example, 20 to 30 µm) greater than a fiber mode diameter (for example, 5 to 6 µm) normally used for communication are used.

Figure 4:
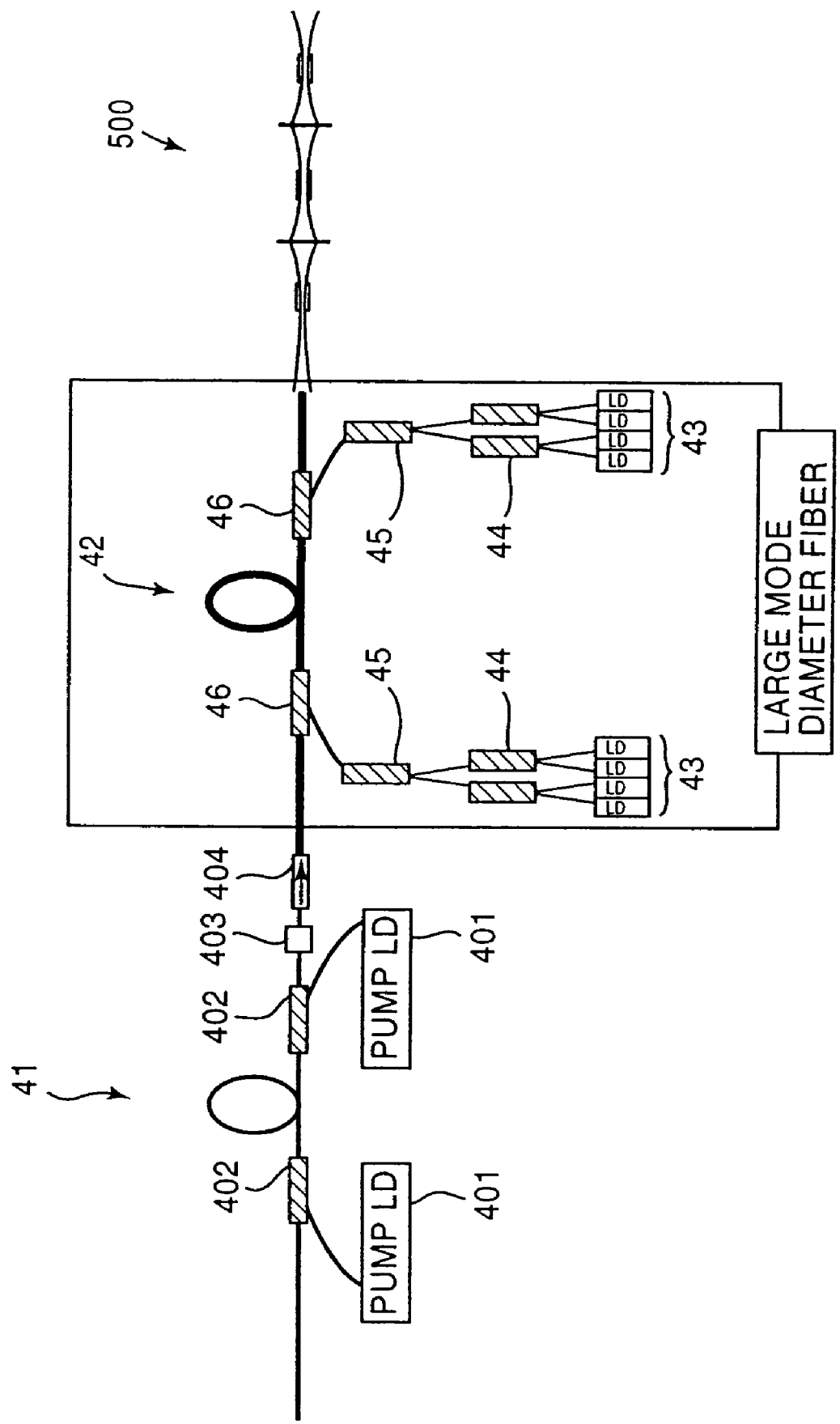
FIG. 4 is an explanatory view showing an arrangement of an optical amplifier according to another embodiment of the present invention.

An example of an arrangement of optical amplifier using the large mode diameter fiber optical amplifiers is shown in FIG. 4. In FIG. 4, in the optical amplifier 42 shown by a rectangular block (shown by the dot line) and adapted to increase the mode diameters of the fibers, semiconductor lasers 43 for pumping doped fibers of large mode diameter optical amplifiers are fiber-coupled to large mode diameter fibers corresponding to the diameters of the doped fibers of the optical amplifiers, so that outputs of the semiconductor lasers are inputted to the doped fibers of the optical amplifiers by using wavelength division multiplexers (WDMs) 45, 46, thereby pumping the doped fibers. Laser light amplified in the large mode diameter fibers (optical amplifier) 42 is incident on a wavelength converting portion 500, where the laser light is converted into ultraviolet light. It is desirable that the laser beams (signals) to be amplified and propagated through the large mode diameter fibers are mainly fundamental mode. This can be realized by selectively using the fundamental mode mainly in a single mode fiber or a multi-mode fiber having low mode degree.

Further, particularly in FIG. 4, optical polarization coupling elements 44 are disposed between the semiconductor lasers 43 and the WDMs 45 so that the laser beams outputted from two semiconductor lasers 43 and having polarization directions perpendicular to each other can be combined with each other. Further, in the illustrated embodiment, while an example that the polarization directions of the laser beams are made to be perpendicular to each other by the optical polarization coupling elements 44 was explained, when reduction in combining efficiency for the laser beams is permitted, the polarization directions may not be perpendicular to each other. Further, influence of return light is reduced by an isolator 404 disposed on an input side of the large mode diameter fiber optical amplifier 42. In addition, a narrow band filter 403 for removing ASE light generated by the fiber optical amplifier 41 is provided between a fiber optical amplifier 41 having a standard mode diameter and the large mode diameter fiber optical amplifier 42. Further, an pumping semiconductor laser 401 is fiber-coupled to the fiber optical amplifier 41, so that output of the semiconductor laser 401 is inputted to doped fibers of the optical amplifier through a WDM 402, thereby pumping the doped fibers.

According to such a method, since the semiconductor lasers 43 are coupled to the large mode diameter fibers, the coupling efficiency to the fibers is enhanced to thereby utilize the outputs of the semiconductor lasers effectively. Further, by using the large mode diameter fibers having the same diameter, since the loss in the WDMs 45, 46 can be reduced, efficiency can be enhanced. Further, connection between the front stage fiber optical amplifier 41 having the standard mode diameter and the last stage large mode diameter fiber optical amplifier 42 is effected by using fibers having mode diameters increased in a tapered fashion.

Figure 5:
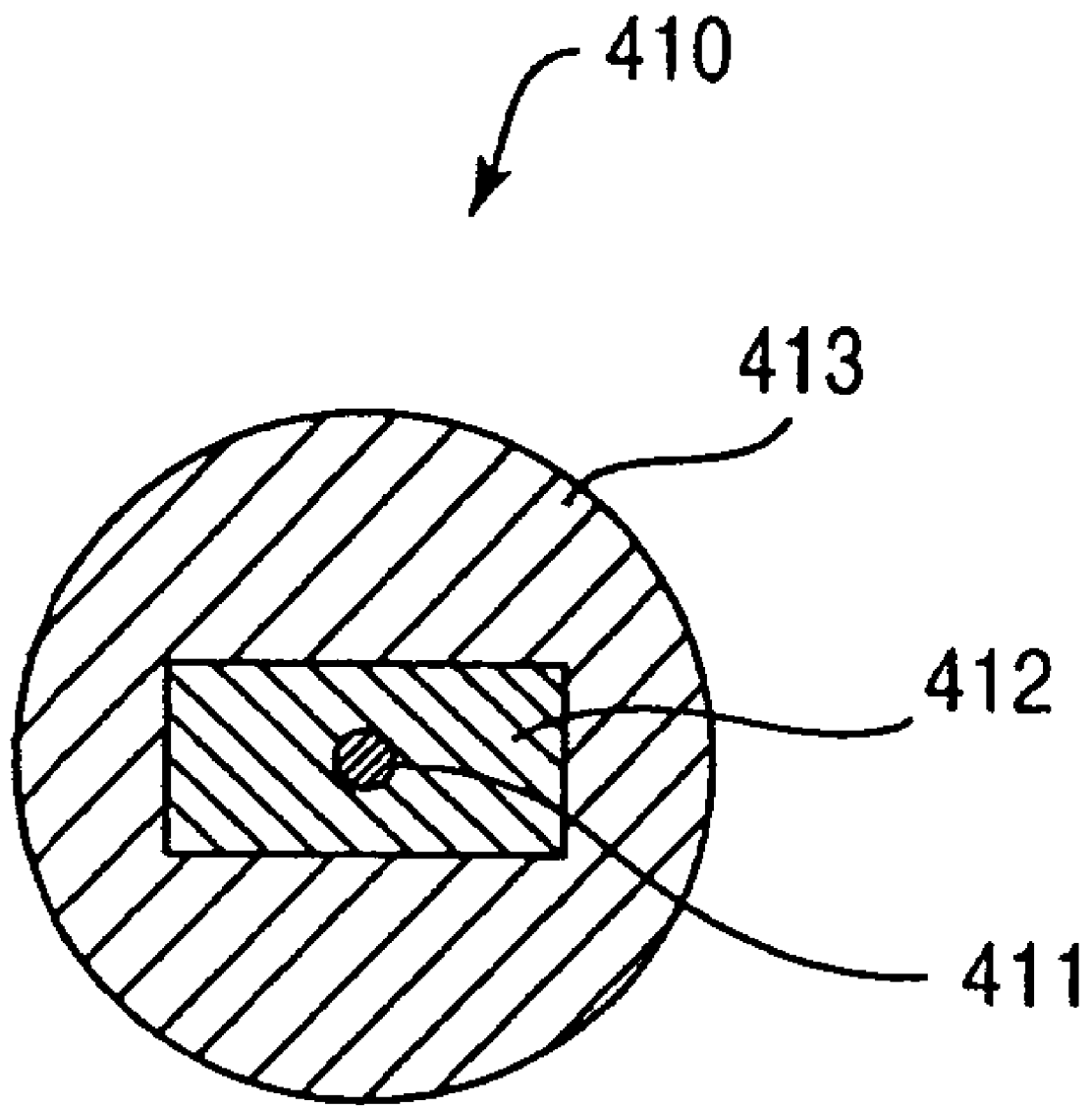
FIG. 5 is a sectional view of a double clad fiber.

Further, in order to obtain high outputs in the last stage fiber amplifiers (19, 25), in place of the large mode diameter fibers (42) of FIG. 4, a double clad fiber 410 having dual fiber clad structure may be used. FIG. 5 is a sectional view showing an example of the fiber 410. In this structure, ions attributing to amplification of the laser light are doped in a core 411, so that the laser light (signal) to be amplified is propagated in the core. An pumping semiconductor laser is coupled to a first clad 412 surrounding the core. Since the first clad is a multi-mode and has a great area, high output pumping semiconductor laser light can easily be transferred, and the multi-mode oscillating semiconductor laser can be coupled efficiently, and the exciting light source can be used efficiently. A second clad 413 for forming a waveguide for the first clad is formed around the first clad.

Further, although quartz fibers or silicate fibers may be used as the fiber optical amplifiers of the first and second embodiments, other than them, fluoride fibers (for example, ZBLAN fibers) may be used. In the fluoride fiber, erbium doping density can be increased in comparison with the quartz or silicate fiber, with the result that a fiber length required for amplification can be reduced. It is desirable that the fluoride fibers are applied to the last stage fiber optical amplifiers (19, 25), with the result that, by the reduction of fiber lengths, expansion of spectral bandwidth due to the non-linear effect during the propagation of pulse lights in the fibers can be suppressed, and, for example, a light source having the narrower spectral bandwidth required for the exposure apparatus can be obtained. Particularly, the fact that the light source having the narrower spectral bandwidth can be used in the exposure apparatus including a projection optical system having a large numerical aperture is advantageous, for example, in design and manufacture of the projection optical system.

By the way, as mentioned above, when 1.51 to 1.59 µm is used as the output wavelength of the fiber optical amplifier having the double clad structure, it is preferable that not only erbium but also ytterbium are doped in order to enhance the exciting efficiency of the semiconductor laser. That is to say, when both erbium and ytterbium are doped, strong absorbing wavelength of the ytterbium is extended in the vicinity of 915 to 975 nm, so that a plurality of semiconductor lasers having various different oscillating wavelengths at this area are coupled by the WDMs and are coupled to the first clads, with the result that, since the outputs of the plural semiconductor lasers can be used as exciting lights, great pumping power can be achieved. Further, for example, when polarization coupling elements are used as the light coupling elements 44 in FIG. 4, since semiconductor laser outputs light having different polarization directions can be coupled together, the pumping power can be increased twice.

Further, in design of the doped fibers of the fiber optical amplifier, as is in the present invention, in an apparatus (for example, exposure apparatus) operated with predetermined given wavelength, material is selected so that gain of the fiber optical amplifier at a desired wavelength becomes great. For example, in an ultraviolet laser apparatus for obtaining an output wavelength (193 to 194 nm) same as that of the ArF excimer laser, when the fibers of the optical amplifier are used, it is desirable that material in which the gain becomes great at the desired wavelength (for example, 1.548 µm) is selected.

However, in the communication fiber, because of wavelength division multiplexing communication, it is designed so that relatively flat gain is obtained in a wavelength area having several tens of nm in the vicinity of 1.55 µm. To this end, in a communication fiber having an only erbium doped core as exciting medium, in order to obtain the flat gain property, aluminum and phosphorus are co-doped in a silica fiber. Thus, in such a fiber, the gain does not necessarily become great at 1.548 µm. This condition is shown in FIG. 6.

Figure 6:
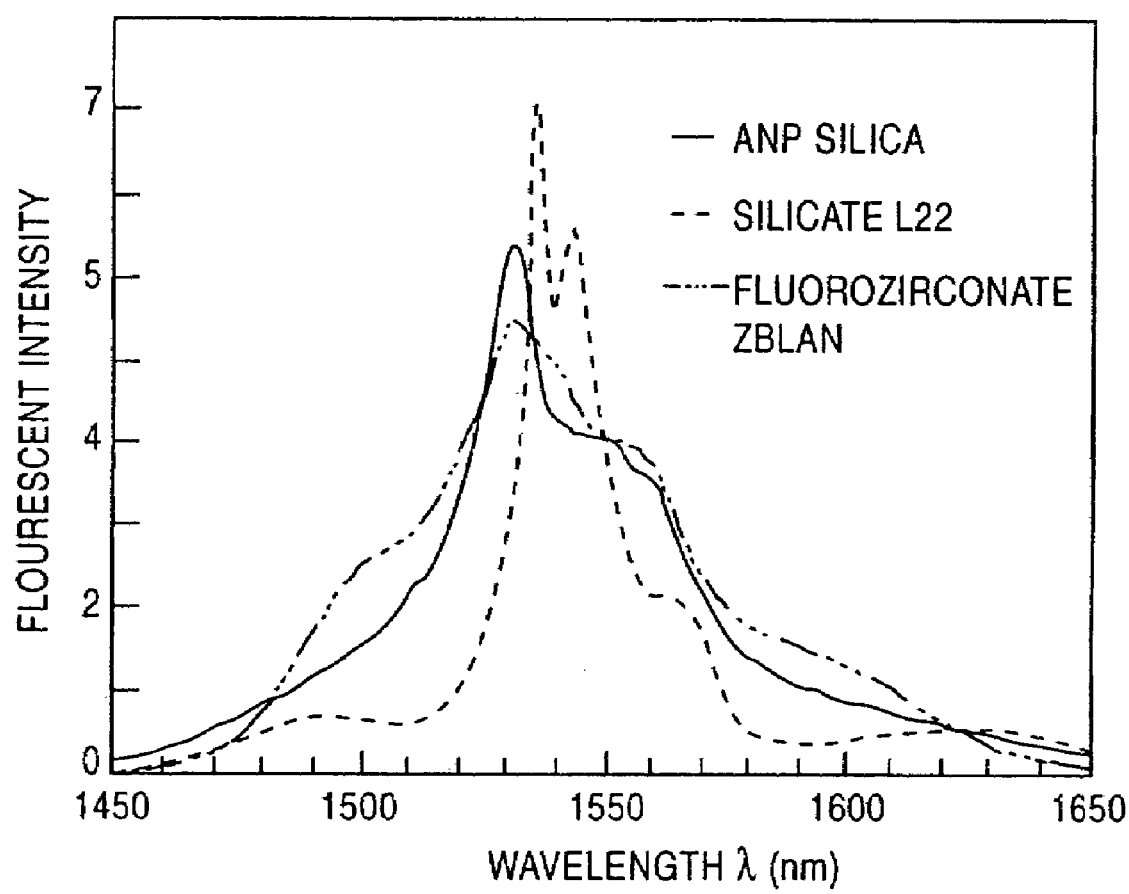
FIG. 6 is a graph showing a relationship between a wavelength and gain regarding elements doped in an erbium doped fiber optical amplifier.

FIG. 6 shows a change in fluorescent intensity property of fiber, and the abscissa indicates wavelength and the ordinate indicates fluorescent intensity. In FIG. 6, while Al/P Silica corresponds to the communication fiber material, when Silicate L22 shown in FIG. 6 is used, greater gain can be obtained at 1.547 µm, Further, aluminum as doping element gives an effect for shifting a peak in the vicinity of 1.55 µm toward a longer wavelength side and phosphorus gives an effect for shifting the peak toward a shorter wavelength side. Accordingly, in order to increase the gain in the vicinity of 1.547 µm, a small amount of phosphorus may be doped in Silicate L22.

Figure 7:
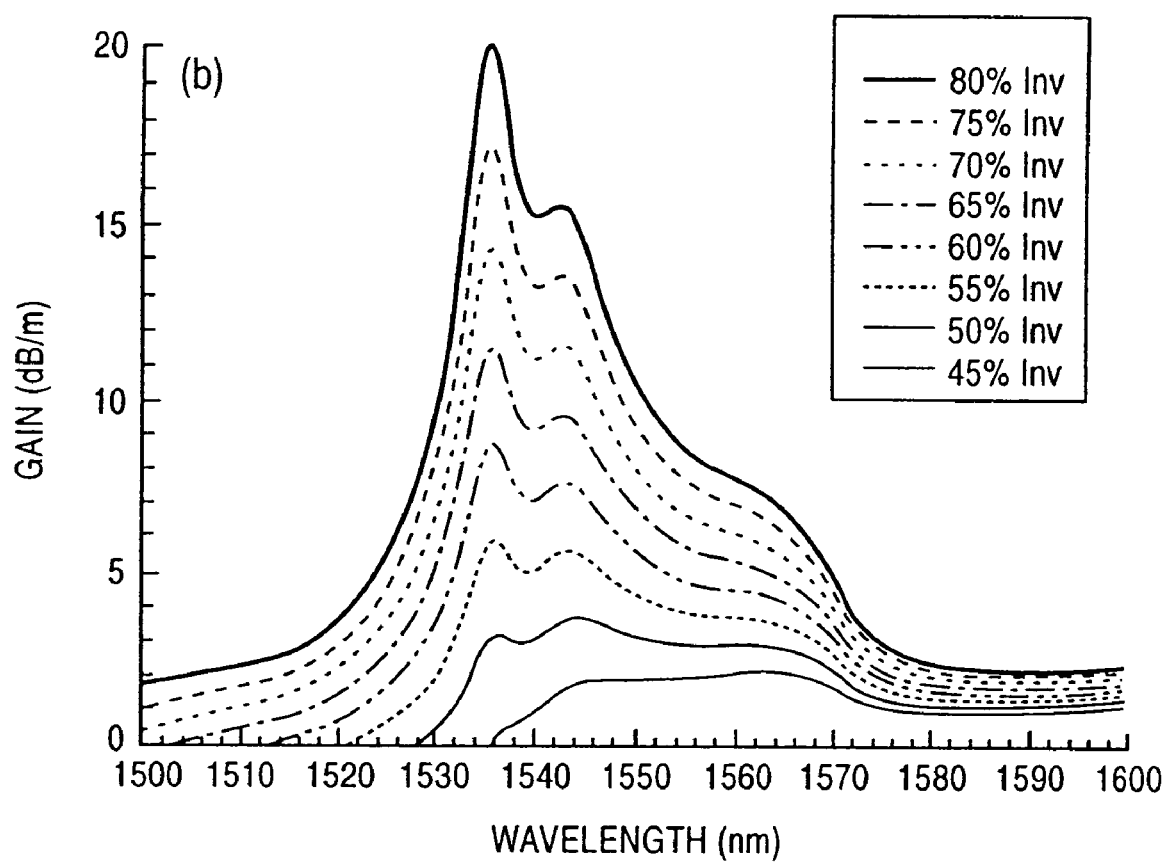
FIG. 7 is a graph showing change in gain with respect to pumping power in a fiber optical amplifier in which erbium and ytterbium are co-doped.

On the other hand, for example, when the fibers of the optical amplifier (for example, above-mentioned fibers of double clad type) having cores in which both erbium and ytterbium are doped (co-doped) are used, as shown in FIG. 7. by adding a small amount of phosphorus to the cores, higher gain can be obtained in the vicinity of 1.547 µm. Further, FIG. 7 shows a change in gain with respect to wavelength when inversion population is changed by changing pumping power: and the abscissa indicates wavelength and the ordinate indicates gain per unit length.

Figure 8:
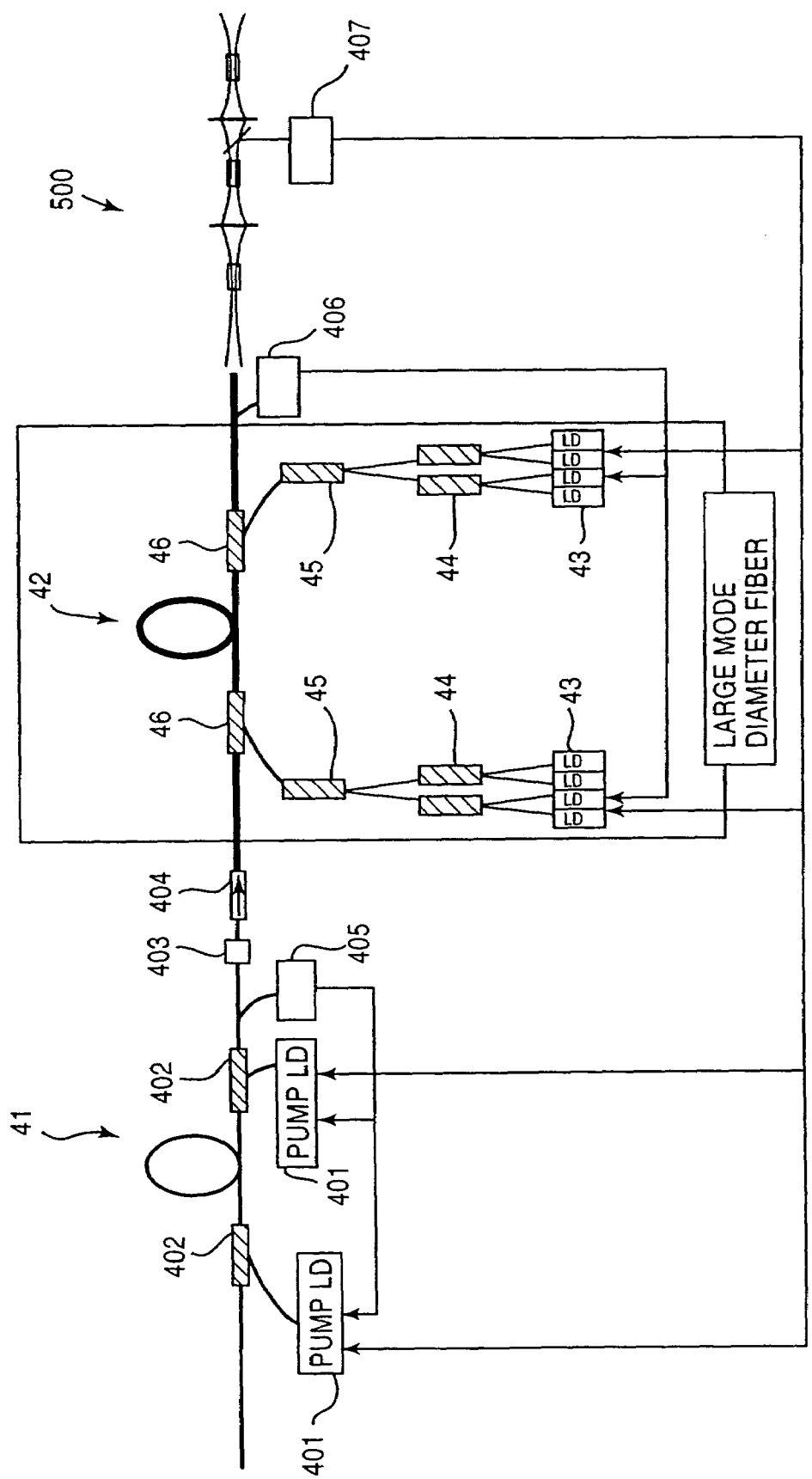
FIG. 8 is a constructional view showing an arrangement of a fiber output control device of the ultraviolet laser apparatus according to the present invention.

In the fiber optical amplifiers according to the first and second embodiments, since the respective fibers are independent optical amplifiers, the difference in gains of the optical amplifiers causes fluctuation in light outputs of the channels. Accordingly, in the laser apparatuses according to such embodiments, for example, as shown in FIG. 8, it is desirable that there are provided fiber output control devices 405, 406 for effecting feedback control of drive currents for the pumping semiconductor lasers (401, 43) so that light outputs from the fiber optical amplifiers becomes constant (i.e., balanced) at each of amplifying stages by branching the outputs partially in the fiber optical amplifiers (41, 42) of respective channels and by monitoring light intensity. In FIG. 8, the fiber output control device 405 for detecting the branched light from the fiber optical amplifier 41 serves to control the drive current for the semiconductor laser 401 connected to the fiber optical amplifier 41 on the basis of a detected result, and the fiber output control device 406 for detecting the branched light from the large mode diameter fiber optical amplifier 42 serves to control the drive current for the semiconductor laser 43 connected to the large mode diameter fiber optical amplifier 42 on the basis of a detected result.

Further, as shown in Fig. B, it is preferable that there is also provided a fiber output control device 407 for effecting feedback control of drive currents for the pumping semiconductor lasers 401, 43 as the entire fiber optical amplifiers (41, 42) by monitoring light intensity at the wavelength converting portion 500 so that the light output from the wavelength converting portion 500 becomes predetermined light output. In FIG. 8, while an example that the semiconductor lasers 401, 43 are independently controlled by the fiber output control device 407 was illustrated, only one of the semiconductor lasers 401, 43 may be controlled on the basis of the light intensity detected in the wavelength converting portion 500. Further, while an example that the fiber output control device 407 branches the laser light on the way of the wavelength converting portion 500 and detects the intensity thereof was explained, the laser light outputted from the output end of the wavelength converting portion 500 may be partially branched and intensity thereof may be detected. Further, in FIG. 8, the other constructional elements the same as those in FIG. 4 are designated by the same reference numerals and explanation thereof will be omitted.

With the arrangement as mentioned above, since the gain of the fiber optical amplifiers of the respective channels at the amplifying stages are made constant, eccentric load are not generated between the fiber optical amplifiers and even or uniform light intensity as a whole can be obtained. Further, by monitoring the light intensity in the wavelength converting portion 500, expected predetermined light intensity can be fed back to the amplifying stages, thereby capable of obtaining desired ultraviolet light stably.

Although not shown in FIG. 8, at least one of the fiber output control devices 405, 406, 407 is connected to the single wavelength oscillating laser (11 or 21) and the light modulating element (12 or 22) to effect temperature control and current control of the single wavelength oscillating laser and to apply drive voltage pulse to the light modulating element and to control timing and magnitude of the voltage pulse. Accordingly, at least one fiber output control device serves to detect intensity, center wavelength and spectral bandwidth of the pulse light (fundamental wave, or visible light wavelength-converted at least once in the wavelength converting portion or infrared light or ultraviolet light) and to effect feedback control of the temperature of the single wavelength oscillating laser, thereby controlling the center wavelength and spectral bandwidth thereof. Further, on the basis of the detected values, the current control of the single wavelength oscillating laser and the control of the voltage pulse applied to the light modulating element are effected, thereby controlling intensity and oscillating interval of the pulse light and start and stop of the oscillation. Further, at least one fiber output control device serves to effect control regarding switching between pulse oscillation and continuous oscillation of the single wavelength oscillating laser and control of oscillation interval and spectral bandwidth in the pulse oscillation and to effect at least one of the oscillation control of the single wavelength oscillating laser and the control of the light modulating element to compensate fluctuation in output of the pulse light. Further, in FIG. 8, while the use of the large mode diameter fiber optical amplifier is under assumption, the current control of the pumping semiconductor laser (401 and the like) connected to the fiber optical amplifier explained herein and the control of the single wavelength oscillating laser and the light modulating element can be applied, as it is, to the ultraviolet laser apparatuses (FIGS. 1 and 2) in which the large mode diameter fiber optical amplifiers are not used.

The output ends of the last stage fiber optical amplifiers 19, 25 according to the first and second embodiments are bundled to form predetermined bundles (114, 29). The number and configuration of the bundles are determined in accordance with the construction of the wavelength converting portion and the configuration of the required light source. For example, in the illustrated embodiments, a single bundle (114, 29, 501, 601 and the like) having a circular cross-section is shown. In this case, since a clad diameter of each fiber is about 125 μm, a diameter (at the output end) of the bundle comprised of 128 fibers bundled together becomes about 2 mm or less. Although the bundle can be formed by using the output end of the last stage EDFA or YDFA as it is, non-doped fibers may be connected to the last stage EDFA or YDFA and the bundle may be formed at output ends of the fibers.

Further, as shown in FIG. 9, at an output end 423 of each last stage fiber 422 of the optical amplifier, it is preferable that a diameter of a core 421 in the fiber 422 is gradually infrared toward the output end in a tapered fashion so that power density (light intensity per unit area) of light at the output end face 423 is reduced. In this case, the configuration of the taper is set so that expansion of the core diameter is increased sufficiently gently toward the output end face 423 and so that a propagation lateral mode in the fiber is maintained while suppressing excitation of other lateral mode to a negligible value (for example, several mrad) when the amplified laser light is being propagated through the tapered portion.

By setting so, the power density of light at the output end face 423 can be reduced, thereby greatly suppressing damage of the fiber output end due to the laser light (which is most severe problem regarding the fiber damage). Regarding this effect, the greater the power density of the laser light emitted from the output end of the fiber optical amplifier (for example, the higher light intensity or the smaller the diameter of the core for the same power, or the smaller the number of channels for dividing the whole power) becomes, the greater such effects become.

Further, as shown in FIG. 10(a), it is preferable that a window member 433 having a proper thickness which permits transmission of the laser light is closely contacted with an output end face 434 of a last stage fiber 432, either in addition to the above-mentioned expansion of the core diameter or independently, in dependence upon the power density. However, in FIG. 10(a), the power density is reduced only by the window member 433 without expanding the diameter of the core 431. As is in the first and second embodiments, when a plurality of fiber outputs are used, other than the method shown in FIG. 10(a) in which the window member is provided on the output end of each fiber, as another embodiment shown in FIG. 10(b), a common window member 443 may be provided for each output group of plural fiber optical amplifiers 442. However, in FIG. 10(b), although diameters of cores 441 in the fibers are not expanded, the diameters of the cores may also be expanded. Further, the number of the fiber optical amplifiers common to the single window member 443 may be changed. For example, such a number may be the total number of the last stage fiber optical amplifiers 19 or 25 shown in FIG. 1 or FIG. 2, i.e., 128. Further, the material for the window member (433 or 443) is selected appropriately (for example, optical glass such as BK7 or quartz) in consideration of transmittance at a spectral bandwidth of the fundamental wave laser light and close contacting ability with the fiber(s), and the close contact of the fiber(s) with the window member is achieved by means of optical contact or fusion contact.

With the arrangement as mentioned above, since the power density of the laser light emitted from the window member becomes smaller than the power density in the fiber core 431 or 441, the damage of the output end of the fiber due to the laser light can be suppressed. By combining the provision of the window member with the expansion of the diameter of the core, the damage of the output ends of the fibers which was serious problem in the conventional techniques can be prevented.

Further, in the aforementioned embodiments (FIGS. 1, 2, 4 and 8), examples, that the isolators 110, 111, 112, 26, 27, 404 and the like are inserted in the connecting portions in order to avoid the influence of the return light and the narrow band filters 113, 28, 403 are inserted in order to obtain the good EDFA amplifying property, were explained. However, the locations where the isolators or the narrow band filters are located and the number of the isolators and/or the filters are not limited to those in the aforementioned embodiments, but, for example, the number and locations may be appropriately determined in accordance with the degree of accuracies required by various apparatuses (for example, exposure apparatus) to which the present invention is applied. At least one of the isolators and the narrow band filters may not be provided at all. Further, the narrow band filter may have high transmittance regarding only desired single wavelength, and a transmissible spectral bandwidth of the filter may be 1 pm or less. By using the narrow band filter or filters in this way, noise due to amplified spontaneous emission (ASE) generated in the fiber optical amplifier can be reduced, and reduction in amplification degree of the output of the fundamental wave due to ASE from the front stage fiber optical amplifier can be suppressed.

Further, in the aforementioned embodiments, feedback control of the intensity of the pulse light in which the fiber amplifier output or intensity of the pulse light picked up by the light modulating element 12 or 22 is monitored and magnitude of drive voltage pulse or offset DC voltage applied to the light modulating element is adjusted so that the intensity of each pulse becomes equal. Further, feedback control of the oscillating timing of the laser at the output end of the fiber bundle may be effected by detecting the laser beams generated from the plural fiber optical amplifiers 19 or 25 and by monitoring the delay time of the laser beam in each channel and the oscillating interval of the laser beams between the channels and by either controlling the timing of the drive voltage pulse applied to the light modulating element or controlling the TDM 23 in FIG. 2 so that the delay time and the oscillating interval become predetermined values, respectively. Further, feedback control of the wavelength of the ultraviolet light may be effected by detecting the wavelength of the ultraviolet light generated from the wavelength converting portion 500 and by adjusting the temperature of the single wavelength oscillating laser 11 or 21 on the basis of the detected result.

Further, so-called feedforward control may be effected in such a manner that fluctuation in intensity of the pulse light picked up by the light modulating element 12 or 22 is detected and in which the gain of at least one stage of the multi-stage fiber optical amplifiers (13, 18, 19 or 24, 25) located at stages behind the light modulating element so as to compensate such output fluctuation. Further, feedforward control may be effected in such a manner that output (light intensity) of the channel having short delay time (i.e., channel from which the pulse light is emitted at early timing) is detected among the channels 0 to 127 and the gain of the fiber optical amplifier (or TDM 23) is controlled on the basis of the detection result so that outputs of the channels having delay time longer than that of the aforementioned channel (i.e., channels from which pulse light are emitted at late timing) are forward-controlled. Further, particularly in the first embodiment shown in FIG. 1, in place of the fact that the output of each channel is controlled, the output of each block unit having 32 channels may be controlled. For example, the output of at least one channel in the first block may be detected and the outputs of the channels in the second block may be controlled on the basis of the detection result.

Next, an ultraviolet laser apparatus according to a third embodiment of the present invention will be explained with reference to FIG. 3. The ultraviolet laser apparatus according to the third embodiment comprises a laser generating portion including a single wavelength oscillating laser 31 and adapted to generate a laser beam having a single wavelength, an optical amplifier comprised of fiber optical amplifiers 33, 34 and adapted to amplify incident light, and a wavelength converting portion (not shown) for wavelength-converting amplified light, thereby providing an ultraviolet light generating apparatus capable of generating output wavelength the same as output wavelength (193 nm) of an ArF excimer laser or output wavelength (157 nm) of an $F_2$ laser.

Figure 3:
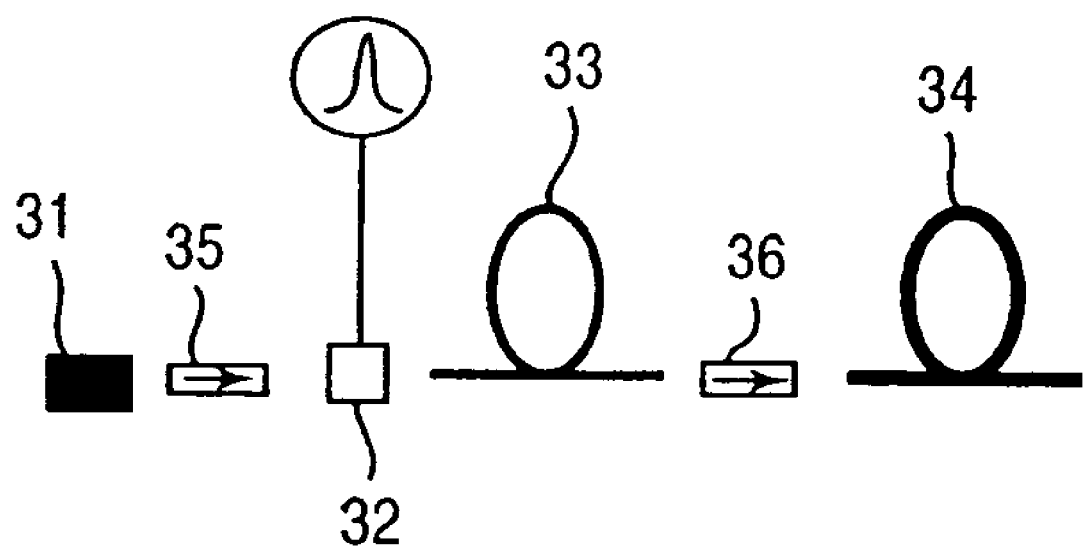
FIG. 3 is an explanatory view showing an arrangement of a laser light generating portion and an optical amplifier of an ultraviolet laser apparatus according to a third embodiment of the present invention.

In the embodiment sown in FIG. 3, the laser generating apparatus includes the single wavelength oscillating laser 31 for generating the laser beam having a single wavelength, and light output of the single wavelength oscillating laser 31 is amplified by fiber optical amplifiers 33, 34. Output (amplified light) of the fiber optical amplifier 34 is incident on a wavelength converting portion (602 to 611) for example shown in FIG. 13. Further, an output end of the fiber optical amplifier 34 corresponds to fiber bundle output ends 501 and 601 shown in FIGS. 11 and 13. The wavelength converting portion includes a set of non-linear optical crystals 602, 604, 609, 611 so that the fundamental wave emitted from the fiber optical amplifier (31 to 36) is converted into ultraviolet light. The wavelength converting portion according to the present invention will be fully described later with reference to fourth to seventh embodiments.

Now, the third embodiment will be fully explained. As the single wavelength oscillating laser 31 (FIG. 3) for generating the laser beam having a single wavelength, for example, InGaAsP, DFB semiconductor laser having an oscillating wavelength of 1.544 μm and CW output of 30 mW is used. In this laser, since single longitudinal mode oscillation is effected fundamentally, an oscillation spectrum line width can be suppressed below 0.01 pm.

The light output (continuous light) of the semiconductor laser 31 is converted into pulse light, for example, by using a light modulating element 32 such as an electro-optical light modulating element or an acousto-optical light modulating element. In the illustrated embodiment, as an example, a case where the output is modulated to pulse light having pulse width of 1 ns and repetition frequency of 100 kHz will be explained. As a result of such light modulation, peak power of the pulse light outputted from the light modulating element 32 becomes 30 mW and average output becomes 3 μW.

Similar to the first and second embodiments, pulsated output light is amplified by a fiber optical amplifier including single stage or multi-stage EDFA (erbium doped fiber optical amplifiers). In the illustrated embodiment, as an example, an example that amplification of 58 dB (667,000 times) in total is effected by two-stage fiber optical amplifiers 33, 34 is shown. In this case, at the output end of the fiber optical amplifier 34, the output light having average output of 2 W can be obtained. Although such an output end can be formed by using the output end of the fiber optical amplifier 34 as it is, a non-doped fiber can be coupled to the last stage fiber optical amplifier 34. Further, in the illustrated embodiment, in order to avoid the influence of the return light, isolators 35, 36 are appropriately inserted in various connecting portions.

The single wavelength pulse laser light having wavelength of 1.544 μm (output of the optical amplifier) is converted into ultraviolet light pulse output light having narrow spectrum line width by the wavelength converting portion (described later) using the non-linear optical crystals. Further, in the optical amplifiers (31 to 36) according to the illustrated embodiment, while the out put end is constituted by the single fiber optical amplifier 34, for example, a plurality of fiber optical amplifiers (33, 34) may be prepared, together with the splitter (16) of flat plate waveguide type used in the first embodiment (FIG. 1) or the TDM (23) used in the second embodiment, and the fiber optical amplifiers 34 may be bundled to form a fiber bundle. In this case, it is preferable that the oscillating interval between the pulse lights emitted from the plural optical amplifiers can be adjusted by adjusting the timing of the drive voltage pulses applied to the light modulating elements 32 associated with the plural optical amplifiers (for, example, the light emitting timings of the respective optical amplifiers are deviated from each other so that the pulse lights are emitted successively with equidistant interval). Further, also in this embodiment, the above-mentioned alteration of the first and second embodiments can be applied. For example, the single wavelength oscillating laser 31 may be pulse-oscillated, and the oscillating interval (pulse period) between the pulse lights may be altered by effecting only the current control of the single wavelength oscillating laser 31 or by effecting both such a current control and the control of the light modulating element 32.

Next, embodiments of the wavelength converting portion used in the first to third embodiments will be described. FIGS. 11(a) to 11(d) show fourth to seventh embodiments of the wavelength converting portion according to the present invention. In these embodiments, the fundamental wave having a wavelength of 1.544 nm emitted from an output end 501 of the fiber bundle (which corresponds to the output end 114 in the first embodiment and the output end 29 in the second embodiment; but, which may be the output end of the single fiber (34) in the third embodiment) is wavelength-converted into 8th harmonic wave (harmonic wave) by using the non-linear optical crystals, thereby generating ultraviolet light having a wavelength the same as the wavelength (193 nm) of the ArF excimer laser.

In FIG. 11(a), the fundamental wave having the wavelength of 1.544 nm (frequency of ω) emitted from the output end 501 of the fiber bundle passes through non-linear optical crystals 502, 503, 504 (from left to right in FIG. 11(a)) and is outputted. When the fundamental wave is passed through the non-linear optical crystal 502, 2nd harmonic wave having frequency of 2ω (wavelength of 772 nm which is ½ of the wavelength of the fundamental wave) which is twice of the frequency ω of the fundamental wave is generated by second harmonic wave generation. The generated 2nd harmonic wave advances to the right and enters the next non-linear optical crystal 503. Where, the second harmonic wave generation is affected again, with the result that 4th harmonic wave having frequency of 4ω (wavelength of 386 nm which is ¼ of the wavelength of the fundamental wave) which is twice of the frequency 2ω of the incident wave, i.e., four times of the frequency ω of the fundamental wave is generated. The generated 4th harmonic wave further advances to the right non-linear optical crystal 504, where, the second harmonic wave generation is effected again, with the result that 8th harmonic wave having frequency of 8ω (wavelength of 193 nm which is ⅛ of the wavelength of the fundamental wave) which is twice of the frequency 4ω of the incident wave, i.e., eight times of the frequency ω of the fundamental wave is generated.

Regarding the nonlinear optical crystals, for example, $LiB_3O_5$ (LBO) crystal is used as the converting crystal 502 from the fundamental wave to 2nd harmonic wave, $LiB_3O_5$ (LBO) crystal is used as the converting crystal 503 from 2nd harmonic wave to 4th harmonic wave, and $Sr_2B_2B_2O_7$ (SBBO) is used as the converting crystal 504 from 4th harmonic wave to 8th harmonic wave. Here, in the conversion from the fundamental wave to 2nd harmonic wave using the LBO crystal, a method for adjusting a temperature of the LBO crystal to achieve phase matching for wavelength conversion (non-critical phase matching; NCPM) is used. In NCPM, since there is no angular deviation (Walk-off) between the fundamental wave and the second harmonic wave in the non-linear optical crystal, the conversion to 2nd harmonic wave can be effected with high efficiency, and, since the generated 2nd harmonic wave is not influenced by a beam due to the Walk-off, it is advantageous.

FIG. 11(b) shows an embodiment in which the fundamental wave (having the wavelength of 1.544 μm) is wavelength-converted to 8th harmonic wave (having a wavelength of 193 nm) through 2nd harmonic wave (having a wavelength of 772 nm), 3rd harmonic wave (having a wavelength of 515 nm) and 6th harmonic wave (having a wavelength of 257 nm) successively.

In a first stage 507 of a wavelength converting portion, LBO crystal is used for conversion from the fundamental wave to 2nd harmonic wave by second harmonic wave generation in NCPM. In the wavelength converting portion (LBO crystal) 507, a part of the fundamental wave is passed without wavelength conversion, and the fundamental wave is wavelength-converted to generate 2nd harmonic wave, and half-wavelength retardation and one-wavelength retardation are given to the fundamental wave and 2nd harmonic wave, respectively by a wavelength plate (for example, a ½ wavelength plate), and only polarization of the fundamental wave is rotated by 90 degrees. The fundamental wave and 2nd harmonic wave are incident on a second stage wavelength converting portion 510 through a lens 509.

In the second stage wavelength converting portion 510, from the 2nd harmonic wave generated in the first stage wavelength converting portion 507 and the fundamental wave permeated without conversion, 3rd harmonic wave (having a wavelength of 515 μm) is obtained by sum frequency generation. LBO crystal is used as the wavelength converting crystal, but it is used in NCPM having a temperature different from that in the first stage wavelength converting portion (LBO crystal) 507. The 3rd harmonic wave obtained in the wavelength converting portion 510 and the 2nd harmonic wave transmitted or passed without conversion are separated by a dichroic mirror 511, and the 3rd harmonic wave reflected by the dichroic mirror 511 is incident on a third stage wavelength converting portion 514 through a lens 513. The wavelength converting portion 514 includes a $\beta$-$BaB_2O_4$ (BBO) crystal, where the 3rd harmonic wave is converted into 6th harmonic wave (having a wavelength of 257 nm) by 2nd harmonic wave generation.

The 6th harmonic wave obtained in the wavelength converting portion 514 and the 2nd harmonic wave transmitted through the dichroic mirror 511 and passed through a lens 512 are combined or composed coaxially by a dichroic mirror 516 and are incident on a fourth stage wavelength converting portion 517. The wavelength converting portion 517 includes BBO crystal, where, from the 6th harmonic wave and the 2nd harmonic wave, 8th harmonic wave (having a wavelength of 193 nm) is obtained by sum frequency generation. In the arrangement shown in FIG. 11(b), as the wavelength converting crystal in the fourth stage wavelength converting portion 517, in place of BBO crystal, $CsLiB_6O_{10}$ (CLBO) crystal may be used.

Further, in the illustrated embodiment, the 3rd harmonic wave and the 2nd harmonic wave obtained in the second stage converting portion 510 are divided by the dichroic mirror 511 and the 6th harmonic wave obtained in the third stage wavelength converting portion 514 and the 2nd harmonic wave obtained in the second stage wavelength converting portion 510 are combined by the dichroic mirror 516 to be inputted to the fourth stage wavelength converting portion 571. Here, the property of the dichroic mirror 511 may be reversed. Namely, the 3rd harmonic wave may be transmitted and the 2nd harmonic wave may be reflected and the third stage wavelength converting portion 514 may be arranged on the same optical axis as that of the second stage wavelength converting portion 510. In this case, it is required that the property of the dichroic mirror 516 be also reversed. In such an arrangement in which one of the 6th harmonic wave and 2nd harmonic wave is incident on the fourth stage wavelength converting portion 517 through the branching light path, collective lenses 515, 512 for inputting the 6th harmonic wave and 2nd harmonic wave to the fourth stage wavelength converting portion 517 can be arranged in the different light paths.

Since the cross-sectional configuration of the 6th harmonic wave generated in the third stage wavelength converting portion 514 is elliptical due to Walk-off phenomenon, it is desirable that beam shaping of the 6th harmonic wave is effected in order to obtain the good conversion efficiency in the fourth stage wavelength converting portion 517. Thus, as is in the illustrated embodiment, by arranging the collective lenses 515, 512 in the different light paths, for example, a pair of cylindrical lenses can be used as the lens 515, thereby easily affecting the beam shaping of the 6th harmonic wave. Therefore, good overlapping with the 2nd harmonic wave in the fourth stage wavelength converting portion (BBO crystal) 517 can be achieved, thereby capable of enhancing the conversion efficiency.

Further, the arrangement between the second stage wavelength converting portion 510 and the fourth stage wavelength converting portion 517 is not limited to that shown in FIG. 11(b), but, any arrangement can be used so long as the length of the light path of the 6th harmonic wave is the same as that of the 2nd harmonic wave so that the 6th harmonic wave and 2nd harmonic wave are simultaneously incident on the fourth stage wavelength converting portion 517. Further, for example, the third and fourth stage wavelength converting portions 514, 517 may be arranged on the same optical axis as that of the second stage wavelength converting portion 510 so that only the 3rd harmonic wave is converted into the 6th harmonic wave by second harmonic wave generation in the third stage wavelength converting portion 514 and the 6th harmonic wave is incident on the fourth stage wavelength converting portion 517 together with the 2nd harmonic wave which was not wavelength-converted. In this case, the dichroic mirrors 511, 516 can be omitted.

FIG. 11(c) shows an embodiment in which the fundamental wave (having the wavelength of 1.544 μm) is wavelength-converted to 8th harmonic wave (having a wavelength of 193 nm) through 2nd harmonic wave (having a wavelength of 772 nm), 4th harmonic wave (having a wavelength of 386 nm) and 6th harmonic wave (having a wavelength of 257 nm) successively.

In a first stage 518 of a wavelength converting portion, LBO crystal is used as the wavelength converting crystal for converting the fundamental wave to 2nd harmonic wave in NCPM. The 2nd harmonic wave generated in the first stage wavelength converting portion 518 is incident on a second stage wavelength converting portion 520 through a collective lens 519. In the second stage wavelength converting portion 520, LBO crystal is used as the wavelength converting crystal so that, from the 2nd harmonic wave generated in the first stage wavelength converting portion 518. 4th harmonic wave (having a wavelength of 386 nm) is obtained by second harmonic wave generation. The 4th harmonic wave obtained in the wavelength converting portion 520 and the 2nd harmonic wave transmitted through the wavelength converting portion 520 without conversion are separated or divided by a dichroic mirror 521, and the 4th harmonic wave reflected by the dichroic mirror reaches a dichroic mirror 525 through a collective lens 524. On the other hand, a polarization direction of the 2nd harmonic wave passed through the dichroic mirror 521 is rotated by 90 degrees by a half-wavelength plate 522, and the 2nd harmonic wave reaches the dichroic mirror 525 through a collective lens 523, where the 2nd harmonic wave is coaxially combined with the 4th harmonic wave passed through the branched path, and the combined wave is incident on a third stage wavelength converting portion 526.

In the third stage wavelength converting portion 526, BBO crystal is used as the wavelength converting crystal so that, from the 4th harmonic wave generated in the second stage wavelength converting portion 520 and the 2nd harmonic wave transmitted through the wavelength converting portion 520 without wavelength conversion, 6th harmonic wave (having a wavelength of 257 nm) is obtained by sum frequency generation. The 6th harmonic wave obtained in the wavelength converting portion 526 and the 2nd harmonic wave transmitted through the wavelength converting portion 520 without wavelength conversion are separated by a dichroic mirror 527, and a polarization direction of the 2nd harmonic wave reflected here is rotated by 90 degrees by a half-wavelength plate 528, and the 2nd harmonic wave reaches a dichroic mirror 531 through a collective lens 529. On the other hand, the 6th harmonic wave passed through the dichroic mirror 527 reaches the dichroic mirror 531 through a collective lens 530, where the 6th harmonic wave is coaxially combined with the 2nd harmonic wave passed through the branched path, and the combined waves are incident on a fourth stage wavelength converting portion 532.

In the fourth stage wavelength converting portion 532. BBO crystal is used as the wavelength converting crystal so that, from the 6th harmonic wave generated in the third stage wavelength converting portion 526 and the 2nd harmonic wave transmitted through the wavelength converting portion 526 without wavelength conversion, 8th harmonic wave (having a wavelength of 193 nm) is obtained by sum frequency generation. With the above arrangement, as the wavelength converting crystal in the fourth stage wavelength converting portion 532, in place of the BBO crystal, CLBO crystal may be used.

Further, in the illustrated embodiment, while an example that the dichroic mirror (521 or 527) is disposed behind the second and third wavelength converting portions 520, 526, respectively so that the pair of harmonic waves (2nd harmonic wave and 4th harmonic wave, or 2nd harmonic wave and 6th harmonic wave) outputted from such wavelength converting portion (520 or 526) are incident on the next stage wavelength converting portion (526 or 532) through the different light paths was explained. However, similar to the explanation in connection with FIG. 11(b), the third stage wavelength converting portion 526 may be arranged on the same optical axis as those of the other wavelength converting portions 518, 520, 532, so that the dichroic mirrors 521, 525, 527, 531 can be omitted.

By the way, in the illustrated embodiment, the 4th harmonic wave and 6th harmonic wave generated in the second and third wavelength converting portions 520, 526 have elliptical cross-sectional configurations due to Walk-off phenomenon. Thus, it is desirable that beam shaping of the 4th harmonic wave and 6th harmonic wave (incident beams) is effected to achieve good overlapping with the 2nd harmonic wave in order to obtain the good conversion efficiency in the third and fourth stage wavelength converting portions 526, 532 into which the beams are inputted. As is in the illustrated embodiment, by arranging the collective lenses 523, 524 and 529, 530 in the different light paths, for example, pairs of cylindrical lenses can be used as the lenses 524, 530, thereby easily effecting the beam shaping of the 4th harmonic wave and 6th harmonic wave. Therefore, good overlapping with the 2nd harmonic wave in the third and fourth stage wavelength converting portions 526, 532 can be achieved to thereby enhance the conversion efficiency.

Further, the arrangement between two stage wavelength converting portions 520 and 526 is not limited to that shown in FIG. 11(c), but, any arrangement can be used so long as the length of the light path of the 2nd harmonic wave is the same as that of the 4th harmonic wave so that the 2nd harmonic wave and 4th harmonic wave are simultaneously incident on the third stage wavelength converting portion 526. The same is true regarding the arrangement between the third stage wavelength converting portion 526 and the fourth stage wavelength converting portion 532.

FIG. 11(d) shows an embodiment in which the fundamental wave (having the wavelength of 1.544 µm) is wavelength-converted to 8th harmonic wave (having a wavelength of 193 nm) through 2nd harmonic wave (having a wavelength of 772 nm), 3rd harmonic wave (having a wavelength of 515 nm), 4th harmonic wave (having a wavelength of 386 nm) and 7th harmonic wave (having a wavelength of 221 nm) successively.

In a first stage 533 of a wavelength converting portion, LBO crystal is used as the wavelength converting crystal for converting the fundamental wave to 2nd harmonic wave in NCPM. The fundamental wave transmitted through the wavelength converting portion 533 without wavelength conversion and the 2nd harmonic wave generated by the wavelength conversion are delayed by a half-wave and one-wave, respectively, by means of a wavelength plate 534, and a polarization direction of only the fundamental wave is rotated by 90 degrees. In a second stage wavelength converting portion 536, LBO crystal is used as the wavelength converting crystal, but it is used in NCPM having a temperature different from that in the first stage wavelength converting portion (LBO crystal) 533. In this wavelength converting portion 536, from the 2nd harmonic wave generated in the first stage wavelength converting portion 533 and the fundamental wave transmitted through the wavelength converting portion 533 without wavelength conversion, 3rd harmonic wave (having a wavelength of 515 nm) is obtained by sum frequency generation.

The 3rd harmonic wave obtained in the wavelength converting portion 536, and the fundamental wave and 2nd harmonic wave transmitted through the wavelength converting portion 536 without wavelength conversion are divided or separated by a dichroic mirror 537, and the 3rd harmonic wave reflected here is incident on a fourth stage wavelength converting portion 545 through a collective lens 540 and a dichroic mirror 543. On the other hand, the fundamental wave and 2nd harmonic wave passed through the dichroic mirror 537 are incident on a third stage wavelength converting portion 539 through a collective lens 538.

In the third stage wavelength converting portion 539, LBO crystal is used as the wavelength converting crystal so that the fundamental wave is transmitted through the LBO crystal without wavelength conversion and the 2nd harmonic wave is converted into 4th harmonic wave (having a wavelength of 386 nm) in the LBO crystal by second harmonic wave generation. The 4th harmonic wave obtained in the wavelength converting portion 539 and the fundamental wave transmitted therethrough are separated by the dichroic mirror 541, and the fundamental wave pasted through the dichroic mirror passes through a collective lens 544 and is reflected by a dichroic mirror 546 and is incident on a fifth stage wavelength converting portion 548. On the other hand, the 4th harmonic wave reflected by the dichroic mirror 541 reaches a dichroic mirror 543 through a collective lens 542, where it is coaxially combined with the 3rd harmonic wave reflected by the dichroic mirror 537, and the combined waves are incident on the fourth stage wavelength converting portion 545.

In the fourth stage wavelength converting portion 545, BBO crystal is used au the wavelength converting crystal so that, from the 3rd harmonic wave and 4th harmonic wave, 7th harmonic wave (having a wavelength of 221 nm) is obtained by sum frequency generation. The 7th harmonic wave obtained in wavelength converting portion 545 passes through a collective lens 547 and is coaxially combined with the fundamental wave (passed through the dichroic mirror 541) by the dichroic mirror 546, and the combined waves are incident on the fifth stage wavelength converting portion 548.

In the fifth stage wavelength converting portion 548, LEO crystal is used as the wavelength converting crystal so that, from the fundamental wave and 7th harmonic wave, 8th harmonic wave (having a wavelength of 193 nm) is obtained by sum frequency generation. In the above arrangement, in place of the BBO crystal 545 for the 7th harmonic wave and the LBO crystal 548 for the 8th harmonic wave, CLBO crystals can be used.

In the illustrated embodiment, since the 3rd harmonic wave and 4th harmonic wave are incident on the fourth stage wavelength converting portion 545 through the different light paths, the lens 540 for collecting the 3rd harmonic wave and the lens 542 for collecting the 4th harmonic wave can be arranged in the different light paths. The 4th harmonic wave generated in the third stage wavelength converting portion 539 has an elliptical cross-sectional configuration due to Walk-off phenomenon. Thus, it is desirable that beam shaping of the 4th harmonic wave is effected in order to obtain good conversion efficiency in the fourth stage wavelength converting portion 545. In the illustrated embodiment, since the collective lenses 540, 542 are disposed in the different light paths, for example, a pair of cylindrical lenses can be used as the lens 542, thereby easily effecting the beam shaping of the 4th harmonic wave. Thus, good overlapping with the 3rd harmonic wave in the fourth stage wavelength converting portion (BBO crystal) 545 can be achieved, thereby enhancing the conversion efficiency.

Further, in the illustrated embodiment, the lens 544 for collecting the fundamental wave incident on the fifth stage wavelength converting portion 548 and the lens 547 for collecting the 7th harmonic wave can be disposed in the different light paths. The 7th harmonic wave generated in the fourth stage wavelength converting portion 545 has an elliptical cross-sectional configuration due to Walk-off phenomenon. Thus, it is desirable that beam shaping of the 7th harmonic wave is effected in order to obtain good conversion efficiency in the fifth stage wavelength converting portion 548. In the illustrated embodiment, since the collective lenses 544, 547 are disposed in the different light paths, for example, a pair of cylindrical lenses can be used as the lens 547, thereby easily effecting the beam shaping of the 7th harmonic wave. Thus, good overlapping with the fundamental wave in the fifth stage wavelength converting portion (LBO crystal) 548 can be achieved, thereby enhancing the conversion efficiency.

Further, the arrangement between the second stage wavelength converting portion 536 and the fourth stage wavelength converting portion 545 is not limited to that shown in FIG. 11(d), but, any arrangement can be used so long as the lengths of two light paths between the wavelength converting portions 536 and 545 Are the same so that the 3rd harmonic wave generated in the wavelength converting portion 536 and reflected by the dichroic mirror 537 and 4th harmonic wave obtained by wavelength-converting (in the wavelength converting portion 539) the 2nd harmonic wave generated in the wavelength converting portion 536 and passed through the dichroic mirror 537 are simultaneously incident on the wavelength converting portion 545. This is also true regarding the arrangement between the third stage wavelength converting portion 539 and the fifth stage wavelength converting portion 548.

FIGS. 12(a) to 12(d) show wavelength conversion efficiency and average output of the obtained 8th harmonic wave (having wavelength of 193 nm) for each channel in each stage obtained from teat results regarding the wavelength converting portions shown in FIGS. 11(a) to 11(d). As explained in the above-mentioned embodiment, the output of the fundamental wave has peak power of 20 kW, pulse width of 1 ns, pulse repeating frequency of 100 kHz and average output of 2 W. As a result, it was found that the average of the 8th harmonic wave (having wavelength of 193 nm) for each channel becomes 229 mW (in the wavelength converting portion shown in FIG. 11(a)), 38.3 mW (in the wavelength converting portion shown in FIG. 11(b)), 40.3 mW (in the wavelength converting portion shown in FIG. 11(c)) and 45.9 mW (in the wavelength converting portion shown in FIG. 11(d)). Accordingly, the average output from the bundle obtained by bundling all 128 channels becomes 29 W (in FIG. 11(a)), 4.9 W (in FIG. 11(b)). 5.2 W (in FIG. 11(c)) and 5.9 W (in FIG. 11(b)), and, thus, in all of the wavelength converting portions, the ultraviolet light (having wavelength of 193 nm) having adequate output for the light source of the exposure apparatus can be provided.

Among these embodiments, the arrangement shown in FIG. 11(a) is most simple and provides highest conversion efficiency. Thus, the ultraviolet light (having wavelength of 193 nm) having adequate output for the light source of the exposure apparatus can be provided even when the number of channels of the fiber optical amplifier is reduced in comparison with the channel number (128 channels) in the first and second embodiments (for example, reduced to ½ to ⅓ and the bundle is formed) or even when output of the fundamental wave lower than the fundamental wave output in the aforementioned embodiment is used.

In the arrangement shown in FIG. 11(d), although the number (five) of the stages of the wavelength converting portion is greatest among the embodiments, the conversion efficiency to the wavelength of 193 nm is substantially the same as those in the embodiments shown in FIGS. 11(b) and 11(c) and the substantially the same ultraviolet light can be obtained. Further, in the arrangements shown in FIGS. 11(b) and 11(c), since the BBO crystal is used for generating the 8-time wave, the 8th harmonic wave is absorbed by the BBO crystal, with the result that the BBO crystal may be damaged. To the contrary, in the arrangement shown in FIG. 11(d), LBO crystal can be used for generating 8th harmonic wave. The LBO crystal can easily available from a market as good quality crystal in which an absorbing coefficient for ultraviolet light having wavelength of 193 nm in very small and which does not arise any light damage problem, and the LBO crystal is advantageous from the view point of its endurance. Further, in the 8th harmonic wave (for example, wavelength of 193 nm) generating portion, although LBO crystals are used under angular phase matching condition, since the phase matching angle is great, the effective non-linear optical constant ($d_{eff}$) becomes small. To this end, it is preferable that a temperature controlling mechanism is provided in association with the LBO crystal and the LBO crystal is used under a high temperature condition. As a result, the phase matching angle can be reduced, namely, the constant ($d_{eff}$) can be increased, thereby improving the 8th harmonic wave generating efficiency.

Further, in the above explanation, while preferred embodiments of the arrangement of the wavelength converting portion in which the 8th harmonic wave is generated from the fundamental wave was explained, the wavelength converting portion according to the present invention is not limited to such embodiments, so long as a wave having a wavelength greater than the wavelength (1.544 µm) of the fundamental wave by eight times is generated, the same effect can be achieved. For example, by wavelength-converting the fundamental wave (having wavelength of 1.544 µm) to 8th harmonic wave (having wavelength of 193 nm) through 2nd harmonic wave (having wavelength of 772 nm), 3rd harmonic wave (having wavelength of 515 nm), 4th harmonic wave (having wavelength of 386 nm), 6th harmonic wave (having wavelength of 257 nm) and 7th harmonic wave (having wavelength of 221 nm), successively, similar effect can be achieved.

In this case, as the non-linear optical crystals used in wavelength conversion, LBO crystal can be used as the converting crystal for converting the fundamental wave into the 2nd harmonic wave, LBO crystal can be used as the converting crystal for converting the 2nd harmonic wave into the 4th harmonic wave, BBO crystal can be used for generating the 6th harmonic wave by sum frequency generation based on the 2nd harmonic wave and 4th harmonic wave, BBO crystal can be used for generating the 7th harmonic wave by sum frequency generation based on the fundamental wave and the 6th harmonic wave, and LBO crystal can be used for generating the 8th harmonic wave by sum frequency generation based on the fundamental wave and the 7th harmonic wave. Also in this case, since the LBO crystal can be used for generating the 8th harmonic wave, any problem regarding the damage of the crystal does not arise, and, thus, usage of the LBO crystal is advantageous.

By arranging the wavelength converting portion as the fourth embodiment, the fundamental wave having the wavelength of 1.544 µm and generated by the fundamental wave generating portion can be wavelength-converted into the ultraviolet light having the wavelength of 193 nm.

Figure 13:
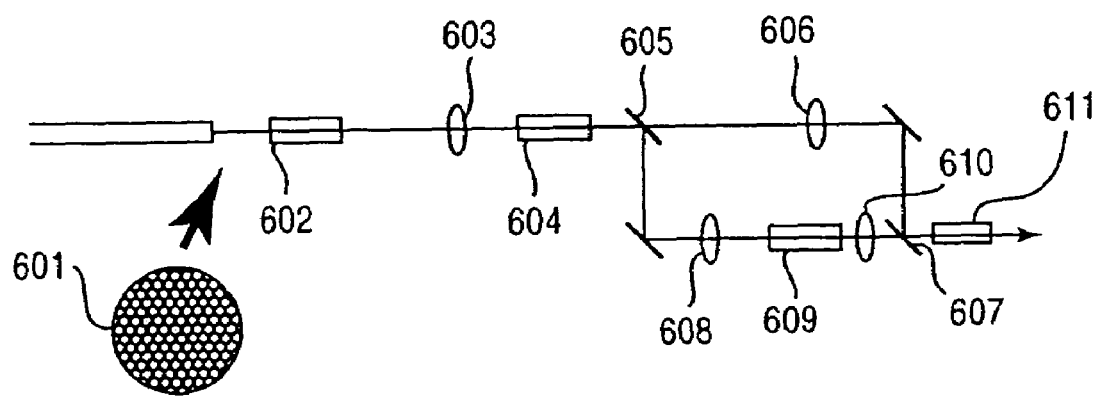
FIG. 13 is an explanatory view showing an arrangement of a wavelength converting portion of an ultraviolet laser apparatus according to a fifth embodiment of the present invention.

Next, a further arrangement of a wavelength converting portion according to the present invention is shown in FIG. 13 as a fifth embodiment. In this embodiment, the fundamental wave having a wavelength of 1.57 µm and emitted from an output end 601 (corresponding to the output end 114 in the first embodiment and output end 29 in the second embodiment) of a fiber bundle is subjected to harmonic wave generation from 10th harmonic wave by using non-linear optical crystals, thereby generating ultraviolet light having a wavelength of 157 nm the same as that of the $F_2$ laser. Further, as the fundamental wave generating portion according to this embodiment, the fundamental wave generating portion in either one of the first to third embodiments or combination thereof can be used.

In the arrangement of the wave length converting portion shown in FIG. 13, the fundamental wave (having wavelength of 1.57 μm) is wavelength-converted into 10th harmonic wave (having wavelength of 157 nm) through 2nd harmonic wave (having wavelength of 785 nm), 4th harmonic wave (having wavelength of 392.5 nm) and 8th harmonic wave (having wavelength of 196.25 nm) successively. In the illustrated embodiment, in wavelength converting stages from 2nd harmonic wave generation to 8th harmonic wave generation, wavelength incident on the respective wavelength converting stages are subjected to second harmonic wave generation.

Further, in the illustrated embodiment, as the non-linear optical crystals, LBO crystal is used for generating the 2nd harmonic wave from the fundamental wave based on second harmonic wave generation in a wavelength converting portion 602, and LBO crystal is used for generating the 4th harmonic wave from the 2nd harmonic wave based on second harmonic wave generation in a wavelength converting portion 604. Further, $Sr_2Be_2B_2O_7$ (SBBO) crystal is used for generating the 8th harmonic wave from the 4th harmonic wave based on second harmonic wave generation in a wavelength converting portion 609, and SBBO crystal is used for generating the 10th harmonic wave (having wavelength of 157 nm) based on sum frequency generation of the 2nd harmonic wave and the 8th harmonic wave in a wavelength converting portion 611.

Further, the 2nd harmonic wave generated from the wavelength converting portion 602 is incident on the wavelength converting portion 604 through a collective lens 603, which wavelength converting portion 604 generates the 4th harmonic wave, and 2nd harmonic wave which is not wavelength-converted. Then, the 2nd harmonic wave passed through a dichroic mirror 605 passes through a collective lens 606 and is reflected by a dichroic mirror 607 to be incident on the wavelength converting portion 611. On the other hand, the 4th harmonic wave reflected by the dichroic mirror 605 passes through a collective lens 608 and is incident on the wavelength converting portion 609, and the 8th harmonic wave generated here passes through a collective lens 610 and the dichroic mirror 607 and is incident on the wavelength converting portion 611. Further, in the wavelength converting portion 611, from the 2nd harmonic wave and the 8th harmonic wave which are coaxially combined, the 10th harmonic wave (having wavelength of 157 nm) is generated on the basis of the sum frequency generation.

By the way, in the illustrated embodiment, an example that, by branching the 2nd harmonic wave and the 4th harmonic wave generated by the second stage wavelength converting portion 604 by the dichroic mirror 605, the 2nd harmonic wave passed therethrough and the 8th harmonic wave obtained by wavelength-converting the 4th harmonic wave in the wavelength converting portion 609 are incident on the fourth stage wavelength converting portion 611 through different light paths was explained. However, four wavelength converting portions 602, 604, 609, 611 may be arranged on the same optical axis without using the dichroic mirrors 605, 607.

However, in the illustrated embodiment, the 4th harmonic wave generated in the second stage wavelength converting portion 604 has an elliptical cross-sectional configuration due to Walk-off phenomenon. Thus, it is desirable that beam shaping of the 4th harmonic wave (incident beam) is affected to improve overlapping with the 2nd harmonic wave in order to obtain good conversion efficiency in the fourth stage wavelength converting portion 611 on which the beam is incident. In the illustrated embodiment, since the collective lenses 606, 608 can be arranged on the different light paths, for example, a cylindrical lens can be used as the lens 608, thereby easily effecting the beam shaping of the 4th harmonic wave. Thus, the overlapping with the 2nd harmonic wave in the fourth stage wavelength converting portion 611 can be improved and the conversion efficiency can be enhanced.

By designing the wavelength converting portion as shown in the fifth embodiment, the fundamental wave (having wavelength of 1.57 μm) generated at the fundamental wave generating portion can be converted into the ultraviolet light having wavelength of 157 nm.

Figure 14:
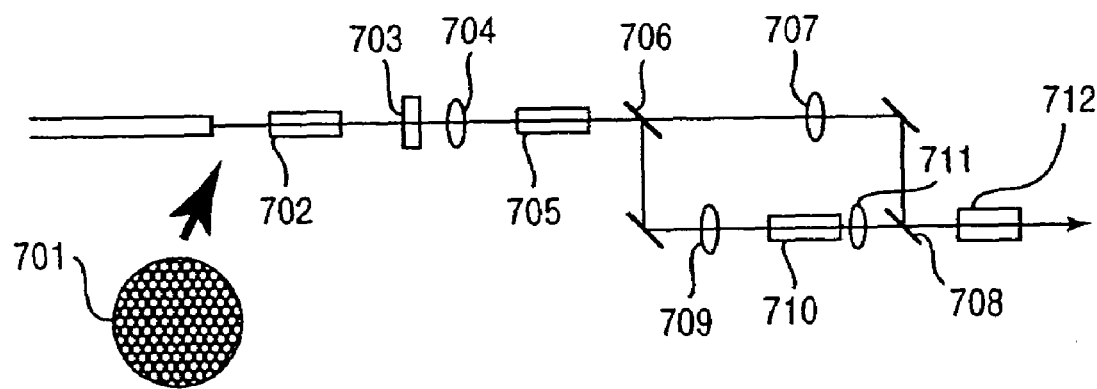
FIG. 14 is an explanatory view showing an arrangement of a wavelength converting portion of an ultraviolet laser apparatus according to a sixth embodiment of the present invention.

A still further arrangement of a wavelength converting portion according to the present invention is shown in FIG. 14 as a sixth embodiment. In this embodiment, for example, the fundamental wave generating portion as shown in the second embodiment is designed, and the fundamental wave having a wavelength of 1.099 μm and emitted from an output end 701 (corresponding to the output end 114 in the first embodiment and output end 29 in the second embodiment) of a fiber bundle is subjected to harmonic wave generation from 7th harmonic wave by using non-linear optical crystals, thereby generating ultraviolet light having a wavelength of 157 nm the same as that of the $F_2$ laser. Further, as the fundamental wave generating portion according to this embodiment, the fundamental wave generating portion in either one of the first to third embodiments or combination thereof can be used.

In the arrangement of the wave length converting portion shown in FIG. 14, the fundamental wave (having wavelength of 1.099 μm) is wavelength-converted into 7th harmonic wave (having wavelength of 157 nm) through 2nd harmonic wave (having wavelength of 549.5 nm), 3rd harmonic wave (having wavelength of 366.3 nm) and 4th harmonic wave (having wavelength of 274.8 nm) successively. In the illustrated embodiment, in each of wavelength converting stages, second harmonic wave generation or sum frequency generation of the incident light is effected.

In this embodiment, LBO crystal is used for generating the 2nd harmonic wave from the fundamental wave on the basis of second harmonic wave generation in a wavelength converting portion 702, and LBO crystal is used for generating the 3rd harmonic wave on the basis of sum frequency generation of the fundamental wave and the 2nd harmonic wave in a wavelength converting portion 705. Further, BBO crystal is used for generating the 4th harmonic wave from the 2nd harmonic wave on the basis of second harmonic wave generation in a wavelength converting portion 710, SBBO crystal is used for generating the 7th harmonic wave on the basis of sum frequency generation of the 3rd harmonic wave and the 4th harmonic wave in a wavelength converting portion 712.

Furthers, the fundamental wave and the 2nd harmonic wave generated from the wavelength converting portion (LBO crystal) 702 are incident on a half-wavelength plate 703, where only a polarization direction of the fundamental wave is rotated by 90 degrees, and the waves are incident on the wavelength converting portion (LBO crystal) 705 through a collective lens 704. In the wavelength converting portion 705, the 3rd harmonic wave is obtained from the fundamental wave and the 2nd harmonic wave on the basis of sum frequency generation and the 2nd harmonic wave is passed without wavelength conversion. The 2nd harmonic wave and the 3rd harmonic wave emitted from the wavelength converting portion 705 are branched by a dichroic mirror 706, and the 3rd harmonic wave passed the dichroic mirror passes through a collective lens 707 and is reflected by a dichroic mirror 708 to be incident on the wavelength converting portion 712. On the other hand, the 2nd harmonic wave reflected by the dichroic mirror 706 passes through a collective lens 709 and is incident on the wavelength converting portion 710, where the 4th harmonic wave is generated from the 2nd harmonic wave on the basis of second harmonic wave generation. The 4th harmonic wave passes through a collective lens 711 and the dichroic mirror 708 and is incident on the wavelength converting portion 712, where the 7th harmonic wave is generated from the 3rd harmonic wave and the 4th harmonic wave on the basis of sum frequency generation.

By the way, in the illustrated embodiment, while an example that, by branching the 2nd harmonic wave and the 3rd harmonic wave emitted from the second stage wavelength converting portion 705, the 3rd harmonic wave passed through this converting portion and the 4th harmonic wave obtained by wavelength-converting the 2nd harmonic wave in the wavelength converting portion 710 are incident on the fourth stage wavelength converting portion 712 through the different light paths was explained, four wavelength converting portions 702, 705, 710, 712 may be arranged on the same optical axis without using the dichroic mirrors 706, 708.

However, in the illustrated embodiment, the 4th harmonic wave generated in the third stage wavelength converting portion 710 has an elliptical cross-sectional configuration due to Walk-off phenomenon. Thus, it is desirable that beam shaping of the 4th harmonic wave (incident beam) is effected to improve overlapping with the 3rd harmonic wave in order to obtain good conversion efficiency in the fourth stage wavelength converting portion 712 on which the beam is incident. In the illustrated embodiment, since the collective lenses 707, 711 can be arranged on the different light paths, for example, a cylindrical lens can be used as the lens 711, thereby easily effecting the beam shaping of the 4th harmonic wave. Thus, the overlapping with the 3rd harmonic wave in the fourth stage wavelength converting portion 712 can be improved and the conversion efficiency can be enhanced.

By designing the wavelength converting portion as shown in the sixth embodiment, the fundamental wave (having wavelength of 1.099 μm) generated at the fundamental wave generating portion can be converted into the ultraviolet light having wavelength of 157 nm.

Figure 15:
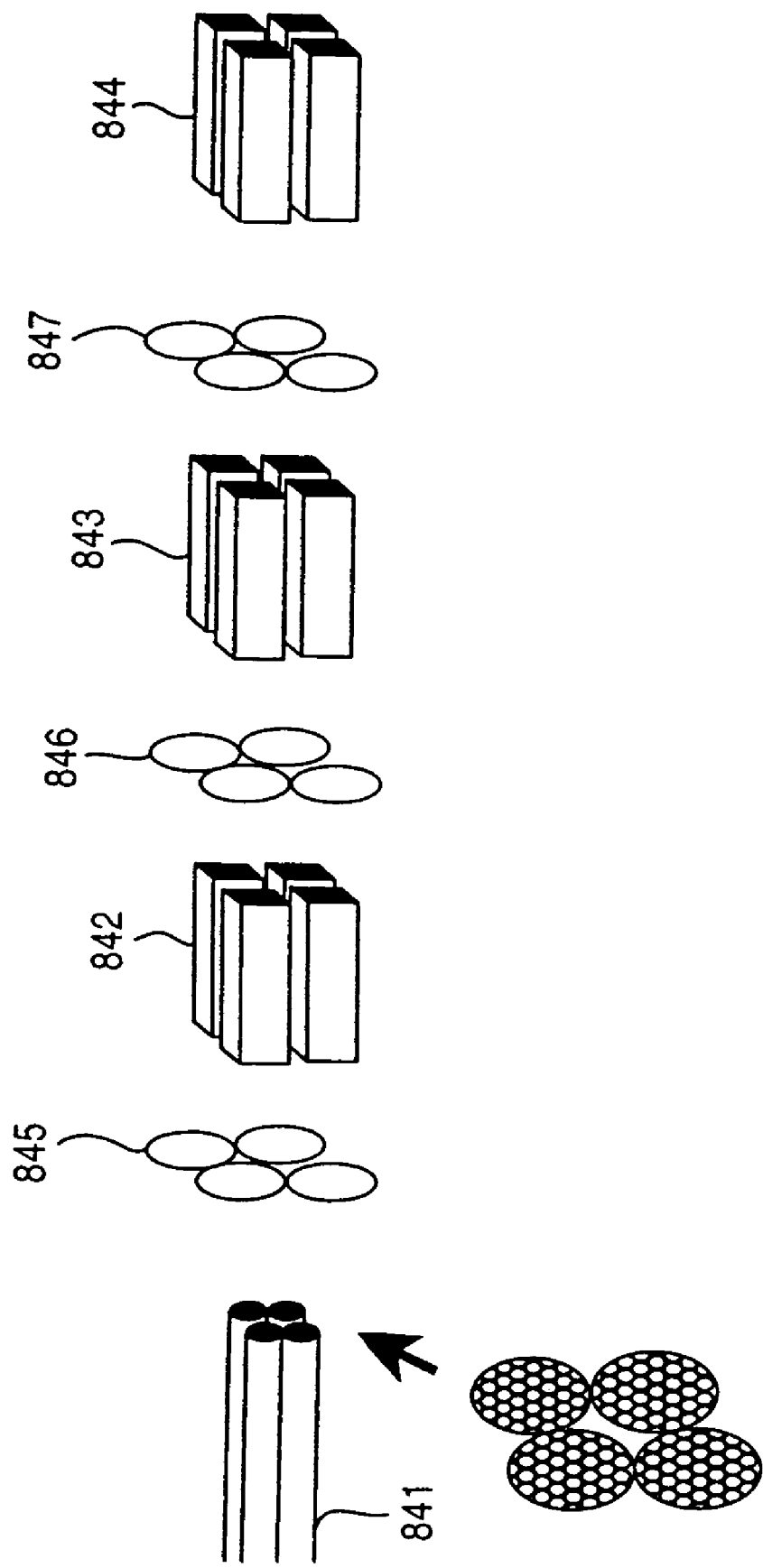
FIG. 15 is an explanatory view showing an arrangement of a wavelength converting portion of an ultraviolet laser apparatus according to a seventh embodiment of the present invention.

Next, another arrangement of an optical amplifier and a wavelength converting portion according to the present invention is shown in FIG. 15 as a seventh embodiment. In FIG. 15, a wavelength converting portion is constituted by a plurality of parallel light paths (square arrangement having 4 light paths in this example), and output ends of many fiber optical amplifiers 19 or 25 are divided into four bundles (output groups) accordingly, and light collecting optical elements and wavelength converting portions are provided corresponding to such four fiber bundle output ends. In this embodiment, since it is assumed that the optical amplifiers shown in FIG. 1 or FIG. 2 are used, 32 fiber optical amplifiers 19 or 25 are bundled as a single fiber bundle. Further, although the bundle can be formed by using the output end of the last stage EDFA or YDFA as it is, non-doped fibers may be connected to the last stage EDFA or YDFA and the bundle may be formed at output ends of the fibers.

Further, when the output ends of the fiber optical amplifiers 19 or 25 are divided to form plural fiber bundles, it is preferable that, among the plural (128 in the illustrated embodiment) fiber optical amplifiers 19 or 25, output ends (fiber optical amplifiers) adjacent to each other regarding the laser beam emitting sequence or order are bundled as different bundles. For example, when 128 fiber optical amplifiers (19 or 25) are numbered as 0 to 127 according to the light beam emitting sequence, the fiber optical amplifiers hating Nos. 0, 4, 8, . . . , 124 are bundled together as a first bundle, the fiber optical amplifiers having Nos. 1, 5, 9, . . . , 125 are bundled together as a second bundle, the fiber optical amplifiers having Nos. 2, 6, 10, . . . , 126 are bundled together as a third bundle, and the fiber optical amplifiers having Nos. 3, 7, 11, . . . , 127 are bundled together as a fourth bundle. As a result-time intervals of the pulse lights incident on wavelength converting portions (non-linear optical crystals) provided in correspondence to the fiber bundles can be divided uniformly or equally.

As shown in FIG. 15, in the illustrated embodiment, the fundamental wave emitted from an output end 841 of the optical amplifier (FIG. 1 or FIG. 2) comprised of each of four fiber bundles is wavelength-converted by three stage wavelength converting portions 842, 843, 844. Further, in the illustrated embodiment, although any wavelength converting portions (FIGS. 11, 13 and 14) explained in connection with the fourth to sixth embodiments can be used, here, the wavelength converting portion shown in FIG. 11(*a*) is used. Namely, the fundamental wave (having wavelength of 1.544 μm) is wavelength-converted into ultraviolet light having a wavelength of 193 nm by three stage non-linear optical crystals (502 to 504). Accordingly, the fundamental wave (having wavelength of 1.544 μm; frequency of $\omega$)) is converted into 8th harmonic wave (having wavelength of 193 nm) through 2nd harmonic wave and 4th harmonic wave successively while passing through the non-linear optical crystals 842, 843, 844 from the left to the right and than is outputted.

In FIG. 15, the fundamental wave (having wavelength of 1.544 μm) emitted from the output end 841 of the optical amplifier comprised of four fiber bundles is incident on the wavelength converting portion (non-linear optical crystal) 842 through collective lens 845 provided in correspondence to four fiber bundles, and, in this wavelength converting portion, two-time wave (having wavelength of 772 nm; frequency of $2\omega$) having frequency of twice of the frequency ($\omega$) of the fundamental wave is generated by second harmonic wave generation. The 2nd harmonic wave generated in the wavelength converting portion 842 advances to the right and is incident on the next wavelength converting portion (non-linear optical crystal) 843 through a collective lens 846. In this wavelength converting portion, the second harmonic wave generation is effected again, with the result that 4th harmonic wave having frequency of $4\omega$ (wavelength of 386 nm) greater than the frequency $2\omega$ of the incident wave (2nd harmonic wave) by two times (i.e., greater than the frequency of the fundamental wave by four times) is generated. The 4th harmonic wave generated in the wavelength converting portion 843 is incident on the further right wavelength converting portion (non-linear optical crystal) 844 through a collective lens 847. In this wavelength converting portion, the second harmonic wave generation is effected, with the result that 8th harmonic wave having frequency of $8\omega$ (wavelength of 193 nm) greater than the frequency $4\omega$ of the incident wave (4th harmonic wave) by two times (i.e., greater than the frequency of the fundamental wave by eight times) is generated.

In this embodiment, as the non-linear crystals used S for the wavelength conversion, for example, LBO crystal is used as the wavelength converting crystal for converting the fundamental wave into the 2nd harmonic wave in the wavelength converting portion 842, BBO crystal is used as the wavelength converting crystal for converting the 2nd harmonic wave into the 4th harmonic wave in the wavelength converting portion 843, and SBBO crystal is used as the wavelength converting crystal for converting the 4th harmonic wave into the 8th harmonic wave in the wavelength converting portion 844.

Further, in the illustrated embodiment, while an example that the fundamental wave (having wavelength of 1.544 μm) is wavelength-converted into the 8th harmonic wave (having wavelength of 193 nm) through the 2nd harmonic wave (having wavelength of 772 nm) and the 4th harmonic wave (having wavelength of 386 nm) successively was explained, this corresponds to an arrangement in which a plurality of wavelength converting portions (FIG. 11(*a*)) in the aforementioned fourth embodiment are arranged in parallel. Accordingly, by arranging a plurality of other wavelength converting portions shown in FIG. 11(*b*), 11(*c*) or 11(*d*) in parallel similar to this embodiment, the arrangement similar to this embodiment can be obtained. Similarly, a plurality of wavelength converting portions shown in FIG. 13 or 14 may be arranged in parallel to obtain the similar arrangement.

Next, with reference to FIG. 16, an alteration of the connecting portions between the optical amplifiers and the wavelength converting portions in the illustrated embodiment will be explained. In this alteration (embodiment), the wavelength converting portions shown in FIG. 15 are arranged in parallel as five light paths, and the output ends of the fiber optical amplifiers are divided into five to form five fiber bundles (output groups). In this division, the output ends of the fiber optical amplifiers are not divided uniformly or equally, but, an output end 850 of part(s) (one fiber bundle in FIG. 15) of five fiber bundles (output groups) is constituted by a single fiber optical amplifier or several fiber optical amplifiers, and the other (four in FIG. 15) fiber bundle output ends 851 are obtained by bundling the plural fiber optical amplifiers divided uniformly so that the number of the fiber optical amplifiers in the fiber bundles becomes the same. Output lights emitted from the output ends are converted into ultraviolet lights having predetermined wavelengths by wavelength converting portions 852 to 857 provided at the respective output groups (fiber bundles) and are supplied to the exposure apparatus, for example. Further, three stage wavelength converting portions 852 to 854 are constituted by wavelength converting portions, the number of which is the same as that of the plural (five) fiber bundles, and the light collecting optical elements 855 to 857 are constituted by collective lenses, the number of which is the same as that of respective fiber bundles.

When an ultraviolet laser apparatus according to this example is applied to an exposure apparatus (FIG. 19 or 20), the fundamental waves emitted from the output ends 851 of four fiber bundles are converted into the ultraviolet lights in the wavelength converting portions (852 to 857), respectively, and the ultraviolet lights are illuminated on a reticle as exposure illumination light through an illumination optical system. That is to say, the four fiber bundles are used as an exposure light source. On the other hand, the output light emitted from the output end 850 of the fiber bundle constituted by the single fiber optical amplifier or several fiber optical amplifiers and converted into the ultraviolet light is directed to an alignment system or a monitoring system. That is to say, one fiber bundle (850) is used as an alignment light source. Further, the ultraviolet light emitted from the fiber bundle output end 850 and wavelength-converted is transmitted to the alignment system through a non-doped fiber connected to the third stage wavelength converting portion 854, for example.

Figure 16:
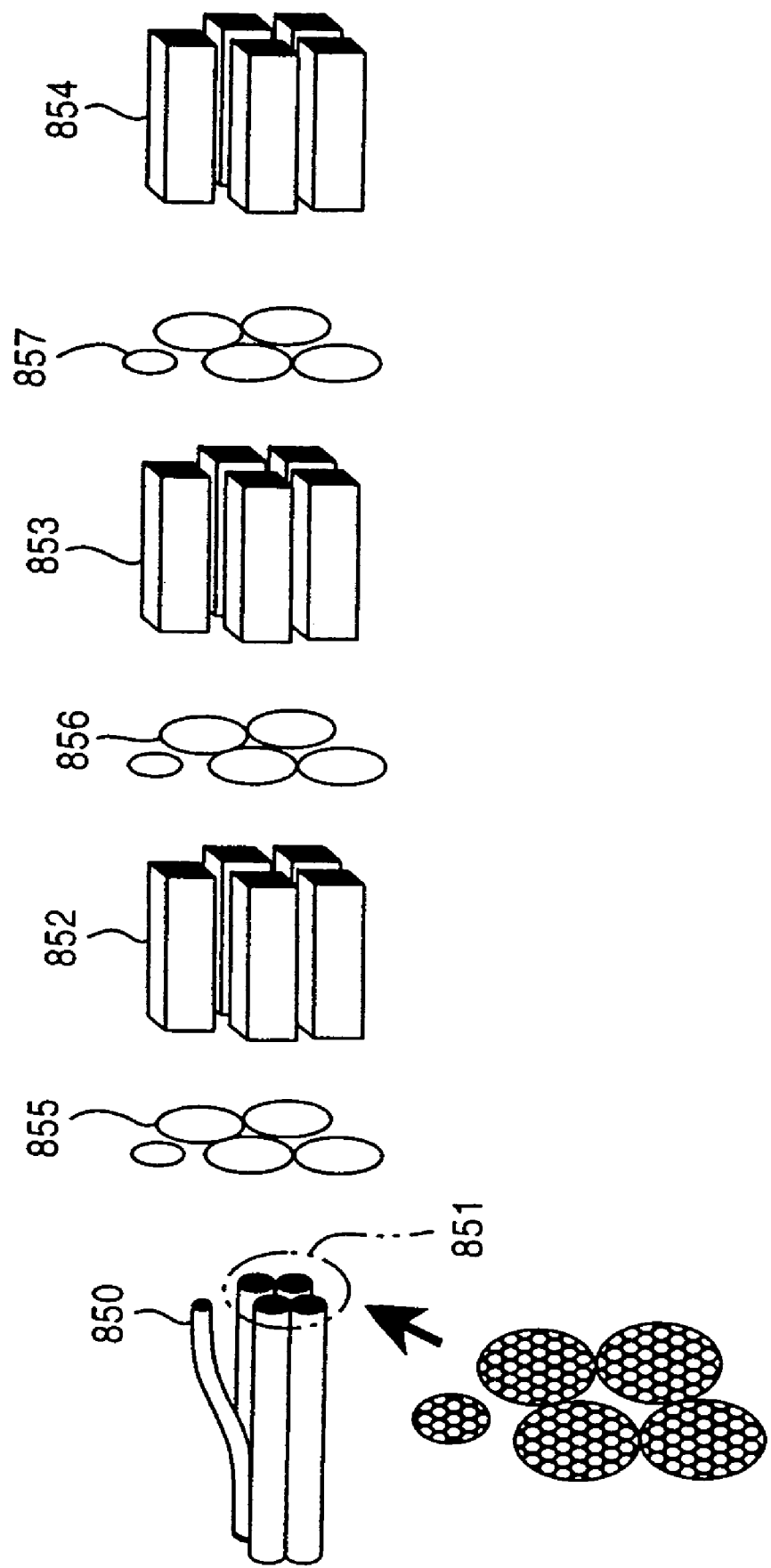
FIG. 16 is an explanatory view showing an example of an input part of a wavelength converting portion of an ultraviolet laser apparatus according to an eighth embodiment of the present invention.

By the way, in FIG. 16, while an example that the fundamental waves generated from output ends 851 of four fiber bundles are wavelength-converted into the ultraviolet lights which are in turn directed to the illumination optical system was explained, the number of fiber bundles may be one or plural. Further, in the example in FIG. 16, the number of fiber bundle used in the alignment or the monitoring is one. However, such a number may be plural, and lights emitted from the plural fiber bundles may be directed to different optical systems.

In this example, the exposure light source is the same as the light source used in the alignment or the monitoring, and the exposure illumination light and the alignment illumination light are obtained by branching, amplifying and wavelength-converting the output light from the common single-wavelength oscillating laser, and thus, ultraviolet lights having the same wavelength can be used. Thus, the alignment and various monitoring operations can be effected through optical systems of the exposure apparatus such as illumination optical system and projection optical system. Accordingly, the alignment optical system can easily be designed to greatly facilitate construction thereof or is not required to be provided additionally, thereby easily constructing the exposure apparatus. Further, since there is a case where illumination of the exposure illumination light and illumination of the alignment illumination light may not be effected simultaneously, it is preferable that, for example, by providing shutters in the illumination light paths or by selecting the channel for branching the pulse light by means of the TDM 23, the timings of illuminations are controlled independently.

Further, in order to measure a focus position, projection demagnification, aberration and telecentricity of the projection optical system, the ultraviolet light for the alignment or the monitoring can be used, thereby enhancing measuring accuracy. Further, when alignment between a focusing plane of the projection optical system and a photosensitive substrate (wafer) is effected, by using light having the same wavelength as the exposure wavelength and by effecting the alignment through the projection optical system, the aligning accuracy can be achieved simultaneously.

By the way, according to the above-mentioned arrangement of the illustrated embodiments (FIGS. 15 and 16), by dividing the outputs of the fiber optical amplifiers into plural groups to divide the lights fed to the non-linear crystals, incident powers fed to the non-linear crystals can be reduced effectively. Accordingly, problems regarding output reduction and light damage due to light absorption and heat effect in the non-linear crystal can be solved. Further, the number of division (the number of fiber bundles) of the output ends of the fiber optical amplifiers is not limited to four or five but may be two or more.

Next, the connecting portions between the optical amplifiers and the wavelength converting portions will be explained as an eighth embodiment. Here, the output end of the optical amplifiers is formed by bundling the output ends of the fiber optical amplifiers as a bundle as is in the first and second embodiments. In this case, since a clad diameter of the fiber optical amplifier is about 125 μm, a diameter of the output and of the bundle obtained by bundling 128 optical amplifiers can be smaller than about 2 mm.

The number and configuration of the bundle can be determined in consideration of arrangements of the wavelength converting portions and the shape of the light source required, and, for example, in the first and second embodiments, a bundle having a single circular cross-section is shown (114, 29, 501, 601, 701 and the like). In this case, when the output end of the fiber optical amplifier is formed to be a flat plane for example as shown in FIG. 9 or 10, by providing a collective lens (for example, collective lens 845 in FIG. 15 and the like) between the output end of the fiber bundle and the first stage wavelength converting portion (non-linear crystal) to collect the light generated from the fiber bundle onto the non-linear crystal, the output light from the fiber optical amplifier can be entered effectively.

Figure 17:
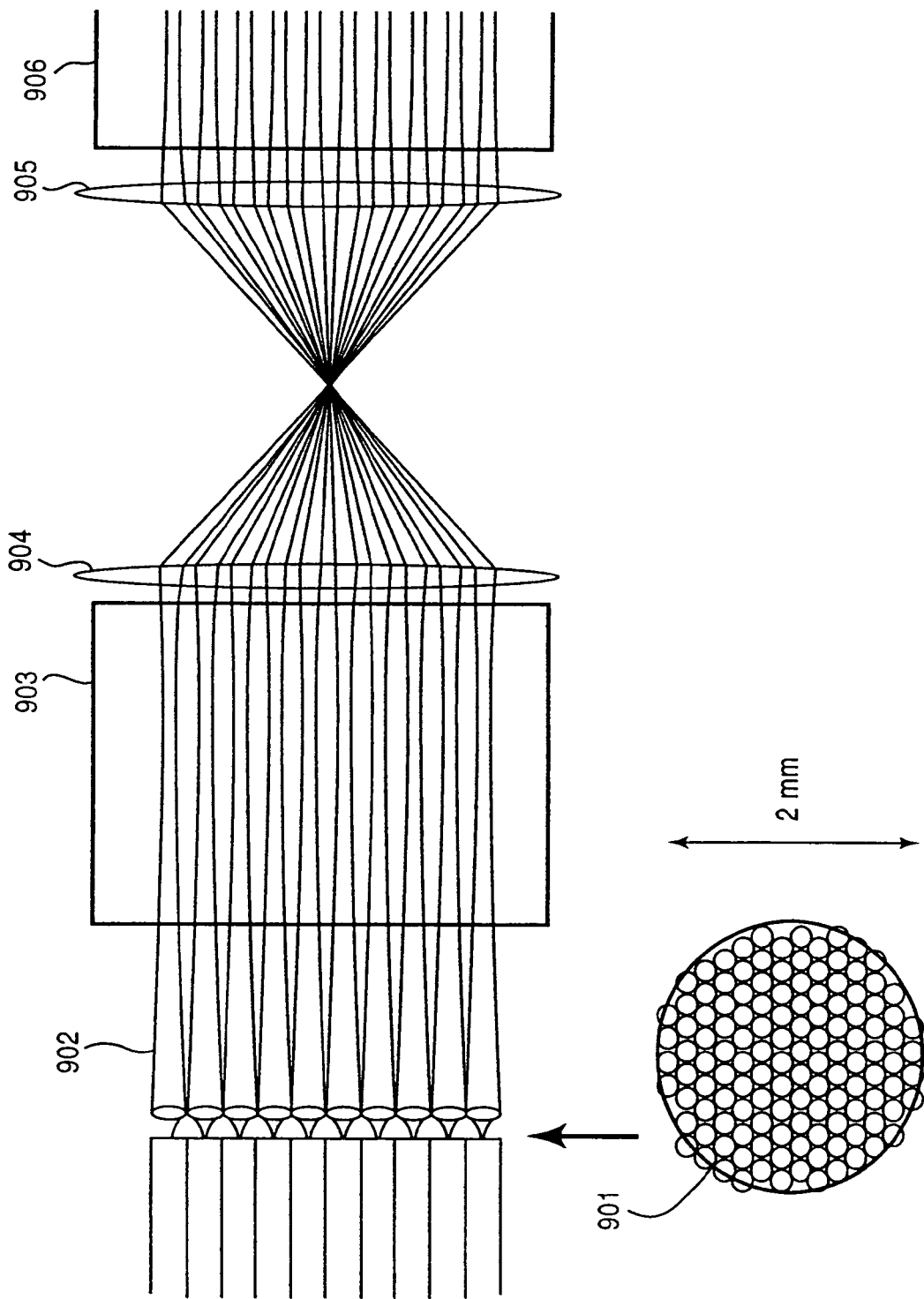
FIG. 17 is an explanatory view showing another embodiment of an input part of the wavelength converting portion of the ultraviolet laser apparatus according to the present invention.

Further, another example of the connecting portion according to the present invention is shown in FIG. 17. In FIG. 17, fundamental waves are emitted from a fiber bundle output end 901 obtained by bundling outlet ends of plural fiber optical amplifiers. Lenses 902 are provided in association with the respective fiber optical amplifiers so that the fundamental waves are collected in a first stage wavelength converting portion (non-linear crystal) 903 (for example, 502, 507, 518, 533 in the fourth embodiment; FIG. 11) by these lenses 902. In this example, the entire diameter of the fiber bundle is selected to be 2 mm and a mode diameter of each of the fiber optical amplifiers constituting the fiber bundle is selected to be 20 μm, and the fundamental waves are collected to the first stage wavelength converting portion 903 by the respective lenses 902. Further, a pair of lenses 904, 905 are disposed between the first stage wavelength converting portion 903 and a second stage wavelength converting portion 906 so that the lights emitted from the wavelength converting portion 903 are incident on the wavelength converting portion 906 under the same condition as that where such lights are incident on the wavelength converting portion 903.

In such an embodiment, magnification of each lens 902 is selected (for example, to about ten times in the illustrated embodiment) so that each beam diameter in the non-linear crystal becomes magnitude (for example, 200 μm in the illustrated embodiment) desired to obtain the optimum harmonic wave conversion efficiency. Since the fiber outputs are collected by independent lenses 902, magnitude (cross-sectional area) of entire light fluxes (collected from all of the fibers in the fiber bundle) in the non-linear crystal becomes a value substantially corresponding to the diameter of the fiber bundle itself regardless of the magnification of the collective lens. Accordingly, since required magnitude (cross-section) of the wavelength converting crystal becomes a value substantially corresponding to the diameter of the fiber bundle, a small, wavelength converting crystal having dimension of several square millimeters can be used, and this is therefore economical. Further, in place of the lenses 902, the output end face of each fiber may directly be formed as a spherical or non-spherical lens having a light collecting function.

Next, other embodiments of the fiber output end in the connecting portion between the optical amplifier and the wavelength converting portion are shown in FIGS. 18(*a*) to 18(*c*). The embodiments shown in FIGS. 18(*a*) and 18(*c*) are examples that a light collecting element similar to the collective lens 902 shown in FIG. 17 is formed on the output end of each fiber 452, and, such fibers are gathered as a bundle for each output group, respectively. In these embodiments, although the light collecting element 453 is formed on the output end of each fiber 452, this is obtained by machining the window member 433 as a lens, which member 433 is provided on the fiber output end already explained in connection with FIG. 10(*a*) to have a light collecting function. By constructing in this way, the light collecting function similar to that in FIG. 17 can be achieved and damage on the fiber output end can be suppressed.

Further, FIG. 18(*b*) shows an embodiment in which a light collecting element 463 is provided with respect to each output group obtained by bundling a plurality of fibers 462. In this embodiment, for example, a light collecting element similar to the collective lens 845 shown in FIG. 15 is formed on the output end of the fiber bundle, and, this is obtained by machining the window member 443 already explained in connection with FIG. 10(*b*) as a spherical or non-spherical lens to have a light collecting function.

Further, in place of the fact that the fiber end or the output surface of the window member is machined as the spherical or non-spherical lens, the fiber end (or glass composition of an end portion of a glass window when such a glass window is used as the window member) may be partially changed or altered by ion exchange by using an ion exchanging method such as thermal ion exchanging method or electrolytic ion exchanging method to have refractive index distribution equal to a lens, thereby providing the light collecting function. Further, in FIGS. 18(*a*) to 18(*c*), although diameters of cores 451, 461 in the fibers are not enlarged, enlargement of the cores may be used in combination.

Similar to the first stage, although the light collecting onto the second and further wavelength converting portions (non-linear crystals) can be effected by the lenses for each fiber or each bundle, in the illustrated embodiments an example that all outputs from the fiber bundles are collected by a set of common lenses or a single common lens is described. By using the common lens(es) in this way, the number of lenses used can be reduced and the alignment between the lenses is facilitated. Thus, this is economical.

Further, since the output ends of the wavelength converting portions (non-linear crystals) are located within Rayleigh length of the beams collected in the wavelength converting crystals, beams emitted from the wavelength converting crystals become substantially in parallel at the output ends of the wavelength converting crystals. In the illustrated embodiment (FIG. 17), the emitted beams are collected into the second stage wavelength converting crystal 906 by a pair of lenses 904, 905. Here, a focal length of the lens pair can be selected to realize the magnification such that beam diameters desirable to obtain optimum conversion efficiency in the second stage wavelength converting portion 906 are obtained. Further, in FIGS. 11, 13 and 14, while an example that the light collecting element (for example, 505, 506 shown in FIG. 11(*a*)) for collecting the fundamental wave or the harmonic wave thereof into the wavelength converting crystal is constituted by the single lens was explained, as is in the illustrated embodiment, a set of lenses can be used.

In this way, by constructing the fundamental wave generating portion (laser light generating portion and optical amplifier) on the basis of the construction shown in the first to third embodiments and by constructing the wavelength converting portion on the basis of the construction shown in the fourth to seventh embodiments and by constructing the connecting portion between the optical amplifier and the wavelength converting portion on the basis of the construction shown in the eight embodiment, the ultraviolet light outputs light having output wavelengths of 157 nm and 193 nm can be obtained. These wavelengths are the same as the oscillating wavelengths of the $F_2$ laser and ArF excimer laser.

Further, for example, when the fundamental wave generating portion according to the first embodiment is used, since the ultraviolet output lights obtained in this way are pulse lights emitted with interval of about 3 ns, they are not overlapped with each other in a time-lapse relation, and the respective output lights do not interfere with each other while each output light has a single wavelength with extremely narrow band. Further, for example, when the fundamental wave generating portion according to the second embodiment is used, since the ultraviolet output lights obtained are pulse lights emitted with interval of about 78 ns, they are not overlapped with each other in a time-lapse relation, and the respective output lights do not interfere with each other while each output light has a single wavelength with extremely narrow band.

Further, for example, in a solid-state ultraviolet laser as disclosed in Japanese Patent Laid-open No. 8-334803 (1996), although wavelength converting portions are required for respective fundamental wave lasers (for respective laser elements), according to the illustrated embodiment, since the entire diameter of the fiber bundles including all channels is 2 mm or less, the wavelengths of all channels can be converted by only one set of wavelength converting portions. Furthermore, since the output end is constituted by the flexible fibers, the wavelength converting portions can be located apart from other constructional parts such as the single-wavelength oscillating laser, splitter and time division multiplexer, thereby providing high degree of freedom of arrangement. Accordingly, the present invention can provide an ultraviolet laser apparatus which is cheap and compact and of low spatial coherence although it handles single wavelength.

Next, a ninth embodiment of an ultraviolet laser apparatus according to the present invention will be expalained. The ultraviolet laser apparatus according to this embodiment is characterized in that the ultraviolet laser apparatus such as described in the first to eighth embodiments is used as a light source of the exposure apparatus.

Figure 19:
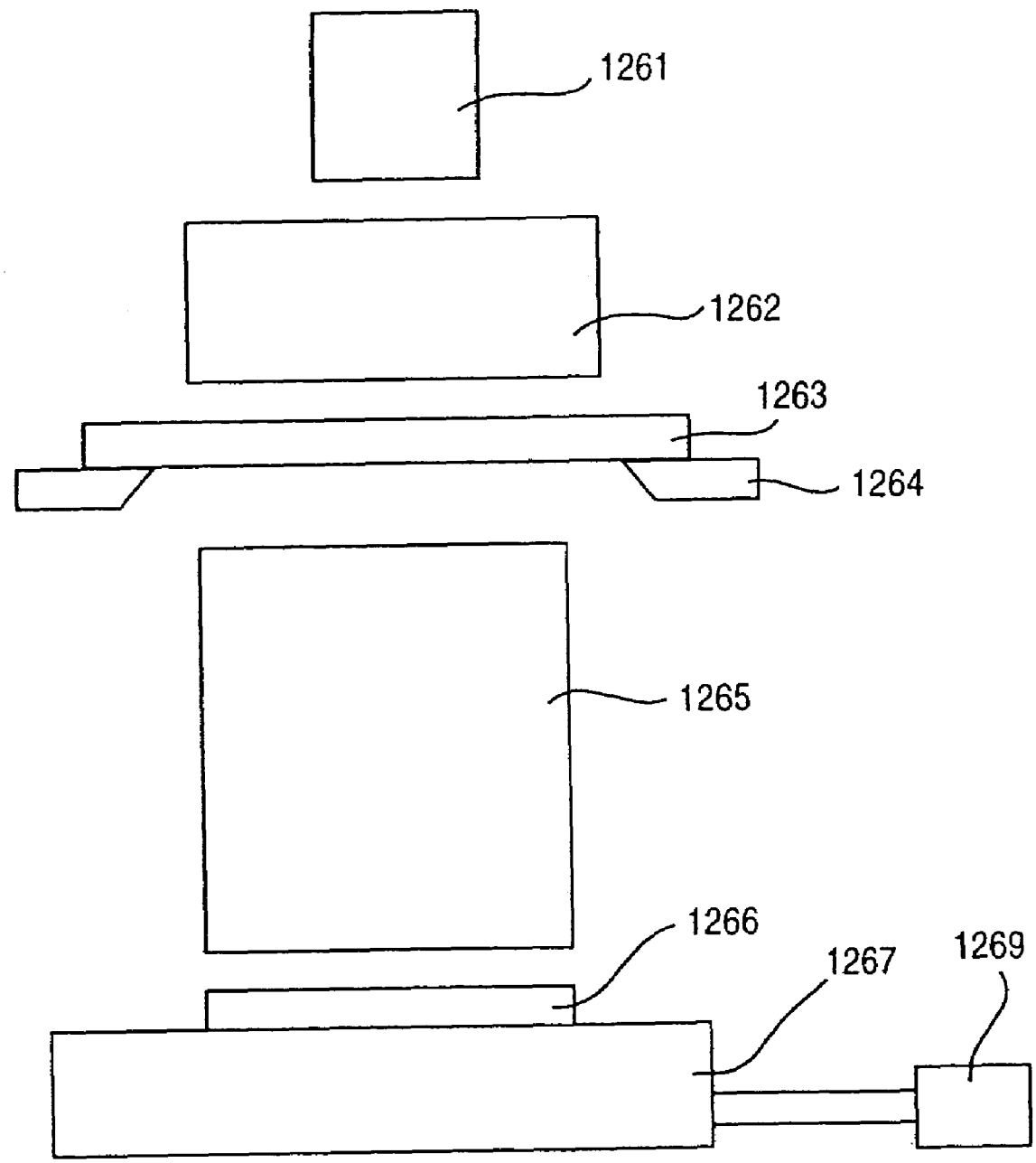
FIG. 19 is an explanatory view showing an exposure apparatus according to another embodiment of the present invention.

Now, an embodiment of the exposure apparatus using the ultraviolet laser apparatus according to the present invention will be explained with reference to FIG. 19. In principle, the exposure apparatus used in a photo-lithography process is the same as photoengraving, in which a circuit pattern precisely described on a photo-mask (reticle) is optically transferred on a semiconductor wafer on which photo-resist is coated in a reduction projection manner. The ultraviolet laser apparatus 1261 according to the present invention is integrally provided with the entire exposure apparatus including an illumination optical system 1262 and a projection optical system 1265. In this case, the ultraviolet apparatus 1261 may be secured to a table supporting the illumination optical system 1262 or the ultraviolet apparatus 1261 may be secured to the table solely. However, it is preferable that a power supply connected to the ultraviolet apparatus 1261 be located separately.

Further, the ultraviolet apparatus 1261 may be divided into a first part including the laser light generating portion and the optical amplifiers and a second part including the wavelength converting portions, and the second part may be secured to the table together with the illumination optical system 1262 and the first part may be secured to a table different from the aforementioned table. Further, the entire ultraviolet apparatus 1261 may be housed in a chamber containing the body of the exposure apparatus, or a part of the ultraviolet apparatus 1261 (for example, wavelength converting portions) way be housed and the remaining parts may be arranged out of the chamber. Furthermore, the control system for the ultraviolet apparatus 1261 may be housed in a control rack different from the chamber, or the display and switches may be positioned together with the chamber outside and the remaining parts may be housed in the chamber.

The ultraviolet light having low spatial coherence and having narrow band according to the present invention is projected with an enlarging magnification by the illumination optical system 1262 so that illuminance distribution on the required projection plane is made uniform, and is illuminated onto a quartz mark (quartz reticle) 1263 on which a circuit pattern of an IC circuit is precisely described. The circuit pattern on the reticle is subjected to reduction with predetermined reduction magnification (or demagnification) by the projection optical system 1265 and is projected onto the semiconductor wafer (for example, Silicone wafer) 1266 on which photo-resist is coated, thereby focusing and transferring the circuit pattern onto the wafer.

The illumination optical system 1262 is disposed in a plane substantially conjugated with the pattern surface of the reticle 1263 and includes a field stop defining an illumination area on the reticle 1263, an aperture stop defining light amount distribution of the ultraviolet light on a predetermined plane having substantially a Fourier transform relationship with the pattern surface of the reticle 1263 within the illumination optical system 1262, and a condenser lens for illuminating the ultraviolet light emitted from the aperture stop onto the reticle 1263. In this case, in order to change or alter the light amount distribution of the ultraviolet light on the predetermined plane (Fourier transform plane), plural aperture stops having different configuration and/or dimension may be provided on a turret, and one of the aperture stops selected in accordance with the pattern of the reticle 1263 may be located in a light path of the illumination optical system 1262. Further, an optical integrator (homogenizer) may be disposed between the wavelength converting portion of the ultraviolet laser apparatus 1261 and the field stop, and, when a fly-eye lens is used, the fly-eye lens may be arranged so that the emission focal plane thereof substantially becomes a Fourier transform relationship with the pattern surface of the reticle 1263, and, when a rod integrator is used, the integrator may be arranged so that the emission plane thereof becomes substantially in conjugation with the pattern surface of the reticle 1263.

Further, as a shutter for starting exposure of the exposure apparatus, the electro-optical modulating element or the acousto-optical modulating element (12, 22, 32) explained in connection with the first to third embodiments can be used. By switching the electro-optical modulating element or the acousto-optical modulating element from an OFF condition (i.e., condition (having great internal loss) that pulses are not generated) to an ON condition (i.e., a condition that the pulses are generated and the internal loss is reduced in a pulse pattern), the exposure is started. Further, in the exposure apparatus having the ultraviolet laser apparatus 1261, the continuous light may be outputted from the single-wavelength oscillating laser or the single-wavelength oscillating laser may be pulse-oscillated. Particularly, in the latter, by using both current control of the single-wavelength oscillating laser and control of the electro-optical modulating element or the acousto-optical modulating element, oscillating interval, start and stop of the ultraviolet light (pulse light) illuminated onto the reticle 1263 and the semiconductor wafer 1266 may be controlled. Further, in the exposure apparatus having the ultraviolet laser apparatus 1261 according to the illustrated embodiment, although it is not required for controlling an integrated amount of the ultraviolet light on the wafer 2366 by means of the mechanical shutter, for example, when the ultraviolet light is oscillated in order to stabilize the output (power, center wavelength, spectral bandwidth and the like) of the ultraviolet laser apparatus 1261, a shutter may be disposed within the illumination light path between the ultraviolet laser apparatus 1261 and the wafer 1266, or a stage 1267 may be driven to displace the wafer 1266 from the ultraviolet illumination area, in order to prevent the ultraviolet light from reaching the wafer 1266 to photo-sensitize the photo-resist.

The semiconductor wafer 1266 is rested on the stage 1267 having a drive mechanism 1269. Whenever each exposure is completed, by shifting the stage 1267, each circuit pattern is transferred onto each of different positions on the semiconductor wafer. Such stage driving/exposure system is referred to as a step-and-repeat system. As the stage driving/exposure system other than the above, although there is a step-and-scan system in which the support member 1264 supporting the reticle 1263 is also provided with a drive mechanism and scan exposure is performed by shifting the reticle and the semiconductor wafer in a synchronous manner, the ultraviolet laser apparatus according to the present invention can also be applied to the step-and-scan system.

Further, in an exposure apparatus in which exposure is effected by using ultraviolet light, such as the exposure apparatus having the ultraviolet laser apparatus according to the present invention, normally, both the illumination optical system 1262 and the projection optical system 1265 are constituted by quartz lenses with no chromatic aberration correction. Further, particularly when the wavelength of the ultraviolet light is smaller than 200 nm, at least one of the plural refraction optical elements constituting the projection optical system 1265 may be formed from fluorite, or a refraction/reflection optical system obtained by combining at least one reflection optical element (concave mirror, mirror and the like) and the refraction optical element may be used.

Figure 20:
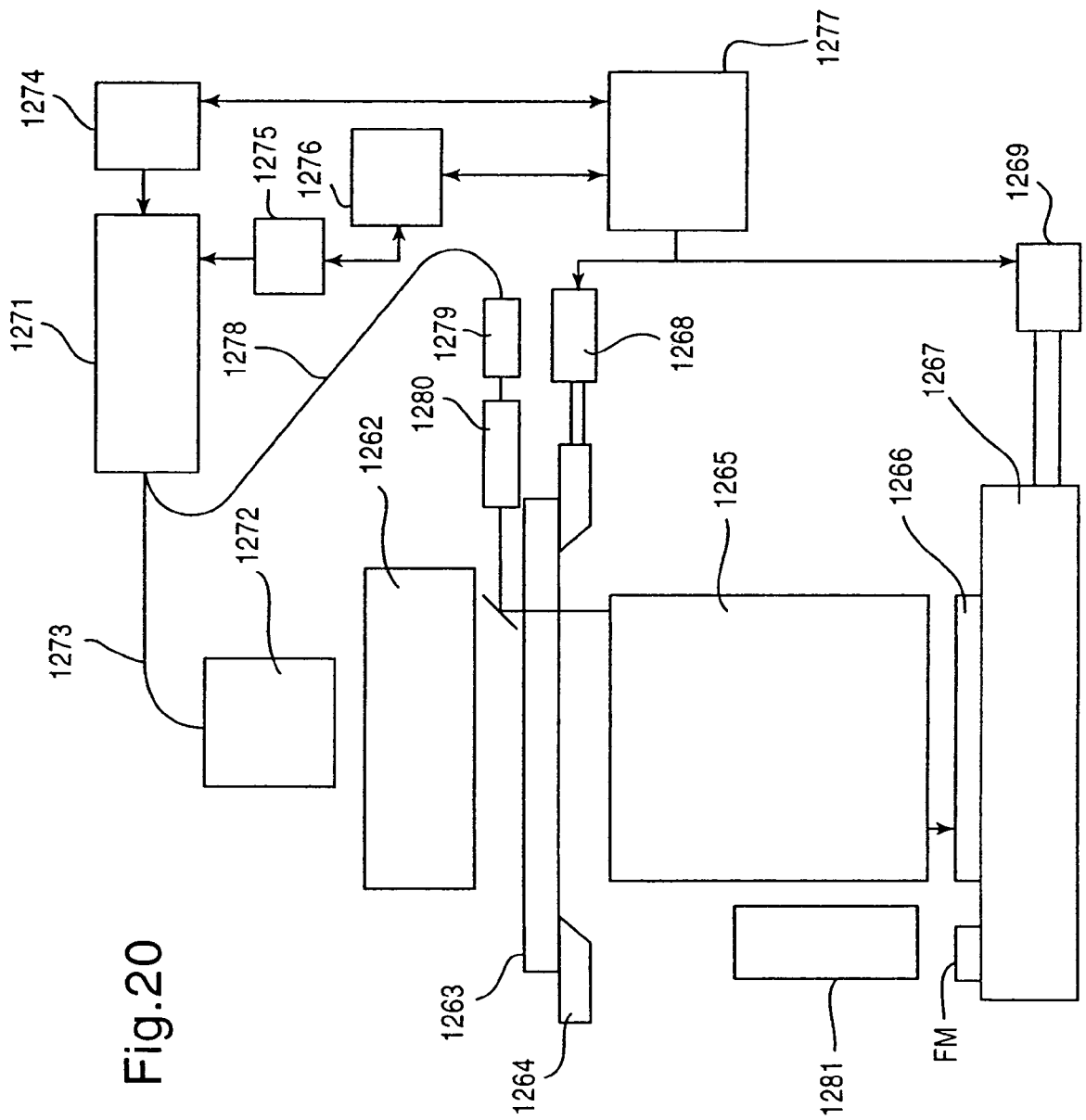
FIG. 20 is an explanatory view showing an exposure apparatus according to a further embodiment of the present invention.

As mentioned above, the exposure apparatus having the ultraviolet laser apparatus according to the present invention is more compact in comparison with other conventional exposure apparatuses (for example, exposure apparatus using an excimer laser or a solid-state laser) and has high degree of freedom for arranging units constituting the apparatus since various elements are connected to the fibers. FIG. 20 shows other embodiment in which such characteristics of the ultraviolet laser apparatus according to the present invention are utilized.

In this embodiment, the laser light generating portion (single-wavelength laser, multiplexer) and the optical amplifier portion described in the first, second or third embodiment, and the wavelength converting portion described in the fourth, fifth, sixth or seventh embodiment are arranged separately to form an exposure apparatus. That is to say, a wavelength converting portion 1272 is provided on a body of the exposure apparatus and other portions (laser light generating portion, optical amplifier portion) 1271 of the ultraviolet laser apparatus are disposed outside of the body of the exposure apparatus, and these portions are connected to each other through a connecting fiber line 1273, thereby constituting the ultraviolet laser apparatus. Here, the connecting fiber line 1273 may be fiber themselves of fiber optical amplifier (for example, fiber bundle 114 in the first embodiment, and the like), non-doped fibers or a combination thereof. Further, portions of the body of the exposure apparatus other than the ultraviolet laser apparatus can be constituted by using the same elements as those shown in FIG. 19.

With this arrangement, main components generating heat such as an pumping semiconductor laser of the fiber optical amplifier, a drive power supply of the semiconductor laser and a temperature controller can be positioned outside of the body of the exposure apparatus. Accordingly, a problem based on heat, in which the body of the exposure apparatus is influenced by the heat from the ultraviolet laser apparatus (exposure light source) to deteriorate the alignment condition between the optical axes can be suppressed.

By the way, as shown in FIG. 20, the reticle stage 1264 holding the reticle 1263 is designed to be shifted in X and Y directions by a drive mechanism 1268 and be rotated by a small angle. Further, a reference mark plate FM is provided on the wafer stage 1267, which reference mark plate is used for baseline measurement which will be described later. Further, in the illustrated embodiment, there are provided an alignment system 1280 for detecting alignment marks on the reticle 1263, and another alignment system 1281 of off-axis type independently from the projection optical system 1265.

The alignment system 1280 serves to illuminate the exposure illumination light or illumination light having the same wavelength (as that of said exposure illumination light) onto the alignment marks on the reticle 1263 and onto reference marks on the reference mark plate FM through the projection optical system 1265 and to receive lights generated from both marks by an imaging element (CCD) to thereby detect their positional deviation. This alignment system is used for alignment of the reticle 1263 and baseline measurement of the alignment system 1281. The alignment system 1281 of off-axis type serves to illuminate white light (broad band light) for example having a spectral bandwidth of about 550 to 750 nm onto the alignment marks on the semiconductor wafer 1266 and to focus both images of index marks provided within this system and images of the alignment marks onto an imaging element (CCD) to thereby detect positional deviation between both marks. Further, when the alignment systems 1280, 1281 detect the reference marks on the reference mark plate FM, based on the result of its detection, an amount of baseline of the alignment system 1281 can be measured. Further, although the baseline measurement is effected prior to exposure of the semiconductor wafer, the baseline measurement may be performed each time the semiconductor wafer is exchanged or the baseline measurement may be performed each time several semiconductor wafers are exposed. However, the baseline measurement should always be effected after the reticle is exchanged.

In the illustrated embodiment, as a wavelength converting portion connected to the ultraviolet laser apparatus (fundamental wave generating portion) 1271, the wavelength converting portion shown in FIG. 16 is used. That is to say, a wavelength converting portion 1272 on which the fundamental waves generated from four fiber bundle output ends 851 are incident and a wavelength converting portion 1279 on which the fundamental wave generated from the fiber bundle output end 850 is incident are provided separately, and the wavelength converting portion 1272 is integrally provided with a table for holding the illumination optical system 1262 and the wavelength converting portion 1279 is integrally provided with a table for holding the alignment system 1280. In this case, a connecting fiber line 1278 is joined to the fiber bundle output end 850 to introduce the fundamental wave to the wavelength converting portion 1279. By doing so, it is not required that a light source for the alignment system 1280 be provided additionally and the reference marks can be detected by using illumination light having the same wavelength as that of the exposure illumination light, thereby permitting high accuracy mark detection.

Further, in the illustrated embodiment, while an example that the illumination light having the same wavelength as that of the exposure illumination light is directed to the alignment system 1208 was explained, a wavelength longer than the wavelength (for example, 193 nm) of the exposure illumination light may be directed to the alignment system 1280 or 1281. That is to say, among three stage wavelength converting portions shown in FIG. 16, for example, the pulse light emitted from the second stage wavelength converting portion 853 may be directed to the alignment system through the connecting fiber line. Further, a part of the pulse light emitted from the first stage wavelength converting portion 852 may be branched and the remaining pulse light may be wavelength-converted in the second stage wavelength converting portion 853 so that two pulse lights having different wavelength emitted from two wavelength converting portions 852, 853 are directed to the alignment system.

Further, the exposure apparatus shown in FIG. 20 includes a wavelength control device 1274 for controlling the oscillating wavelength of the DFB semiconductor laser (i.e., the wavelength of the ultraviolet light (exposure illumination light) illuminated onto the reticle 1263) by adjusting the temperature by using a temperature adjustor (for example, Peltier element) provided on a heat sink on which the single-wavelength oscillating laser (for example, DFB semiconductor laser (11 in FIG. 1 and the like)) within the fundamental wave generating portion 1271 is rested. The wavelength control device 1274 serves to effect both stabilization of the center wavelength of the ultraviolet light and adjustment of optical properties (aberration, focal position, projection demagnification and the like) of the projection optical system 1265, by controlling the temperature of the. DF semiconductor laser so that the temperature is changed at a unit of 0.001° C. With this arrangement, the wavelength stability of the ultraviolet light during the exposure of the semiconductor wafer can be enhanced, and the optical properties of the projection optical system 1265 which may be changed due to either illumination of the ultraviolet light or a change in atmospheric pressure can easily be adjusted.

The exposure apparatus shown in FIG. 20 further includes a pulse control portion 1275 for applying driving voltage pulse to the optical modulating element (12 in FIG. 1 and the like) for converting the continuous light generated from the single-wavelength oscillating laser (DFB semiconductor laser) within the fundamental wave generating portion 1271 into pulse light, an exposure control portion 1276 for calculating the number of pulses required for exposing the photo-resist, when the circuit pattern is transferred, in accordance with the sensitivity of the photo-resist coated on the semiconductor wafer 1266 and for controlling the oscillating timing of the control pulse outputted from the pulse control portion 1275 and the magnitude of the control pulse in accordance with the number of pulses, and a control device 1277 for controlling the entire exposure apparatus collectively.

The pulse control portion 1275 serves to control electric current of the single-wavelength oscillating laser (11 in FIG. 1 and the like) within the fundamental wave generating portion 1271 so that the single-wavelength oscillating laser can be pulse-oscillated. That is to say, by the current control effected by the pulse control portion 1275, the single-wavelength oscillating laser can switch over the output of the continuous light and the pulse light. In the illustrated embodiment, the single-wavelength oscillating laser is pulse-oscillated, and only a part (having pulse width of about 10 to 20 ns) of the oscillated pulse light is picked up under the control of the above-mentioned optical modulating element (i.e., modulated to pulse light having pulse width of 1 ns). As a result, in comparison with a case where the continuous light is converted into the pulse light only by using the optical modulating element, pulse light having narrower pulse width can easily be generated, and the oscillating interval of the pulse light and start/stop of the oscillation of the pulse light can be controlled by the exposure control portion 1276 more easily.

Further, the pulse control portion 1275 effects not only the switching between the pulse oscillation and the continuous oscillation of the single-wavelength oscillating laser but also controlling of the oscillating interval and pulse width, upon pulse oscillation, and effects at least one of the oscillation control of the single-wavelength oscillating laser and control of the magnitude of voltage pulse applied to the optical modulating element to compensate fluctuation in output of the pulse light. By doing this, the fluctuation in output of the pulse light caused upon changing the oscillating interval between the pulse lights or upon restart of the pulse light can be compensated. That is to say, the output (intensity) of the light can be maintained to a substantially a constant value for each pulse.

Further, in the pulse control portion 1275, gain of at least one of plural fiber optical amplifiers (13, 18, 19 in FIG. 1 and the like) arranged in serial within the fundamental wave generating portion 1271 is adjusted, and intensity of the pulse light on the semiconductor wafer can be controlled only by the gain adjustment or by a combination of the gain adjustment and the control of the optical modulating element. Further, gain of at least one of the fiber optical amplifiers provided in parallel with respect to the plurality of channels divided in parallel in the multiplexer can be controlled similarly.

Further, the exposure control portion 1276 serves to detect the fundamental wave outputted from the fundamental wave generating portion 1271 or the ultraviolet light outputted from the wavelength converting portion 1272 or the pulse light outputted from, for example, the first or second stage non-linear optical crystal within the wavelength converting portion 1272 and to control the pulse control portion 1275 on the basis of the detected values (including intensity, wavelength and spectral bandwidth), thereby adjusting the oscillating interval of the pulse light, start/stop of the oscillation of the pulse light and intensity of the pulse light. Further, the detected values are inputted to the wavelength control device 1274, where temperature control of the single-wavelength oscillating laser is effected on the basis of the detected values to adjust the center wavelength and spectral bandwidth of the exposure illumination light (ultraviolet laser light).

The control device 1277 serves to send information regarding sensitivity of the photo-resist sent from a reading device (not shown) for reading an identifying mark (bar code and the like) provided on the semiconductor wafer or a cassette holding the semiconductor wafer or inputted by the operator to the exposure control portion 1276, where the number of exposure pulses required for the pattern transferring is calculated on the basis of the inputted information. Further, the exposure control portion 1276 controls the pulse control portion 1275 on the basis of the number of exposure pulses and intensity of the pulse light determined in accordance with the pulse number, thereby adjusting the oscillation timing and the magnitude of the control pulse applied to the optical modulating element. As a result, the start/stop of the exposure and the intensity of the pulse light illuminated on the semiconductor wafer 1266 are controlled, and the integrated light amount given to the photo-resist by the illumination of the plural pulse lights is controlled to an optimum exposure amount corresponding to the sensitivity.

Further, the exposure control portion 1276 sends the command to the pulse control portion 1275 to cause the latter to effect the current control of the single-wavelength oscillating laser so that the start/stop of the exposure (pulse oscillation) by the current control alone or by a combination of the current control and the control of the optical modulating element.

In the illustrated embodiment, when the laser apparatus shown in FIG. 1 or FIG. 2 is used as the fundamental wave generating portion 1271, one pulse light picked up by the optical modulating element is divided into plural (128 in number). In the illustrated embodiment, the divided 128 pulse lights may be regarded as one pulse in total and the exposure amount control may be effected based on said one pulse in total or each of the divided 128 pulse lights may be regarded as one pulse respectively and the exposure amount control may be effected based on said each pulse. Further, in the latter case, in place of the control of the optical modulating element effected by the pulse control portion 1275, the intensity of the pulse light on the semiconductor wafer may be controlled by adjusting the gain of the fiber optical amplifiers within the fundamental wave generating portion 1271 or a combination of these two controls may be used.

Further, the exposure apparatus shown in FIG. 20 can effect the exposure of the semiconductor wafer by selectively switching the step-and-repeat system and the step-and-scan system. In the step-and-repeat system, the field stop (reticle blind) within the illumination optical system 1262 is driven to adjust the magnitude of the aperture so that the entire circuit pattern on the reticle 1263 is illuminated by the exposure illumination light. On the other hand, in the step-and-scan system, the aperture of the field stop is adjusted so that the illumination area of the exposure illumination light within the circular projection field of the projection optical system 1265 is limited to be a rectangular slit extending along a direction perpendicular to the scanning direction for the reticle 1263. Accordingly, in the step-and-scan system, since only a part of the circuit pattern on the reticle 1263 is illuminated, in order to scan-expose the entire circuit pattern on the semiconductor wafer, in synchronous with the relative movement between the reticle 1263 and the exposure illumination light, the semiconductor wafer 1266 is shifted relative to the exposure illumination light at a speed ratio corresponding to the projection demagnification of the projection optical system 1265.

By the way, in the exposure amount control upon the scan-exposure, by adjusting at least one of the pulse repeating frequency f defined by the optical modulating element and the delay time between the channels defined by the TDM 23 shown in FIG. 2, the plurality of pulses are oscillated at equal time intervals from the fundamental wave generating portion 1271 during the scan-exposure. Further, in accordance with the sensitivity property of the photo-resist, by adjusting at least one of the intensity of the pulse light on the semiconductor wafer, scanning speed of the semiconductor wafer, oscillation interval (frequency) of the pulse light, and the width of the pulse light (i.e., illumination area thereof) regarding the scanning direction of the semiconductor wafer, the integrated light amount of the plural pulse lights illuminated while each point on the semiconductor wafer is moving across the illumination area is controlled to the optimum exposure amount. In this case, in the exposure amount control, in consideration of throughput, it is preferable that at least one of the intensity of the pulse light, oscillating frequency and width of the illumination area is adjusted, so that scanning speed of the semiconductor wafer is approximately maintained so as to correspond to a highest speed of the wafer stage 1267.

Further, when the scan-exposure is effected by using the laser apparatus shown in FIG. 1 or FIG. 2, in the exposure amount control, it is preferable that the divided 128 pulse lights are oscillated at equal time intervals so that each of the divided pulses is one pulse. However, the 128 pulse lights may be regarded as one pulse and the exposure amount control may be performed so long as the 128 pulse lights can be regarded as one pulse (i,e., the shifting distance of the semiconductor wafer while the 128 pulse light are being illuminated does not become a factor for reducing accuracy of the exposure amount control) by adjusting the oscillation interval between the divided 128 pulse lights in accordance with the scanning speed of the semiconductor wafer.

Further, in the above-mentioned various embodiments of the present invention, while the ultraviolet laser apparatus for outputting the output wavelength of 193 nm or 157 nm the same as that of the ArF excimer laser or $F_2$ laser was explained, the present invention is not limited to such an ultraviolet laser apparatus having such a wavelength, but can provide an ultraviolet laser apparatus capable of generating a wavelength of 248 nm the same as that of the KrF excimer laser, by appropriately selecting arrangements of the laser generating portion, optical amplifier portion and wavelength converting portion.

For example, by using an ytterbium (Yb) doped fiber laser or a semiconductor laser capable of oscillating at a wavelength of 992 nm as the single-wavelength oscillating laser in the laser generating( portion and by using an ytterbium doped fiber optical amplifier is used as the fiber optical amplifier and by using an LBO crystal in the wavelength converting portion whereby the output from the fiber optical amplifier is subjected to second harmonic wave generation (wavelength of 496 nm) and 4th harmonic wave (wavelength of 248 nm) is further obtained from the resulting output by using a BBO crystal, the ultraviolet laser apparatus capable of generating a wavelength of 248 nm the same as that of the KrF excimer laser can be provided.

Further, it is preferable that the fibers (including fiber optical amplifiers) used in the above-mentioned embodiments are coated by Teflon. Although it is desirable that all of the fibers are subjected to Teflon coating, particularly, the fibers located within the chamber for housing the body of the exposure apparatus are coated by Teflon. The reason is that foreign matters (including fiber pieces and the like) generated from the fibers may become contaminant for contaminating the exposure apparatus. Thus, by providing the Teflon coating, fog of optical elements constituting the illumination optical system, projection optical system and alignment optical system, fluctuation in transmittance (reflection index) and/or optical properties (including aberration) of these optical systems, and fluctuation in illuminance and distribution thereof on the reticle or the semiconductor wafer, all of which are caused by the contaminant, can be prevented. Further, in place of the Teflon coating, the fibers housed in the chamber may collectively be enclosed by a stainless steel casing.

Further, a semiconductor device is manufactured by a step for effecting function/performance design thereof, a step for forming a reticle on the basis of the designing step, a step for forming a wafer from Silicone material, a step for transferring a reticle pattern onto the wafer by using the above-mentioned exposure apparatus, a step for assembling the device (including dicing step, bonding step and packaging step), and a step for checking the device. Further, the exposure apparatus can be used for manufacturing of a liquid crystal display, an imaging element (for example, CCD), a thin film magnetic head or a reticle, as well as manufacturing of the semiconductor element.

Further, the exposure apparatus according to the illustrated embodiment can be manufactured in such a manner that the illumination optical system and the projection optical system (each constituted by a plurality of optical elements) are incorporated into the body of the exposure apparatus and optical adjustment thereof is effected, and the reticle stage and the wafer stage (each constituted by a plurality of mechanical parts) are attached to the body of the exposure apparatus and wiring and piping are connected, and total adjustment (electrical adjustment, operation confirmation and the like) is effected. Further, in the above-mentioned exposure apparatus, the ultraviolet laser apparatus 1261 is attached to the body of the exposure apparatus, and parts (laser generating portion, optical amplifier and the like) of the ultraviolet laser apparatus 1261 disposed outside of the body of the exposure apparatus are connected, via the fiber line, to the wavelength converting portion disposed within the body, and alignment between the optical axes between the ultraviolet laser apparatus 1261 (wavelength converting portion) and the illumination optical system 1262 is effected. Further, it is desirable that the exposure apparatus is manufactured in a clean room in which a temperature and cleanness are controlled.

Further, in the ninth embodiment, while an example that the laser apparatus is applied to the exposure apparatus was explained, for example, the laser apparatus according to the present invention can be applied to a laser repairing apparatus used for cutting a part (fuse and the like) of a circuit pattern formed on the wafer. Further, the laser apparatus according to the present invention can be applied to a checking apparatus using visible light or infrared light. In this ease, it is not required that the wavelength converting portion described in connection with the fourth, fifth, sixth or seventh embodiment be incorporated into the laser apparatus. That is to say, the present invention is effective to not only the ultraviolet laser apparatus but also a laser apparatus having no wavelength converting portion and adapted to generate the fundamental wave having visible band or infrared band.

What is claimed is:

1. A method of irradiating ultraviolet light onto an object, comprising:
    generating pulse light having a single wavelength within a range from 1.51 μm to 1.59 μm from a laser generating portion;
    amplifying the pulse light in plural times by means of an optical amplifier that includes a plurality of fiber optical amplifiers;
    wavelength-converting the amplified pulse light into ultraviolet light by means of a wavelength converting portion that includes a plurality of non-linear optical crystals; and
    irradiating the ultraviolet light onto the object through an optical system.

2. A method according to claim 1, wherein
said ultraviolet light has a wavelength less than 200 nm.

3. A method according to claim 2, wherein
said ultraviolet light is 8-times high harmonic wave having a wavelength within a range from 189 nm to 199 nm or 10-times high harmonic wave having a wavelength within a range from 151 nm to 159 nm.

4. A method according to claim 3, wherein
said pulse light has the wavelength within a range from 1.544 μm to 1.552 μm, and said ultraviolet light is the 8-times high harmonic wave having the wavelength within a range from 193 nm to 194 nm.

5. A method according to claim 3, wherein
said pulse light has the wavelength within a range from 1.57 μm to 1.58 μm, and said ultraviolet light is the 10-times high harmonic wave having the wavelength within a range from 157 nm to 158 nm.

6. A method according to claim 1, wherein
an emission property of said ultraviolet light is adjusted by at least one of said laser generating portion and said optical amplifier.

7. A method according to claim 6, wherein
said emission property includes at least one of intensity, center wavelength, wavelength width and oscillation interval of said ultraviolet light.

8. A method of irradiating ultraviolet light onto an object, comprising:
    generating pulse light having a single wavelength within a range from 1.51 μm to 1.59 μm from a laser generating portion;
    amplifying the pulse light in plural times by means of an optical amplifier that includes a plurality of fiber optical amplifiers;
    wavelength-converting the amplified pulse light into ultraviolet light by means of a wavelength converting portion that includes a plurality of non-linear optical crystals; and
    irradiating the ultraviolet light onto the object through an optical system,
    wherein an emission property of said ultraviolet light is adjusted by at least one of said laser generating portion and said optical, and
    wherein said emission property is adjusted based on information obtained by detecting at least one of said ultraviolet light of which a wavelength is different from that of said ultraviolet light.

9. A method of irradiating ultraviolet light onto an object, comprising:
    generating pulse light having a single wavelength within a range from 1.51 μm to 1.59 μm from a laser generating portion;
    amplifying the pulse light in plural times by means of an optical amplifier that includes a plurality of fiber optical amplifiers;
    wavelength-converting the amplified pulse light into ultraviolet light by means of a wavelength converting portion that includes a plurality of non-linear optical crystals; and
    irradiating the ultraviolet light onto the object through an optical system,
    wherein at least a portion of said optical amplifier is exchanged as a unit.

10. A method of irradiating ultraviolet light onto an object, comprising:
    generating pulse light having a single wavelength within a range from 1.51 μm to 1.59 μm from a laser generating portion;
    amplifying the pulse light in plural times by means of an optical amplifier that includes a plurality of fiber optical amplifiers;

wavelength-converting the amplified pulse light into ultraviolet light by means of a wavelength converting portion that includes a plurality of non-linear optical crystals; and irradiating the ultraviolet light onto the object through an optical system, wherein a temperature of at least of said plurality of non-linear optical crystals is controlled in said wavelength converting portion.

11. A method of irradiating ultraviolet light onto an object, comprising:

generating pulse light having a single wavelength within a range from 1.51 µm to 1.59 µm from a laser generating portion;

amplifying the pulse light in plural times by means of an optical amplifier that includes a plurality of fiber optical amplifiers;

wavelength-converting the amplified pulse light into ultraviolet light by means of a wavelength converting portion that includes a plurality of non-linear optical crystals; and irradiating the ultraviolet light onto the object through an optical system, wherein at least one of said plurality of non-linear optical crystals is used for NCPM (Non-Critical Phase Matching).

12. A method of irradiating ultraviolet light onto an object, comprising:

generating pulse light having a single wavelength within a range from 1.51 µm to 1.59 µm from a laser generating portion;

amplifying the pulse light in plural times by means of an optical amplifier that includes a plurality of fiber optical amplifiers;

wavelength-converting the amplified pulse light into ultraviolet light by means of a wavelength converting portion that includes a plurality of non-linear optical crystals; and irradiating the ultraviolet light onto the object through an optical system, wherein a phase alignment angle of at least one of said plurality of non-linear optical crystals is adjusted in said wavelength converting portion.

13. A method according to claim 12, wherein said at least one non-linear optical crystal of which the phase alignment angle is adjusted includes a non-linear optical crystal disposed optically most downstream position among said plurality of non-linear optical crystals.

14. A method of irradiating ultraviolet light onto an object, comprising:

generating pulse light having a single wavelength within a range from 1.51 µm to 1.59 µm from a laser generating portion;

amplifying the pulse light in plural times by means of an optical amplifier that includes a plurality of fiber optical amplifiers;

wavelength-converting the amplified pulse light into ultraviolet light by means of a wavelength converting portion that includes a plurality of non-linear optical crystals; and irradiating the ultraviolet light onto the object through an optical system, wherein an expansion of the wavelength width of light between a single wavelength oscillating laser of said laser generating portion and said wavelength converting portion is suppressed.

15. A method according to claim 14, wherein said expansion of the wavelength width is suppressed by an optical device of which at least a part is disposed between said single wavelength oscillating laser and said wavelength converting portion.

16. A method according to claim 15, wherein said at least a part of said optical device is disposed among said plurality of fiber optical amplifiers.

17. A method according to claim 15, wherein said at least a part of said optical device includes at least one of a narrowband filter and an isolator.

18. A method according to claim 14, wherein said expansion of the wavelength width caused by non-linear effectiveness of at least one of said plurality of fiber optical amplifiers is suppressed by means of the reduction of a fiber length of the at least one fiber optical amplifier.

19. A method according to claim 18, wherein said at least one fiber optical amplifier of which the fiber length is reduced includes a fiber optical amplifier disposed optically most downstream position among said plurality of fiber optical amplifiers.

20. A method according to claim 14, wherein a phase alignment angle of at least one of said plurality of non-linear optical crystals is adjusted in said wavelength converting portion.

21. A method according to claim 1, wherein said object includes a substrate on which a pattern is formed.

22. A method according to claim 1, wherein said object includes a wafer or a mask used in a device manufacturing process.

23. A method of detecting a pattern of an object, comprising;

generating pulse light having a single wavelength within a range from 1.51 µm to 1.59 µm from a laser generating portion;

amplifying the pulse light in plural times by means of an optical amplifier that includes a plurality of fiber optical amplifiers:

wavelength-converting the amplified pulse light into ultraviolet light by means of a wavelength converting portion that includes a plurality of non-linear optical crystals; and irradiating the ultraviolet light onto the pattern through an optical system.

24. A method according to claim 23, wherein said ultraviolet light has a wavelength less than 200 nm.

25. A method according to claim 24, wherein said ultraviolet light is 8-times high harmonic wave having a wavelength within a range from 189 nm to 199 nm or 10-times high harmonic wave having a wavelength within a range from 151 nm to 159 nm.

26. A method according to claim 25, wherein said pulse light has the wavelength within a range from 1.544 µm to 1.552 µm, and said ultraviolet light is the 8-times high harmonic wave having the wavelength within a range from 193 nm to 194 nm.

27. A method according to claim 25, wherein said pulse light has the wavelength within a range from 1.57 µm to 1.58 µm, and said ultraviolet light is the 10-times high harmonic wave having the wavelength within a range from 157 nm to 158 nm.

28. A method according to claim 23, wherein an emission property of said ultraviolet light is adjusted by at least one of said laser generating portion and said optical amplifier.

29. A method according to claim 28, wherein
said emission property includes at least one of intensity, center wavelength, wavelength width and oscillation interval of said ultraviolet light.

30. A method of detecting a pattern of an object, comprising:
generating pulse light having a single wavelength within a range from 1.51 µm to 1.59 µm from a laser generating portion;
amplifying the pulse light in plural times by means of an optical amplifier that includes a plurality of fiber optical amplifiers;
wavelength-converting the amplified pulse light into ultraviolet light by means of a wavelength converting portion that includes a plurality of non-linear optical crystals; and
irradiating the ultraviolet light onto the pattern through an optical system,
wherein an emission property of said ultraviolet light is adjusted by at least one of said laser generating portion and said optical, and
wherein said emission property is adjusted based on information obtained by detecting at least one of said ultraviolet light and light of which a wavelength id different from that of said ultraviolet light.

31. A method of detecting a pattern of an object, comprising:
generating pulse light having a single wavelength within a range from 1.51 µm to 1.59 µm from a laser generating portion;
amplifying the pulse light in plural times by means of an optical amplifier that includes a plurality of fiber optical amplifiers;
wavelength-converting the amplified pulse light into ultraviolet light by means of a wavelength converting portion that includes a plurality of non-linear optical crystals; and
irradiating the ultraviolet light onto the pattern through an optical system,
wherein at least a portion and said optical amplifier is exchanged as a unit.

32. A method of detecting a pattern of an object, comprising:
generating pulse light having a single wavelength within a range from 1.51 µm to 1.59 µm from a laser generating portion;
amplifying the pulse light in plural times by means of an optical amplifier that includes a plurality of fiber optical amplifiers;
wavelength-converting the amplified pulse light into ultraviolet light by means of a wavelength converting portion that includes a plurality of non-linear optical crystals; and
irradiating the ultraviolet light onto the pattern through an optical system,
wherein a temperature of at least one of said plurality of non-linear optical crystals is controlled in said wavelength converting portion.

33. A method of detecting a pattern of an object, comprising:
generating pulse light having a single wavelength within a range from 1.51 µm to 1.59 µm from a laser generating portion;
amplifying the pulse light in plural times by means of an optical amplifier that includes a plurality of fiber optical amplifiers;
wavelength-converting the amplified pulse light into ultraviolet light by means of a wavelength converting portion that includes a plurality of non-linear optical crystals; and
irradiating the ultraviolet light onto the pattern through an optical system,
wherein at least one of said plurality of non-linear optical crystals is used for NCPM (Non-Critical Phase Matching).

34. A method of detecting a pattern of an object, comprising;
generating pulse light having a single wavelength within a range from 1.51 µm to 1.59 µm from a laser generating portion;
amplifying the pulse light in plural times by means of an optical amplifier that includes a plurality of fiber optical amplifiers;
wavelength-converting the amplified pulse light into ultraviolet light by means of a wavelength converting portion that includes a plurality of non-linear optical crystals; and
irradiating the ultraviolet light onto the pattern through an optical system,
wherein a phase alignment angle of at least one of said plurality of non-linear optical crystals is adjusted in said wavelength converting portion.

35. A method according to claim 34, wherein
said at least one non-linear optical crystal of which the phase alignment angle is adjusted includes a non-linear optical crystal disposed optically most downstream position among said plurality of non-linear optical crystals.

36. A method of detecting a pattern of an object, comprising;
generating pulse light having a single wavelength within a range from 1.51 µm to 1.59 µm from a laser generating portion;
amplifying the pulse light in plural times by means of an optical amplifier that includes a plurality of fiber optical amplifiers;
wavelength-converting the amplified pulse light into ultraviolet light by means of a wavelength converting portion that includes a plurality of non-linear optical crystals; and
irradiating the ultraviolet light onto the object through an optical system,
wherein an expansion of the wavelength width of light between a single wavelength oscillating laser of said laser generating portion and said wavelength converting portion is suppressed.

37. A method according to claim 36, wherein
said expansion of the wavelength width is suppressed by an optical device of which at least a part is disposed between said single wavelength oscillating laser and said wavelength converting portion.

38. A method according to claim 37, wherein
said at least a part of said optical device is disposed among said plurality of fiber optical amplifiers.

39. A method according to claim 37, wherein
said at least a part of said optical device includes at least one of a narrowband filter and an isolator.

40. A method according to claim 36, wherein
said expansion of the wavelength width caused by non-linear effectiveness of at least one of said plurality of fiber optical amplifiers is suppressed by means of the reduction of a fiber length of the at least one fiber optical amplifier.

41. A method according to claim 40, wherein
said at least one fiber optical amplifier of which the fiber length is reduced includes a fiber optical amplifier disposed optically most downstream position among said plurality of fiber optical amplifiers.

42. A method according to claim 36, wherein
a phase alignment angle of at least one of said plurality of non-linear optical crystals is adjusted in said wavelength converting portion.

43. A method according to claim 23, wherein
said object includes a substrate used in a device manufacturing process.

44. A method according to claim 43, wherein
said object includes a wafer or a mask.

* * * * *